US006828221B2

(12) United States Patent
Iijima et al.

(10) Patent No.: US 6,828,221 B2
(45) Date of Patent: Dec. 7, 2004

(54) MANUFACTURING METHOD FOR WIRING CIRCUIT SUBSTRATES

(75) Inventors: Tomoo Iijima, Tokyo (JP); Masayuki Ohsawa, Tokyo (JP)

(73) Assignee: North Corporation, Tokyo (JP)

( * ) Notice: Subject to any disclaimer, the term of this patent is extended or adjusted under 35 U.S.C. 154(b) by 7 days.

(21) Appl. No.: 10/139,237

(22) Filed: May 7, 2002

(65) Prior Publication Data

US 2003/0143833 A1 Jul. 31, 2003

Related U.S. Application Data

(62) Division of application No. 09/685,799, filed on Oct. 11, 2000, now Pat. No. 6,528,874.

(30) Foreign Application Priority Data

Oct. 12, 1999 (JP) .......................................... 11-289277
Dec. 28, 1999 (JP) .......................................... 11-374462
May 16, 2000 (JP) ...................................... 2000-142658

(51) Int. Cl.[7] .............................................. H01L 21/44
(52) U.S. Cl. ...................... 438/616; 438/612; 438/613; 438/622; 438/625; 438/652; 438/673
(58) Field of Search .............................. 438/612–614, 438/616–618, 622, 624, 625, 637–642, 652, 666–669, 671, 673, 674

(56) References Cited

U.S. PATENT DOCUMENTS

| 4,190,474 A | * | 2/1980 | Berdan et al. ............... 156/151 |
| 5,464,662 A | * | 11/1995 | Murakami et al. ........... 427/510 |
| 5,650,595 A | * | 7/1997 | Bentlage et al. ............. 174/260 |
| 5,822,850 A | | 10/1998 | Odaira et al. ................. 216/13 |
| 5,950,306 A | * | 9/1999 | Suzuki et al. ................. 29/852 |
| 6,237,218 B1 | * | 5/2001 | Ogawa et al. ................. 29/830 |
| 6,310,391 B1 | | 10/2001 | Nagasawa et al. .......... 257/700 |
| 6,381,837 B1 | | 5/2002 | Baker et al. ................. 174/261 |

* cited by examiner

*Primary Examiner*—Amir Zarabian
*Assistant Examiner*—Khanh Duong
(74) *Attorney, Agent, or Firm*—Armstrong, Kratz, Quintos, Hanson & Brooks, LLP

(57) ABSTRACT

The present invention prepares a member having a conductor-circuit-forming copper foil formed on a protrusion-forming copper layer via an etching-barrier layer formed of a different metal. Etching is selectively performed for the protrusion-forming copper foil by using etchant that does not etch the etching-barrier layer, and protrusions are thereby formed. Then, the etching-barrier layer is removed using etchant that does not etch the copper foil and using the protrusions as masks. An interlayer-insulating layer is formed on a surface of the copper foil, on which the protrusions are formed, so that the protrusions are connected to the conductor circuit. Thereby, heights of the protrusions are uniformed, and the reliability of connections can be improved.

4 Claims, 53 Drawing Sheets

Fig. 17
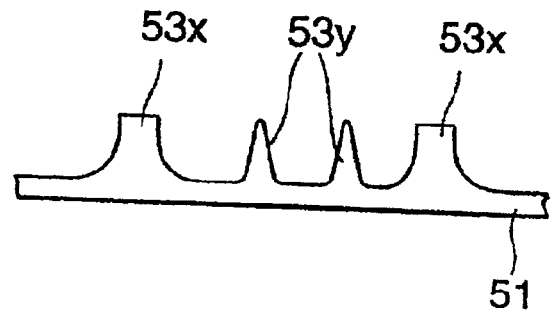
Fig. 18A
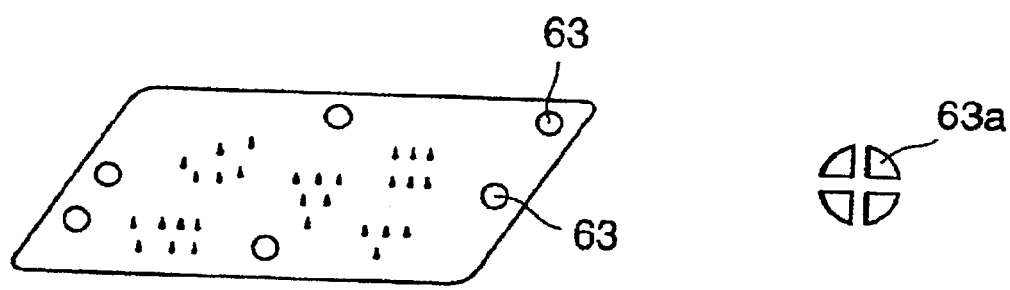
Fig. 18B
Fig. 18C
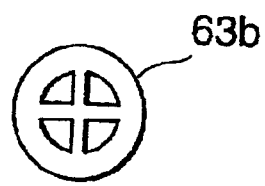

Prior Art

Prior Art

MANUFACTURING METHOD FOR WIRING CIRCUIT SUBSTRATES

This application is a division of prior application Ser. No. 09/685,799 filed Oct. 11, 2000 now U.S. Pat. No. 6,528,874.

BACKGROUND OF THE INVENTION

1. Field of the Invention

The present invention relates to a wiring circuit substrate used for mounting electronic devices, such as integrated circuits (ICs) and large scale integrated circuits (LSI circuits). Particularly, the invention relates to a wiring circuit substrate that allows high-density mounting to be implemented.

Furthermore, the present invention relates to a manufacturing method for the aforementioned wiring circuit substrate.

2. Description of the Related Art

FIGS. 54A to 54F and 55A to 55C are used to describe a conventional example of a high-density-mounting wiring circuit substrate. These figures are cross-sectional views illustrating a manufacturing method for the conventional wiring circuit substrate in the order of steps (A) to (I) described below.

Step (A)

First of all, as shown in FIG. 54A, a base 1 is prepared. The base 1 is made of an insulating sheet having a thickness of 25 to 100 µm. In the base 1, interlayer-connecting openings 2 are formed by using a punching machine or a drill or by performing laser processing.

Step (B)

Subsequently, as shown in FIG. 54B, conductive paste 3 (made of a main material, for example, such as silver or copper) is filled into the openings 2 by using a printing method for example. Thereby, the insulating base 1 is arranged to be a semi-cured sheet A in which the conductive paste 3 is filled into the openings 2.

Step (C) and Step (D)

Subsequently, as shown in FIG. 54C, metal foils 4 made of, for example, copper, are individually arranged over two faces of the sheet A. Then, as shown in FIG. 54D, the metal foils 4 are overlaid by using a pressing/heating press. Thereby, a multilayer body is formed such that the metal foils 4 are formed on the two faces, an insulating sheet is provided therebetween, and the metal foils 4 on the two faces are electrically connected to each other via the conductive paste 3 in the openings 2.

Step (E)

Subsequently, resist films 5 are formed on the metal foils 4. The resist films 5 have the same pattern as that of conductor circuits that will be formed. FIG. 54E shows a state after the resist films 5 are formed.

Step (F)

Subsequently, using the aforementioned resist films 5 as masks, etching is performed for the aforementioned metal foils 4, thereby forming conductor circuits 6, as shown in FIG. 54F. According to the above, layers are separated and arranged on the two faces via the insulating sheet (base) 1, and a multilayer body B having the conductor circuits 6 interlayer-connected to each other via the conductive paste 3 in the opening 2 is formed.

Step (G)

Subsequently, as shown in FIG. 55A, on individual two faces of the aforementioned multilayer body B, insulating sheets 1a having openings 2 filled with conductive paste 3 and metal foils 4a are overlapped with each other. Thereafter, these component members are stacked with each other by using a press, and a multilayer body C is thereby formed.

Step (H)

Subsequently, as shown in FIG. 55B, resist films 5 are selectively formed on the metal foils 4a on two faces of the multilayer body C.

Step (I)

Subsequently using the resist films 5 as masks, etching is selectively performed for the metal foils 4a, thereby performing patterning therefor to form wiring films 6a, as shown in FIG. 55C. Thereby, a wiring circuit substrate 7 having four layers of the conductor circuits 6 and 6a are formed.

FIGS. 56A to 56G are used to explain another conventional example of a high-density-mounting wiring circuit substrate. These figures are cross-sectional views illustrating a manufacturing method for the conventional wiring circuit substrate in the order of steps (A) to (G) described below.

Step (A)

For example, as shown in FIG. 56A, a metal foil 10 (having a thickness of, for example, 18 µm) made of a copper material is prepared. Then, on the metal foil 10, conductive protrusions 11 are formed by a printing method via conductive paste (made of a main material such as a silver or copper material) and a metal plate, and then, are heated and cured. The protrusions 11 are thus formed so as to have thicknesses, for example, ranging from 100 to 300 µm.

Step (B)

Subsequently, as shown in FIG. 56B, an insulating adhesive sheet 12 is adhered onto the face on which the protrusions 11 of the aforementioned metal foil 10 are formed. For the adhesive sheet 12, an adhesive sheet having a thickness smaller than the thicknesses of the protrusions 11 is used. Thereby, the top of each of the protrusions 11 protrudes from the surface of the adhesive sheet 12. A multilayer body A is produced that has a configuration in which the protrusions 11 are formed on the metal foil 10 and the adhesive sheet 12 is adhered onto the surface of the metal foil 10 in a state of allowing the top of each the protrusions 11 to protrude therefrom.

Step (C) and Step (D)

Subsequently, as shown FIG. 56C, a metal foil 13 similar to the aforementioned metal foil 10 is arranged over the surface of the adhesive sheet 12, then, as shown in FIG. 56D, the metal foil 13 is overlaid on the adhesive sheet 12 and the protrusions 11 according to a heating-pressing method. Thereby, a multilayer body B is produced.

Step (E)

Subsequently, for example, resist films for which patterning is performed are formed on the metal foils 10 and 13 individually formed on two faces of the multilayer body B. Then, etching is performed for the metal foils 10 and 13 by using the resist films as masks, thereby forming conductor circuits 14 and 15. FIG. 56E shows a configuration where the resist films used as masks are removed after the conductor circuits 14 and 15 are formed.

Step (F)

Subsequently, two multilayer bodies a are prepared. Each of the multilayer body (a) is formed by the same method as that for the multilayer body (A) shown in FIG. 48B. As shown in FIG. 56F, the two multilayer bodies (a) are individually arranged over two faces of the aforementioned multilayer body (B).

Step (G)

The aforementioned multilayer body (B) is sandwiched by the multilayer bodies (a), and the integrated body is pressed from the sides of two faces thereof according to the aforementioned heating-pressing method. Thereby, a wiring circuit substrate 16 as shown in FIG. 56G is produced.

Subsequently, a still another conventional technique will be explained. FIGS. 57A to 57E and 58A to 58D show a production process of still another wiring circuit substrate.

Step (A)

As shown in FIG. 57A, a copper-plated laminated plate 400*a* is prepared for forming a hole 400*b* for connection therein by drilling or laser processing. The numeral 400*c* is an insulating sheet to serve as the base member for the laminated plate 400*a*, and 400*d*, 400*d* are copper foils formed on both sides of the insulating sheet 400*c*.

Step (B)

Subsequently, as shown in FIG. 57B, a copper plating layer 400*e* is formed on the entire surface by an electroless plating process and a subsequent electrolytic plating process.

Step (C)

Subsequently, as shown in FIG. 57C, the hole 400*b* is filled with an insulating resin 400*f*, such as an epoxy.

Step (D)

Subsequently, as shown in FIG. 57D, both sides of the laminated plate 400*a* is smoothed by mechanical polishing. Thereafter, another copper plating layer 400*g* is formed by an electroless plating process and a subsequent electrolytic plating process. Accordingly, the insulating resin 400*f* filling up the hole 400*b* is covered by the copper plating layer 400*g*.

Step (E)

Subsequently, as shown in FIG. 57E, a wiring film 400*h* is formed by patterning the copper plating layers 400*g*, 400*d*, 400*e* on both sides of the laminated plate 400*a*. The etching operation is executed by applying a resist film, exposing and developing the same so as to form a mask pattern, and selective etching with the mask pattern used as the mask. After the etching, the resist film is eliminated.

Step (F)

Subsequently, as shown in FIG. 58A, an insulating resin 400*i*, 400*i* is coated on both sides of the laminated plate 400*a*. Thereafter, a hole 400*j* to be a through hole is formed in the insulating resin 400*i* by a laser beam. At the time, the residual resin adhered on the surface of the copper foil 400*d* should be eliminated by using a washing liquid.

Step (G)

Subsequently, as shown in FIG. 58B, a copper plating layer 400*k* is formed on both sides of the laminated plate 400*a* by an electroless plating process and an electrolytic plating process.

Step (H)

Subsequently, as shown in FIG. 58C, a circuit 400*l* is formed by patterning the copper plating layers 400*k* on both sides of the laminated plate 400*a*. The etching operation is executed by selective etching with a mask formed by patterning a resist film by exposing and developing used as the mask. Thereafter, the resist film used as the mask is eliminated.

Step (I)

Subsequently, as shown in FIG. 58D, both sides of the laminated plate 400*a* are covered selectively by a solder resist 400*m*. Accordingly a wiring circuit substrate 400*n* is completed.

However, the conventional example shown in FIGS. 54 and 55 arises problems as described the followings. First, the openings 2 in the insulating sheet 1 are filled with the conductive paste 3 made of a main material such as expensive silver material and are used for interlayer connection. This arises a problem of increasing costs. Particularly, since arrangement density of the openings 2 is required to be increased according to an increasing demand for high-density mounting, the increase in costs becomes noticeable so as not to be ignored.

Second, when the conductive paste 3 is filled into the openings 2, the conductive material is adhered to portions other than the openings 2, although the amount thereof is very small. This arises a problem of reducing the insulation resistance, particularly in a high-humidity environment.

Third, when press-overlaying is performed after the openings 2 are formed in the insulating sheet 1, the insulating sheet 1 is forced to horizontally extend. Thereby, positional deviation of the openings 2 occurs. Even by performing correction thereof and making openings, the correction is not effective in the high-density pattern. The positional deviation of the openings 2 causes defective interlayer connection, thereby arising serious problems, which,cannot be ignored. Particularly, the problem is critical for the high-density-mounting wiring circuit substrate.

Fourth, the reliability of the connection between the metal foils 4 made of a copper material and the conductive paste 3 is insufficient. The conductive paste 3 filled into the openings 2 removes a solvent component so as to be a semi-cured state. The semi-cured conductive paste shrinks because of removal of the solvent component and the like, thereby reducing the volume of its own. In addition, in most cases, upper and lower faces of the conductive paste 3 become in a concave state. As a result, defective connection is apt to be caused between the metal foils 4, thereby arising a problem of reducing the reliability and the yield.

Subsequently, the conventional example shown in FIGS. 56A to 56G also arises problems as described the followings. First, using the protrusions 11 formed of the conductive paste also arises the problem of increasing costs.

Second, since a screen-printing method is used to form the protrusions 11 with the conductive paste, increase in the thickness thereof is restricted. Therefore, in most cases, screen-printing operations must be repeatedly performed to form the protrusions 11.

When the number of the printing operations is increased, the positional deviation of the protrusions 11 is apt to occur, and deformation of the protrusions 11 is thereby apt to occur. This develops a problem of reducing the reliability of the connections between the protrusions 11 and the metal foils 4. In addition, positioning operation for the screen-printing is very difficult and requires high-level skills, thereby causing a problem of requiring relatively long processing time.

These problems become increasingly apparent in proportion to reduction in the diameter of each of the protrusions 11. For example, for protrusions each having a diameter of 0.3 mm, two printing operations must be performed; and for protrusions each having a diameter of 0.2 mm, four printing operations must be performed. This is heavy work and disturbs improvement in the productivity, remaining problems to be solved for the provision of high-density wiring circuit substrates.

Third, still another problem arises in that heights of the protrusions 11 are likely varied. In specific, in the screen-printing method, since it is difficult to uniform thicknesses of films, heights of the protrusions 11 formed thereby are also likely to be variable. The variation in the thickness likely causes the connection between the metal foil 13 and the protrusions 11 to be defective. This results in arising a problem of reducing the yield and the reliability.

Fourth, in the manufacturing stage, the metal foil 10 basing the wiring circuit substrate is as thin as, for example, 18 $\mu$m. Therefore, in the screen-printing sufficient care must be taken to prevent it from being wrinkled, deformed, and bent on the metal foil 13 side. Even a very minor operation problem could reduce the yield. This develops to the problem of increasing costs, which should not be neglected. Conversely, increasing the thickness of the metal foil 10 so as to obtain a strong base also causes a problem of disturbing the conductor circuits to be finely patterned.

One of problems common to the described conventional examples is that there are restrictions in making the high-density arrangement, that is, in the arrangement of fine interlayer connection. In the case of one example, the printing operation is difficult because of the reduction in the diameters of the openings and difficulty in filling the conductive paste into the openings. In the case of another conventional example, the difficulty in the printing operation increases in proportion to the reduction in the diameters in bump printing. Thus, according to the conventional technology, an opening having a diameter smaller than 200 $\mu$m cannot be produced.

In addition, since the strength of the connection between the conductive paste and the copper foil is low, an excessively large area is required for the connection.

Next, the wiring circuit substrate shown in FIGS. 57A to 57E and 58A to 58D also involves problems.

A first problem is a poor adhesion property between the surface of the insulating resin 400f for filling the hole 400b and the copper plating layer 400g so as to easily generate adhesion failure.

Particularly at the time of mounting, in the case various members are connected with the area, there is a risk of generating fall-off.

Moreover, in order to solve the problem, the wiring circuit substrate needs to be designed so as not to superimpose the connecting points of the various members and the hole 400b formation area. Therefore, it gives the limitation in designing so as to be a cause for prohibiting a high density of the wiring circuit substrate.

A second problem is deflection of the surface of the copper plating layer 400k in the area with the hole 400j because the copper plating layer 400k is formed in the area with the hole 400j.

Therefore, a wiring layer cannot be formed further on the copper plating layer 400k, and thus a multi-layer structure cannot be provided.

A third problem is the inability of ensuring a sufficient film thickness in the area with the hole 400j because the copper plating layer 400k is formed in the area.

That is, the copper plating layer 400k is formed by an electroless plating process and a subsequent electrolytic plating process. The film formation rate in the electroless plating process is low. Furthermore, the film thickness irregularity can easily be generated in the electrolytic plating process in relation to the electrolytic distribution. Therefore, even in a level difference part for forming the hole 400j, a film is formed with a thin film thickness so that a sufficient film thickness cannot be ensured. This point has prohibited realization of minuteness of the wiring circuit substrate.

SUMMARY OF THE INVENTION

The present invention is made to solve the above-described problems. An object of the invention is to provide a wiring circuit substrate that can be manufactured without problems such as bending, breaking, and deformation being caused and with dimensional stability being improved, thereby allowing improvement in the reliability of the connection between upper and lower conductor circuits, and in addition, allowing reduction in the cost for an upper-lower-conductor-circuit connecting device. Another object of the present invention is to provide a manufacturing method for the wiring circuit substrate.

Moreover, another object of the present invention is to provide a wiring circuit substrate without deflection of a wiring film on both sides of a substrate in a formation area of a hole (through hole) so as to enable further lamination of another wiring film, or the like on the wiring film, capable of forming a wiring film in a minute pattern with a necessary thickness, and a production method for the wiring circuit substrate.

To these ends, according to one aspect of the present invention, there is provided a wiring circuit substrate comprises a metal layer for forming conductor circuits, an interlayer-insulating layer formed on the metal layer, and protrusions for interconductor connection that are selectively formed on the metal layer in a state of passing through the interlayer-insulating layer and that are formed of the same metal as that for the metal layer.

In the present invention, the metal layer for forming the conductor circuits and the protrusions are formed of the same material. Therefore, a simply structured member can be used as a base member that allows the metal layer and the protrusions to be formed, thereby allowing costs for the material to be reduced. The protrusions can be formed by performing half-etching for the base member. Also, the above does not require a step of removing an interlayer-insulating layer (which will be described below), thereby allowing manufacturing time to be reduced, and also allowing reduction in the price of the wiring circuit substrate to be implemented.

According to another aspect of the present invention, a wiring circuit substrate comprises a first metal layer for forming first conductor circuits, an interlayer-insulating layer formed on the first metal layer, protrusions for interlayer connection that are selectively formed on the metal layer in a state of passing through the interlayer-insulating layer and that are formed of the same metal as that for the first metal layer, and a second metal layer that is formed on the protrusions and the interlayer-insulating layer and that is used for forming second conductor circuits.

According to the invention, a simply structured member can be used as a base member that allows forming of the metal layer and the protrusions that are selectively formed. This allows material costs to be reduced, and also, allows manufacturing time to be reduced. Accordingly, reduction in the price of the wiring circuit substrate can be implemented.

According to still another aspect of the present invention, a wiring circuit substrate comprises an insulating layer having at least one face on which first conductors of either a single layer or multiple layers are formed and openings for securing paths for electrical connection to the first conductor circuits are formed. It also comprises an interlayer-insulating layer formed on the one face of the insulating layer in which the openings are formed, protrusions formed of a conductor-forming metal layer in a state of passing through the interlayer-insulating layer at positions opposing the openings, and second conductor circuits formed on surfaces of the protrusions and the interlayer-insulating layer. In addition, the protrusions are electrically connected to the first conductor circuits through the openings, and also, electrically connects the first conductor circuits and the second conductor circuits to each other.

According to the above, the protrusions electrically connected to the first conductor circuits via the openings are provided. In short, electrical connection can be performed through the openings. This allows the wiring circuit substrate to be press-overlaid from any one of the face on which the protrusions are formed and the face on which the first conductor circuits are formed. In this case, the second conductor circuits may be a wiring circuit substrate. Thereby, a very large number of layers of conductor circuits of the wiring circuit substrate can be formed, thereby allowing the mounting density to be increased.

In the above, it is preferable that a conductive adhesion film be formed on the top of each of the protrusions. This improves the reliability of connections between the protrusions and the conductor circuits.

Also, in the above, it is preferable that each of the protrusions be formed so as to have a substantially triangular cross section. For example, with the protrusions formed of a glass-cloth-containing material that is normally used, the protrusions effectively and securely pass through the interlayer-insulating layer. Also, the protrusions are inserted into the metal layer that will be formed, thereby making characteristics of connections between the protrusions and the metal layer to be even more secure.

Also in the invention, it is preferable that the protrusions be formed in a konide-like shape. In this case, the top of each of the protrusions can be arranged to be planar, thereby avoiding the probability of making heights of the protrusions to be inconsistent. In addition, according to the protrusions, the distance (thickness) of the interlayer-insulating layer can be ensured to be at a constant value.

Also in the invention, it is preferable that each of the protrusions be formed in a drum-like shape. This allows the plain area of the top of each of the protrusions to be even larger. According to this, conductive-paste processing can be easily performed, and the reliability of the connection characteristics of the protrusions can also be improved. Concurrently, effects for ensuring the distance (thickness) of the interlayer-insulating layer to be constant can be obtained even more securely.

In addition in the invention, it is preferable that a surface of each of the protrusions be formed in a rough pattern. Also in the invention, it is preferable that a surface of each of the protrusions be subjected to particle-plating.

According to the above, since the surface of each of the protrusions is rough-patterned and particle-plated, connection characteristics between the top thereof and the metal layer can be improved.

It is preferable that the protrusions be formed of a copper material, and the surface thereof be subjected to electrolytic chromate processing.

According to the above, the protrusions are formed of a copper material, and the surface thereof be subjected to electrolytic chromate processing. Thereby, the surface of the metal layer can be prevented from being oxidized, thereby allowing the reliability of the connection between the protrusions and the metal layer.

It is preferable that the protrusions be arranged substantially in a plain matrix. In the stage before the conductor circuits on the two faces are formed by selectively performing etching, whatever is the model of the wiring circuit substrate, conductor circuits are mass-produced as standard products. Thereafter, the conductor circuits are formed so as to differ depending upon the pattern of the model of the wiring circuit substrate. This method allows improvement in the productivity of other different models of wiring circuit substrates. In addition, the masks need not be changed depending upon the model, thereby reducing the number of the copper-etching operations. Therefore, either the different-model small-quantity production or the restricted-model mass-production can be handled, thereby significantly contributing to the improvement in the economy.

In addition, it is preferable that the protrusions be formed and arranged so that pressure forces exerted when the wiring circuit substrate is stacked are uniformed for each of the protrusions. According to this, collapsed conditions of the individual protrusions can be uniformed, connection characteristics can be uniformed, and the reliability can be improved.

It is preferable that the protrusions be arranged so as to form a first area where the arrangement density is high and a second area where the arrangement density is low are formed, and dummy protrusions whose heights are smaller than those of the protrusions be formed around the first area.

According to the above, the smaller dummy protrusions are arranged around high-density arrangement areas of the individual protrusions in addition to the protrusions arranged at a high density. This allows reduction in the etching rates in peripheral areas of the high-density arrangement areas to be similar to a level of the central area. As a result, etching rates of the protrusions can be uniformed, and also, diameters and heights of the individual protrusions can be uniformed.

Also, it is preferable that each of the protrusions include dummy protrusions formed as a ring in its peripheral portion, and each adjacent couple of the dummy protrusions be formed at a spacing from each other. According to this, improved effects of the dummy protrusions at etching time can be obtained.

Each of the protrusions include dummy protrusions may be formed as a ring in its peripheral portion. Also, it is preferable that each adjacent couple of the dummy protrusions be formed so as to partially overlap with each other. According to this, areas where the dummy protrusions are formed can be minimized, and concurrently, the described effects can be obtained.

Also, it is preferable that the protrusions include a plurality of dummy protrusions formed around one of the protrusions. According to this, the uniformity of the etching rates can further be improved.

It is preferable that the protrusions include a plurality of dummy protrusions formed around a plurality of the protrusions, and also, the plurality of dummy protrusions be formed outside a forming area of the plurality of protrusions so as to be apart from each other at a predetermined spacing. According to this, etching rates for the plurality of protrusions can be uniformed.

It is preferable that the protrusions be formed to have a plurality of different heights. According to this, overlaying can be performed without causing problems on faces having different connection mechanisms, such as stepped connection faces and faces of copper paste and copper patterns.

It is preferable that the protrusions be formed to have a plurality of different diameters. According to this, diameters of the protrusions in which a high current flows can be increased, and diameters of the protrusions in which a low current flows can be reduced. This prevents problems such as that voltage drop occurs because a high voltage flows in the protrusions having small diameters, joule heat is generated, and the protrusions exclusively use unnecessarily excessive areas because the protrusions have large diameters while high current does not flow therein.

It is preferable that the second metal layer have openings formed in portions corresponding to the protrusions, the diameter of each of the openings being smaller than that of the top of each of the protrusions.

According to the above, when the protrusions are connected to the second metal layer, top portions of the protrusions abut the openings and collapse them. Accordingly, strong connections between the protrusions and the second metal layer can be ensured. This allows the reliability of the connections to be improved.

It is preferable that the protrusions include spacers formed of the same material as that for the protrusions and are formed so as to have substantially the same height as the protrusions. According to this, heights of the protrusions and the distance (thickness) of the interlayer-insulating layer are arranged to be constant, thereby allowing the impedance-controllability to be improved. The spacers may be grounded so as to be usable as an electrostatic shield.

It is preferable that the protrusions include identification marks formed of the same material as that for the protrusions and are formed so as to have substantially the same height as the protrusions. According to this, positioning and model identification can be easily carried out.

It is preferable that a plated layer be formed around each of the protrusions. Thus, since plating is performed before the protrusions are formed, the plating can be used as an etching mask. In addition, the plating improves the reliability of the connection of the protrusions.

Also, it is preferable that the conductive adhesion film be an anisotropic conductive film. In the above, since the anisotropic conductive film may be provided between the protrusions and the metal layer connected thereto, that is, metal particles in the anisotropic conductive film, the connection between the protrusions and the metal layer can be ensured.

It is preferable that the conductive adhesion film be formed by coating conductive paste material as a surface treatment agent.

In this case, since the conductive paste material is coated, the characteristics of the connections between the protrusions and the conductor circuits can be further improved.

According to still another aspect of the present invention, a wiring circuit substrate comprises a first metal layer for forming first conductor circuits, an etching-barrier layer formed of a metal differing from that of the first metal layer on the first metal layer, protrusions for interconductor connection that are made of metal and are selectively formed on the etching-barrier layer, an interlayer-insulating layer formed on the first metal layer in a state of allowing the protrusions to pass through, and a second metal layer that is formed on surfaces of the protrusions and the interlayer-insulating layer and that is used for forming second conductor circuits.

According to the above, the protrusions are selectively formed on the first metal layer via the interlayer-insulating layer. In this case, while erosion of the first metal layer is prevented according to the etching-barrier layer. Therefore, the base member either having at least the same height as that of the protrusions or a height larger than that of the protrusions can be used to obtain the wiring circuit substrate. This reduces portions of the base member in which bending, deformation, and the like may occur during the manufacture. Also, since there is no probability that the dimensions vary and positions of the protrusions horizontally deviate, even when the protrusions are finely formed to increase the arrangement density, there is no probability that defective interlayer connections between the upper and lower conductor circuits occur because of positional deviation of the protrusions. This allows the yield and the reliability to be improved.

In addition, the protrusions can be formed of metal, for example, a relatively low-priced metal such as a copper material. Thereby, compared to the conventional cases where the conductive paste formed either by filling into the openings or printing is used as the upper-lower-conductor-circuit connecting device, the wiring circuit substrate can be provided at a lower price.

Also, since the protrusions are formed by selectively performing etching for the first metal layer, heights thereof can be uniformed. Therefore, there are no probabilities that defects in the connections between the upper and lower conductor circuits occur because of inconsistent heights. In addition, the protrusions and the first metal layer are integrated into one unit, mechanical strengths of the protrusions can be higher than in the conventional cases.

It is preferable that the etching-barrier layer be formed so as to have the same width of that of a section of the protrusions. When etching is performed for the first metal layer, although the etching-barrier layer functions as an etching barrier, the etching is performed in a later step by using the protrusions as masks. Thereby, the interlayer-insulating layer formed on the first metal layer can be formed in a good condition.

It is preferable that the etching-barrier layer be formed in an area extending to reach reverse faces of the protrusions and the interlayer-insulating layer. According to this, the wiring circuit substrate that does not require a step of etching for the etching-barrier layer can be provided. In addition, the function as an etching-barrier layer can be achieved.

In addition, it is preferable that a plated layer be formed so as to cover around the protrusions and the etching-barrier layer. According to this, even in a wiring circuit substrate, the plating can be used as an etching mask, and also, the reliability of the connection of the protrusions can be secured.

According to still another aspect of the present invention, a wiring circuit substrate comprises a first wiring circuit substrate, a second wiring circuit substrate, and a third wiring circuit substrate. The first wiring circuit substrate is formed by comprising a base plate made of insulating resin, a plurality of first metal layers that is formed on an upper surface of the base plate and that are formed of first wiring circuits, a plurality of second metal layers that is formed on the lower surface of the base plate and that is formed of second wiring circuits, and through-holes that are formed so as to pass through the base plate and that electrically connect the first wiring circuits on the upper surface and the second wiring circuits on the lower surface to each other. The second wiring circuit substrate is formed on the upper surface of the base plate by comprising a first interlayer-insulating layer formed on surfaces of the base plate and the first metal layer, and a plurality of first protrusions for connecting upper and lower conductors to each other that is selectively formed in a length so as to reach the first metal layer and the through-holes in a state of passing through the first interlayer-insulating layer. The third wiring circuit substrate is formed on the lower surface of the base plate by comprising a second interlayer-insulating layer formed on surfaces of the base plate and the second metal layer, and a plurality of second protrusions for connecting upper and lower conductors to each other that is selectively formed in a length so as to reach the second metal layer and the through-holes in a state of passing through the second interlayer-insulating layer. The second wiring circuit substrate and the third wiring circuit substrate are stacked in a state where the edges of the first protrusions and the second protrusions are connected to the first wiring circuits and the second wiring circuits. Conductive paste is filled into the through-holes, and the second wiring circuit substrate and the third wiring circuit substrate are thereby electrically connected to each other.

According to the above aspect of the invention, the through-holes are formed on the base member to electrically connect the first and second metal layers to each other. The first and second protrusions are provided on the second and third wiring circuit substrate, respectively. The first and second interlayer-insulating layers are formed on faces of the second and third wiring circuit substrate on which the first and second protrusions are formed in a state of allowing the first and second protrusions to pass through.

In a state where the edges of the first protrusions are connected to the first wiring circuits formed of the first metal layer and the edges of second protrusions are connected to the second wiring circuits made of the second metal layer, the second and third wiring circuit substrates are stacked with the first wiring circuit substrate being arranged therebetween, and the wiring circuit substrate is thereby configured. According to the above, high integration is can be implemented, and in addition, improvement can be implemented for characteristics of the electric connection between the circuit substrates and the reliability of the connection.

According to still another aspect of the present invention, a wiring circuit substrate comprises a first metal layer for forming first conductor circuits; protrusions for interlayer connection that are selectively formed on the first metal layer and that are formed of the same metal as that for the first metal layer; an interlayer-insulating layer formed on a face of the first metal layer, on which the protrusions are formed, in a state of allowing the protrusions to pass through; a second metal layer that is formed on the protrusions and the interlayer-insulating layer and that is used for forming second conductor circuits; and a third metal layer arranged between the second metal layer and the protrusions.

According to the above aspect of the present invention, since the third metal layer is provided between the protrusions and the second metal layer, the reliability of electric connection characteristics of the protrusions is improved.

It is preferable that the second metal layer comprise openings that are formed on portions corresponding to the protrusions, each of the openings having a diameter larger than the diameter of each of the protrusions.

According to this, the top of each of the protrusions of the second metal layer is deeply inserted in a solder layer, a conductive-paste layer, or a noble-metal film that is filled in the opening, thereby further improving characteristics of the connections therebetween.

Also, it is preferable that the third metal layer be formed of one of a solder layer, a conductive-paste layer, and a noble-metal film. According to this, the second metal layer and the protrusions can be connected via one of the layers and the film, thereby allowing electric connection characteristics therebetween to be improved.

According to still another aspect of the present invention, a wiring circuit substrate comprises a metal layer for forming wiring circuits, an interlayer-insulating layer formed on the metal layer, protrusions for interconductor connection that are formed on the interlayer-insulating layer in a state of passing through the interlayer-insulating layer, and either conductor circuits differing from the conductor circuits or a circuit substrate that is formed on the protrusions and the interlayer-insulating layer. The interlayer-insulating layer is formed of an anisotropic conductive film.

In the above, an anisotropic conductive film is used as an interlayer-insulating layer. In this case, even with the interlayer-insulating layer being arranged between the protrusions and the metal layer, the area therebetween is allowed to become conductive; that is, the protrusions and the metal layer can securely be electrically connected to each other.

It is preferable that an anisotropic conductive film be formed either between the protrusions and the aforementioned different conductor circuits or between the protrusions and the circuit substrate. Thereby, the protrusions and the different conductor circuits can be securely connected to each other via metal particles in the anisotropic conductive film.

According to still another aspect of the present invention, a wiring circuit substrate comprises at least two first wiring circuit substrates and a second wiring circuit substrate provided between at least two units of the first wiring circuit substrates. Each of the first wiring circuit substrates comprises an insulating layer having at least one face on which first conductors of either a single layer or multiple layers are formed and openings for securing paths for electrical connection to the first conductor circuits are formed, an interlayer-insulating layer formed on the one face of the insulating layer in which the openings are formed, and protrusions formed of a conductor-forming metal layer in a state of passing through the interlayer-insulating layer at positions opposing the openings and are electrically connected to the first conductor circuits through the openings. The first wiring circuit substrates are stacked such that faces on each of which the protrusions and the interlayer-insulating layer are formed inwardly expose via the second wiring circuit substrate and are pressed. Thereby, the first wiring circuit substrates and the second wiring circuit substrate are integrated into one unit.

According to the invention, the protrusions electrically connected to the first conductor circuits via the openings are provided. The two wiring circuit substrates each having the interlayer-insulating layer are stacked such that faces on each of which the protrusions and the interlayer-insulating layer are formed inwardly expose. In this case, the two first wiring circuit substrates may be stacked either directly or via the wiring circuit substrate and are pressed. Thereby, the wiring circuit substrates are integrated into one unit. According to this configuration, the number of layers of conductor circuits of the wiring circuit substrate can be significantly increased, and mounting density can thereby be increased.

In the above, it is also preferable that the wiring circuit substrate further comprise LSI chips individually overlaid on the first wiring circuit substrates. In addition, it is preferable that the wiring circuit substrate further comprise packages individually overlaid on the first wiring circuit substrates.

According to the invention, with either the LSI chips or the packages, the wiring circuit substrate having either the LSI chips or the packaged that are mounted at high density can be obtained. This also allows miniaturization to be implemented for the wiring circuit substrate.

According to still another aspect of the present invention, a wiring circuit substrate comprises a first wiring circuit substrate, a second wiring circuit substrate stacked on the first wiring circuit substrate, and a third wiring circuit substrate stacked on the second wiring circuit substrate.

In this case, it is preferable that the individual first to third wiring circuit substrates have the aforementioned various types of the wiring circuit substrates. Thereby, the wiring circuit substrate that meets requirements for even higher density and even higher integration can be provided.

In addition, the present invention defines an electronic apparatus including one of the wiring circuit substrate as mentioned above. This allows the provision of the wiring circuit substrate of the present invention for use in the high-integration and high-density electronic apparatus.

According to still another aspect of the present invention, a manufacturing method for a wiring circuit substrate comprises a step of forming an etching-barrier layer on a first metal layer that will be formed to be first conductor circuits, and forming a second metal layer, which is used to form protrusions, on the etching-barrier layer, the etching-barrier layer being formed of a metal differing from that of the first metal layer; a step of forming the protrusions by selectively performing etching for the second metal layer by using etchant that does not etch at least the etching-barrier layer; a step of removing the etching-barrier layer by using the protrusions as masks and by using etchant that does not etch the first metal layer; a step of forming an interlayer-insulating layer on a face of the first metal layer on which the protrusions are formed; and a step of forming a third metal layer, which will be formed to be second conductor circuits, on the interlayer-insulating layer and the protrusions.

According to the above aspect, etching is selectively performed for the second metal layer for forming the protrusions by using etchant that does not etch the etching-barrier layer. Thereby, the protrusions can be forming, and only the etching-barrier layer can be removed by using etchant and by using the protrusions as masks. The protrusions connect the first and second conductor circuits to each other. Thus, the aforementioned wiring circuit substrate can be obtained.

According to still another aspect of the present invention, a manufacturing method for a wiring circuit substrate comprises a step of forming an etching-barrier layer on a first metal layer that will be formed to be first conductor circuits, and forming a second metal layer, which is used to form protrusions, on the etching-barrier layer, the etching-barrier layer being formed of a metal differing from that of the first metal layer; a step of forming the protrusions by selectively performing etching for the second metal layer by using etchant that does not etch at least the etching-barrier layer; a step of forming an interlayer-insulating layer on a face of the first metal layer on which the protrusions are formed; a step of forming a third metal layer, which will be formed to be second conductor circuits, on the interlayer-insulating layer and the protrusions; and a step of removing the first metal layer and the etching-barrier layer by performing selective etching using an etching mask layer as a mask.

According to the invention, selective etching by using the protrusions as masks is not performed for the etching-barrier layer. Specifically, the etching is performed for the etching-barrier layer together with the first metal layer for which selective etching is performed. This avoids a step that is carried out only to remove unnecessary portions of the etching-barrier layer, thereby allowing the manufacturing steps to be reduced.

Also in the invention, the step of forming the protrusions may include a step of using a fourth metal layer as an etching mask. It is preferable that the manufacturing method further comprise a step of allowing the fourth metal layer to remain and covering faces of the protrusions by using the fourth metal layer.

According to above, when etching is selectively performed for a layer made of a base metal to form the protrusions, the fourth metal layer is used as an etching mask. Even after the protrusions is formed, the fourth metal layer is allowed to remain, and the fourth metal layer is used to cover all the surfaces of the protrusions. In this case, without performing a difficult operation of coating conductive paste on the top of each of the protrusions, the fourth metal layer used as the etching mask can be used as a means for improving characteristics of the connection between the individual protrusions and the second metal layer.

According to still another aspect of the present invention, a manufacturing method for a wiring circuit substrate comprises a step of forming an etching-barrier layer on a first metal layer that will be formed to be first conductor circuits, and forming a second metal layer, which is used to form protrusions, on the etching-barrier layer, the etching-barrier layer being formed of a metal differing from that of the first metal layer; a step of forming the protrusions by selectively performing etching for the second metal layer by using etchant that does not etch at least the etching-barrier layer; a step of removing the etching-barrier layer by using the protrusions as masks and by using etchant that does not etch the first metal layer; forming an interlayer-insulating layer on a face of the first metal layer on which the protrusions are formed and forming a multilayer body; a step of forming a third metal layer, which will be formed to be second conductor circuits, on the interlayer-insulating layer and the protrusions; a step of overlaying individual metal foils on the third metal layer and the first metal layer of the wiring circuit substrate and performing pressing-heating processing therefor; and a step of selectively performing for the third metal layer and the metal foils and thereby forming the second conductor circuits, and also, selectively performing etching for the first metal layer and the metal foils and thereby forming the first conductor circuits, thereby forming the wiring circuit substrate.

According to the present invention, the wiring circuit substrate and metal foils are overlaid, and etching is selectively performed for both the first metal layer and the metal foils at the same time. This allows the provision of the wiring circuit substrate in which the first and second conductor circuits interlayer-insulated by the interlayer-insulating layer are provided on two faces, and the first and second conductor circuits are electrically connected to each other via the protrusions that pass through the interlayer-insulating layers.

Also, the manufacturing method may further comprise a step of stacking at least two units of the multilayer bodies on two faces of the wiring circuit substrate, on which the first conductor circuits and the second conductor circuits are formed, so as to be as a sandwich in a state where one face of each of the multilayer bodies faces inward, and performing pressing/heating processing therefor, thereby making an integral unit; and a step of selectively performing etching for two conductor-forming metal layers positioned on two faces of the integral unit, thereby forming conductor circuits on the two faces.

According to the above, at least two units of the multi-layer body are overlaid on two faces of the wiring circuit substrate and are press-heated, and they are thereby integrated into one unit. Then, etching is selectively performed for the metal layers existing on two faces of the integral unit, thereby forming the conductor circuits on two faces thereof. Accordingly, the wiring circuit substrate having conductor circuits of four layers can be obtained.

According to still another aspect of the present invention, a manufacturing method for a wiring circuit substrate comprises a step of forming an insulating layer including openings on at least one face of conductor circuits of either a single layer or multiple layers; a step of forming protrusions that are formed of a conductor-circuit-forming metal layer at positions opposing the openings and are electrically connected to the conductor circuits through the openings; a step of forming at least two wiring circuit substrates having an interlayer-insulating layer formed on the side of the insulating layer where the protrusions are formed; a step of stacking and pressing at least two units of the wiring circuit substrates directly or via another wiring circuit substrate in a state where the sides where the protrusions and the interlayer-insulating layer are formed face inward, thereby making them into an integral unit.

According to the above, there is provided a base metal via the insulating layer having the openings in one main face of the conductor circuits of either a single layer or multiple layers. Also, there are provided the protrusions electrically connected to the conductor circuits through the openings. The two wiring circuit substrates having the interlayer-insulating layer formed on the side of the insulating layer where the protrusions are formed are stacked directly or via another wiring circuit substrate in a state where the sides where the protrusions and the interlayer-insulating layer are formed face inward, thereby making them into an integral unit. Thereby, the number of the layers of the conductor circuits of the wiring circuit substrate can be significantly increased, and the mounting density can therefore be increased.

According to still another aspect of the present invention, a manufacturing method for a wiring circuit substrate comprises a step of preparing a first metal layer used for forming first conductor circuits and selectively forming mask films on one face of the first metal layer; a step of performing half-etching for the first metal layer by using the mask films as masks, thereby selectively forming protrusions on the one face of the first metal layer; a step of forming an interlayer-insulating layer on the first interlayer-insulating layer in a state of allowing the protrusions to pass through; a step of overlaying a second metal layer, which will be formed to be second conductor circuits, on the protrusions and the interlayer-insulating layer; and a step of selectively patterning the first metal layer and the second metal layer at one time or different times, thereby forming the first conductor circuits and the second conductor circuits.

According to the invention, mask films are selectively formed on one face of the first metal layer that is used as a base member, and half-etching is performed for the first metal layer by using the mask films as masks. Subsequently, the metal layer to be formed to be the conductor circuits and the protrusions are formed. Then, the two metal layers are formed via the interlayer-insulating layer on the surface of the first metal layer (which will be formed to be the first conductor circuits) on which the protrusions are formed. Subsequently, the first and second metal layers formed on two surfaces of the interlayer-insulating layer are selectively patterned at one time or different times, thereby forming wiring films. Thereby, the wiring circuit substrate can be obtained.

It is preferable that the manufacturing method further comprise a step of forming an anisotropic conductive film on the top of each of the protrusions before overlaying the second metal layer. The anisotropic conductive film improves electrical-connection characteristics between the second metal layer and the protrusions.

It is also preferable that the manufacturing method further comprise a step of performing spray-etching for the top of each of the protrusions after forming the protrusions. This allows the surfaces of each of the protrusions to have a rough pattern.

It is preferable that the step of forming the protrusions include a step of using resist masks each having a diameter smaller than a diameter of each of the protrusions required to be formed, thereby performing half-etching. This allows spear-like protrusions to be formed.

Also, it is preferable that the step of forming the protrusions include a step of removing the masks after forming the protrusions by performing the half-etching, and a step of performing half-etching again. This allows spear-like protrusions to be formed.

Also, it is preferable that said manufacturing further comprise a step of removing unnecessary pieces of the protrusions by performing over-etching before performing patterning for the firs conductor circuits and the second conductor circuits. This allows the protrusions to be arranged and arrayed as desired. This is effective when the protrusions are formed in an arrangement from a state of a matrix-like arrangement so as to receive uniformed pressure.

According to still another aspect of the present invention, a manufacturing method for a wiring circuit substrate comprises a step of forming a plurality of first metal layers formed of first wiring circuits on an upper surface of a base plate made of insulating resin, and forming a plurality of second metal layers formed of second wiring circuits on a lower surface of the base plate. The manufacturing method also comprises a step of forming first protrusions and a first interlayer-insulating layer in a length so as to reach the first metal layer in a preliminarily arranged state where the first protrusions pass through the first interlayer-insulating layer, and forming second protrusions and a second interlayer-insulating layer in a length so as to reach the second metal layer in a preliminarily arranged state where the second protrusions pass through the second interlayer-insulating layer. The manufacturing method also comprises a step of filling conductive paste, which electrically connects the first wiring circuits on the upper surface and the second wiring circuits on the lower surface to each other, into through-holes formed so as to pass through the base plate. In addition, the manufacturing method comprises a method of overlaying the first interlayer-insulating layer on surfaces of the base plate and the first metal layer (that is, on the upper surface of the base plate), and connecting the first protrusions to the first metal layer; and overlaying the second interlayer-insulating layer on surfaces of the base plate and the second metal layer (that is, on the lower surface of the base plate), and connecting the second protrusions to the second metal layer. The step of connection to the first metal layer includes a step of allowing the first protrusions to abut openings formed in the first metal layer to have a diameter smaller than that of the top of each of the first protrusions. Also, the step of connection to the second metal layer includes a step of allowing the second protrusions to abut openings formed in the second metal layer to have a diameter smaller than that of the top of each of the second protrusions.

According to the invention, when the first and second protrusions are connected to the first and second metal layers, the top of the first and second protrusions abut each of the openings and collapses it. This further increases the strengths of connections between the first and second protrusions and the first and second metal layers, thereby allowing the reliability of the connections.

According to still another aspect of the present invention, a manufacturing method for a wiring circuit substrate comprises a step of arranging many protrusions, which are formed of metal for interconductor connection, on a surface of a first metal layer; a step of providing an interlayer-insulating layer on the surface of the first metal layer in a state of allowing the protrusions to pass through; a step of forming a second metal layer on surfaces of the interlayer-insulating layer and the protrusions, the second metal layer being formed of a metal differing from that of the first metal layer; and a step of forming spacers using the same material as that for the protrusions so as to have substantially the same heights as the protrusions at the same step of forming the protrusions.

According to the above, the spacers are formed in the same step as that of forming the protrusions. Therefore, without increasing the number of steps, by the provision of the spacers, the wiring circuit substrate can be formed that allows spacings to be secured between the spacers and the metal layers.

According to still another aspect of the present invention, a manufacturing method for a wiring circuit substrate, comprises a step of arranging many protrusions, which are formed of metal for interconductor connection, on a surface of a first metal layer; a step of providing an interlayer-insulating layer on the surface of the first metal layer in a state of allowing the protrusions to pass through; forming a second metal layer on surfaces of the interlayer-insulating layer and the protrusions, the second metal layer being formed of a metal differing from that of the first metal layer; and a step of forming identification marks using the same material as that for the protrusions so as to have substantially the same heights as the protrusions at the same step of forming the protrusions.

According to the above, the identification marks can be formed in the same step as that of forming the protrusions. Therefore, without increasing the number of steps, the wiring circuit substrate having the identification marks can be obtained.

According to still another aspect of the present invention, a manufacturing method for a wiring circuit substrate, comprises a step of forming a plurality of first metal layers formed of first wiring circuits on an upper surface of a base plate made of insulating resin, and forming a plurality of second metal layers formed of second wiring circuits on a lower surface of the base plate. The manufacturing method also comprises a step of forming first protrusions and a first interlayer-insulating layer in a length so as to reach the first metal layer in a preliminarily arranged state where the first protrusions pass through the first interlayer-insulating layer, and forming second protrusions and a second interlayer-insulating layer in a length so as to reach the second metal layer in a preliminarily arranged state where the second protrusions pass through the second interlayer-insulating layer. Also, the manufacturing method comprises a step of overlaying the first interlayer-insulating layer on surfaces of the base plate and the first metal layer (that is, on the upper surface of the base plate), and connecting the first protrusions to the first metal layer; and a step of overlaying the second interlayer-insulating layer on surfaces of the base plate and the second metal layer (that is, on the lower surface of the base plate), and connecting the second protrusions to the second metal layer. The manufacturing method also comprises a step of forming a third metal layer, which is formed of either conductive paste or a noble metal, on surfaces of the first metal layer and the second metal layer before the aforementioned connection is performed.

According to the invention, the first and second wiring circuits can be assembled with the base plate being arranged therebetween. In the assembly, since the individual first and second protrusions are connected to each other via the third metal layer (one of conductive paste and a noble-metal film), electric connection characteristics therebetween can be in a suitable condition.

Also, it is preferable that the manufacturing method further comprise a step of removing partial areas of the third metal layer that protrude from surfaces of the first metal layer and the second metal layer by polishing the surfaces of the first metal layer and the second metal layer after the third metal layer is formed. According to this, the third metal layer can be formed only in, for example, the openings in the first and second metal layers.

According to still another aspect of the present invention, a manufacturing method for a wiring circuit substrate, comprises a step of selectively forming protrusions for interconductor connection on a first metal layer, the protrusions being formed of the same material as that for the first metal layer; a step of forming an interlayer-insulating layer on a surface of the first metal layer on which the protrusions are formed; and a step of forming a second metal layer, which is formed to be second conductor circuits, on the interlayer-insulating layer and the protrusions. Also, the manufacturing method comprises a step of forming one of a solder layer, a conductive-paste layer, and a noble-metal film between the protrusions and the second metal layer so as to correspond to the protrusions; and a step of stacking the wiring circuit substrate by connecting the protrusions to one of the solder layer, conductive-paste layer, and the noble-metal film.

According to the invention, before the second metal layer is formed, one of the solder layer, the conductive-paste layer, and the noble-metal layer is formed so as to be overlaid on surfaces of the protrusions. According to this arrangement, high integration is achieved in the assembly, and concurrently, the wiring circuit substrate improving electric connection characteristics between the circuit substrates and the reliability of connections can be obtained.

According to still another aspect of the present invention, a manufacturing method for a wiring circuit substrate comprises a step of selectively forming protrusions for interconductor connection on a first metal layer, the protrusions being formed of the same material as that for the first metal layer. The manufacturing method also comprises a step of forming an interlayer-insulating layer on a surface of the first metal layer on which the protrusions are formed; and a step of forming a second metal layer, which is formed to be second conductor circuits, on the interlayer-insulating layer and the protrusions. In addition, the manufacturing method comprises a step of printing one of a solder layer, a conductive-paste layer, and a noble-metal film between the protrusions and the second metal layer so as to correspond to the protrusions; and a step of stacking the wiring circuit substrate by connecting the protrusions to one of the solder layer, conductive-paste layer, and the noble-metal film. The step of stacking the wiring circuit substrate includes a step of forming the configuration wherein each of the protrusions passes through the interlayer-insulating layer, and one of the solder layer, the conductive-paste layer, and the noble-metal film is connected to the protrusions.

According to the invention, the second metal layer that will be formed to be the second conductor circuits differing from the first conductor circuits are formed on the side where the protrusions are formed. Then, corresponding to the protrusions, a member on which one of the solder layer, the conductive-paste layer, and the noble-metal layer is overlaid is provided. Thereby, the wiring circuit substrate can be obtained.

Another aspect of the present invention includes a base member, and a laminating sheet to be laminated on one or both surfaces of the base member. The base member has an insulating layer and metal wiring layers formed on both surfaces of the insulating layer. Furthermore, the base member has one or a plurality of through holes formed through the metal wiring layers and the insulating layer. Moreover, the base member has one or a plurality of conductive members formed so as to fill the one or the plurality of the through holes. The laminating sheet has a wiring layer, and one or a plurality of protrusion parts formed, projecting from the wiring layer at a position facing to the one or the plurality of the through holes. Furthermore, the laminating sheet is laminated in the state with the one or the plurality of the protrusion parts and the one or the plurality of the conductive materials connected.

In the present invention, the laminating sheet is formed on one or both surfaces of the base member. At the time, since the protrusion part is connected so as to cut into the conductive material, the wiring layer comprising the laminating sheet cannot be deflected also in the vicinity of the through hole. Therefore, the film thickness can be evened at a necessary thickness, and thus minute wiring can be enabled.

Moreover, since the protrusion part and the conductive material are connected directly, the adhesion property can be strengthened, and thus the reliability of the interlayer connection can be improved. Furthermore, unlike the conventional example, the wiring layer needs not be formed by an electroless plating and a subsequent electrolytic plating of a copper film.

Still another aspect of the present invention includes a base member, a first laminating sheet to be laminated on one or both surfaces of the base member, and a second laminating sheet to be laminated outside the first laminating sheet. The base member has an insulating layer and metal wiring layers formed on both surfaces of the insulating layer. Furthermore, the base member has one or a plurality of through holes formed through the metal wiring layers and the insulating layer. Moreover, the base member has one or a plurality of conductive members formed so as to fill the one or the plurality of the through holes. The first laminating sheet has a wiring layer, and one or a plurality of protrusion parts formed, projecting from the wiring layer at a position facing to the one or the plurality of the through holes. Furthermore, the first laminating sheet is laminated in the state with the one or the plurality of the protrusion parts and the one or the plurality of the conductive materials connected.

According to the present invention, since the second laminating sheet is further laminated, a multi-layer structure of the wiring substrate can be provided by a relatively simple process.

Still another aspect of the present invention has a base member including metal wiring layers formed on both surfaces of an insulating layer, and one or a plurality of through holes formed through the metal wiring layers and the insulating layer. A step of filling the one or the plurality of the through holes of the base member with the one or the plurality of the conductive materials is included. Furthermore, a laminating sheet including one or a plurality of protrusion parts formed, projecting from the metal layer at a position facing to the metal layer and the one or the plurality of the through holes is provided. A step of laminating the laminating sheet on one or both surfaces of the base member in the state with the one or the plurality of the protrusion parts and the one or the plurality of the conductive materials connected is included. Moreover, a step of forming a wiring layer by patterning the metal layer of the laminating sheet is provided.

Furthermore, still another aspect of the present invention has a base member including metal wiring layers formed on both surfaces of an insulating layer, and one or a plurality of through holes formed through the metal wiring layers and the insulating layer. A step of filling the one or the plurality of the through holes of the base member with the one or the plurality of the conductive materials is included. Furthermore, a laminating sheet including one or a plurality of protrusion parts formed, projecting from the wiring layer at a position facing to the wiring layer and the one or the plurality of the through holes is provided. A step of laminating the laminating sheet on one or both surfaces of the base member in the state with the one or the plurality of the protrusion parts and the one or the plurality of the conductive materials connected is included. Moreover, a step of further forming one or a plurality of laminating sheets substantially same as the laminating sheet on the surface of the laminating sheet is included.

According to the present invention, a multi-layer structure of the wiring substrate can be provided by a relatively simple process of preparing a base member and a laminating sheet, selective etching necessary for forming a wiring layer, and laminating the laminating sheet and the base member.

Moreover, by increasing the number of the laminating sheets to be laminated, a multi-layer structure of the wiring circuit substrate can easily be achieved so that a further high integration of the wiring circuit substrate can be realized.

BRIEF DESCRIPTION OF THE DRAWINGS

FIG. 17 is a cross-sectional view of an embodiment of protrusions of an example wiring circuit substrate of the present invention, wherein protrusions having different diameters are arranged;

FIG. 18A is a perspective view of an embodiment of the present invention, wherein identification marks formed of the same material as that of protrusions are provided;

FIG. 18B is a plan view of an example the identification mark in FIG. 18A;

FIG. 18C is a plan view of another example of the identification mark in FIG. 18A;

DESCRIPTION OF THE PREFERRED EMBODIMENTS

Hereinbelow, a detailed description will be given of preferred embodiments of the present invention with reference to the accompanying drawings.

(First Embodiment)

First of all, a description will be given of a configuration and an outline of a wiring circuit substrate according to a first embodiment of the present invention. The description will be made according to the sequential manufacturing steps. FIGS. 1A to 1G and 2A to 2D are cross-sectional views each showing the wiring circuit substrate and a manufacturing method therefor according to the present invention in the order of manufacturing steps.

Step (A)

Figure 1A:
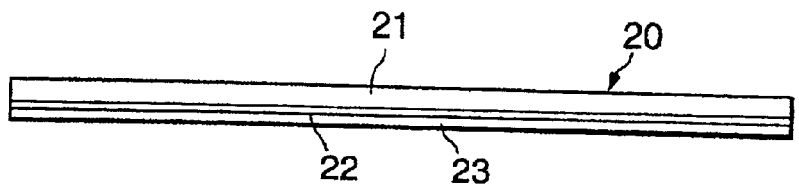
FIG. 1A is cross-sectional views showing example manufacturing steps for an example wiring circuit substrate according to the present invention.

As shown in FIG. 1A, a base member 20 (for example, glass epoxy prepare) is prepared. The base member 20 is composed of materials including a copper foil 21, an etching-barrier layer 22, and a copper foil 23. The copper foil 21 (protrusion-forming metal layer) is used for forming protrusions and has a thickness of, for example, 100 $\mu$m. The etching-barrier layer 22 has a thickness of, for example, 2 $\mu$m, is made of, for example, a nickel plated layer, and is formed on the entire surface of the copper foil 21. The copper foil 23 (conductor-circuit-forming metal foil having a thickness of, for example, 18 $\mu$m) is formed on the surface of the etching-barrier layer 22.

Thus, the etching-barrier layer 22 is plated and formed on the copper foil 21, and the copper foil 23 covers the etching-barrier layer 22.

Step (B)

Figure 1B:
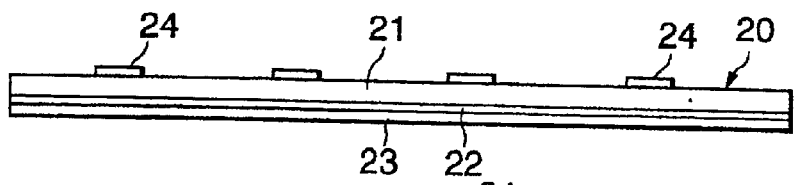
FIGS. 1B to 1G are cross-sectional views showing example manufacturing steps for an example wiring circuit substrate according to the present invention.
Figure 1C:
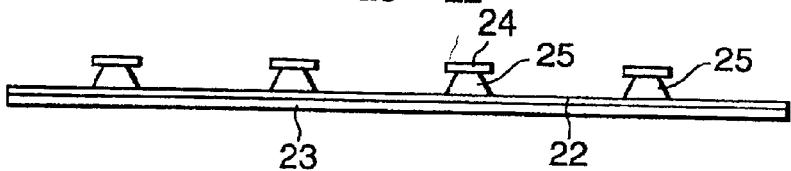

Subsequently, as shown in FIG. 1B, a resist film 24 is selectively formed on the surface of the aforementioned protrusion-forming copper foil 21. The resist film 24 is formed so as to cover portions on which protrusions are formed.

Step (C)

Subsequently, etching is performed for the aforementioned copper foil 21 by using the aforementioned resist film 24 as a mask, thereby forming protrusions 25. For the etching, wet etching is performed using etchant that does not etch the etching-barrier layer 22, but is capable of etching the copper foil 21.

Step (D)

Figure 1D:
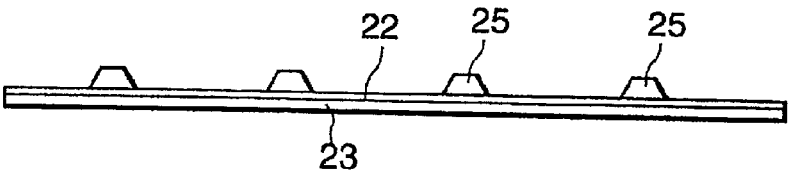

Subsequently, the resist film 24 used as the etching mask in the etching is removed. FIG. 1D illustrates a state where the etching mask has been removed.

Step (E)

Figure 1E:
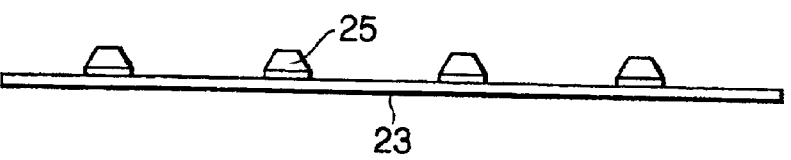
Figure 1F:
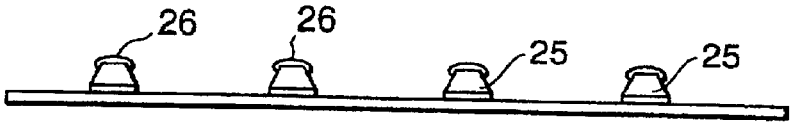

Subsequently, as shown in FIG. 1E, etching is performed for the aforementioned etching-barrier layer 22 by using the protrusions 25 as masks. The etching in this step uses etchant (nickel-parting liquid) that does not etch a metal (copper in the present embodiment) that composes the protrusions 25, but capable of etching a metal (nickel in the present embodiment) that composes the etching-barrier layer 22.

Step (F)

Subsequently, as shown in FIG. 1E, thin conductive paste 26 is applied on the top portion (upper portion) of each of the protrusions 25, and thereafter, cures it. This step is not mandatory; however, it allows significant improvement in reliability of the connection between each of the protrusions 25 and the copper foil.

Step (G)

Figure 1G:
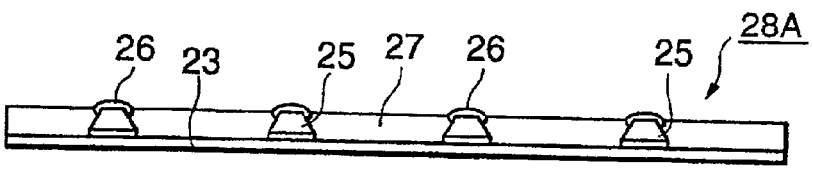

Subsequently, an insulating sheet is press-bonded using a heating roller onto the faces on which the aforementioned protrusions 25 formed of the aforementioned copper foil 21. Thereby, as shown in FIG. 1G, an interlayer-insulating layer 27 is formed. In this case, for the interlayer-insulating layer 27, an insulation layer thinner than the height of the protrusion 25 (height including the thickness of the conductive paste 26 when the conductive paste 26 is applied) is selectively used so that the upper portion of the protrusion 25 protrudes as the insulating sheet. Otherwise, interlayer connection using the protrusions 25 cannot be securely performed. According to step G described above, the interlayer-insulating layer 27 is formed on the copper foil 23. Thus, the protrusions 25 are connected via the copper foil 23 and the etching-barrier layer 22 and pierce it so as to protrude therefrom, and a multilayer body 28A is thereby composed. This step is performed at a temperature at which the epoxy resin softens, and immediately, the temperature is returned to a room temperature so that curing reaction does not occur in the epoxy.

Steps (H) and (I)

Figure 2A:
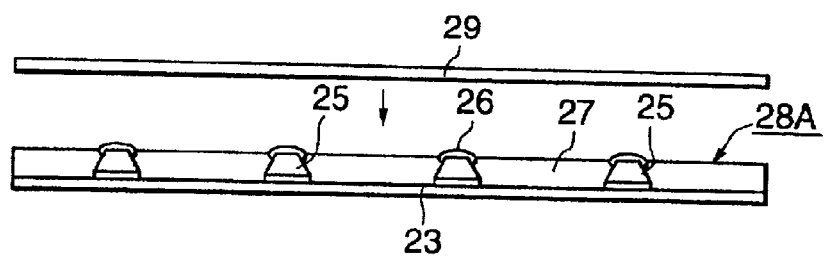
FIGS. 2A to 2D are cross-sectional views showing example manufacturing steps for an example according to a first embodiment.
Figure 2B:
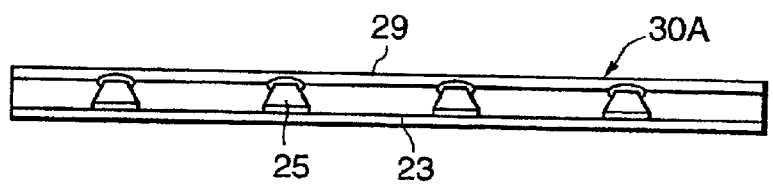

Subsequently, as shown in FIG. 2A, the interlayer-insulating layer 27 of the aforementioned multilayer body 28 is formed; and a copper foil (conductor-forming metal layer) having a thickness of, for example, 18 μm is placed on the side where the protrusions 25 protrude, is thermally press-bonded, and is thereby overlaid using an overlaying press. By this step, a multilayer body is 30A is composed in which the metal layer 23 and a metal layer 29 that are formed on the interlayer-insulating layer 27 are interlayer-connected via the protrusions 25.

Steps (J) and (K)

Figure 2C:
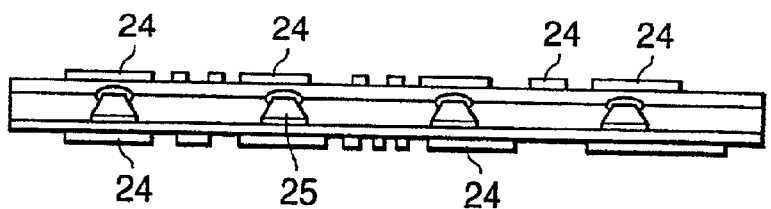
Figure 2D:
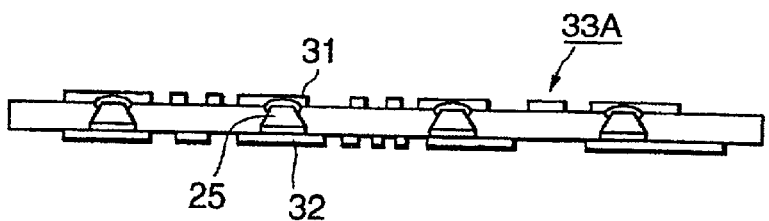

Subsequently, as shown in FIG. 2C, resist films 24 to be used as etching masks are formed on the surfaces of the metal layers 23 and 29. Thereafter, etching is performed for the metal layers 23 and 29 by using the resist films 24 as masks, and conductor circuits 31 and 32 are thereby formed. A wiring circuit substrate 33 as shown in FIG. 2D is thereby produced, in which the conductor circuits 31 and 32 on two surfaces are interlayer-connected via the protrusions 25. The circuit substrate 33 thus formed is the first embodiment of the wiring circuit substrate according to the present invention.

As described above, according to the first embodiment, processing is started by using the base member 20 including at least the copper foil 21, which is the protrusion forming metal layer having a thickness (for example, 50 to 200 μm) that is-sufficient for composing the protrusions 25. Therefore, the embodiment has advantages in that defects such as deformation are not easily caused, and dimensional accuracy is stable. Because of the stable dimensional accuracy, positional deviation does not occur in the protrusions 25 after they are formed. This prevents problems as occurred in the conventional example. For example, the present embodiment prevents the problem that since conductive paste 3 (through-hole) in the opening 2 in the conventional example shown in FIGS. 23 and 24 causes positional deviation, necessary connection between the upper and lower conductor circuits 5 cannot be made. Accordingly, in the present embodiment, the protrusions 25 each having a very small diameter can be arranged at high accuracy. In addition, the ultra-high-density circuit substrate 33A in which interlayer connection between conductor circuits is ensured can be obtained.

Furthermore, the protrusions 25 are formed of, for example, the copper foil 21, material costs required for forming can be low. Even in a case where the arrangement density of the protrusions 25 is increased and the number of the arrangements is increased, the cost for the wiring circuit substrate is not increased. This is different from the conventional case where the cost is increased because of use of the conductive paste mainly made of a noble metal, such as silver. This significantly contributes to the reduction in the cost for the wiring circuit substrate.

In addition, since the protrusions 25 are formed by selectively performing etching for the copper foil 21, the height of each of the protrusions 25 is determined according to the thickness of the copper foil 21. In this case, since the copper foil 21 can be produced so as to have the thickness at very high uniformity, the heights of the protrusions 25 can be uniformed. Therefore, the present embodiment does not arise problems such as a possibility that heights of the protrusions 11 become ununiform due to formation of the protrusions 11 with conductive paste through printing, as in the conventional art shown in FIG. 46 and FIG. 47 and a possibility that the upper portion is recessed because of volatilization of solvent during curing of the conductive paste 3, thereby causing incomplete connection to be made between the upper and lower conductor circuits. Accordingly, in the present embodiment, although the protrusions 25 are miniaturized and are formed at high density, secure connection between the upper and lower conductor circuits can be expected, and improvement in the reliability and the yield can therefore be implemented.

(Second Embodiment)

Hereinbelow, a description will be given of a second embodiment according to the present invention with reference to FIGS. 3A to 3F. The second embodiment includes configurations and processing steps that are substantially common to those in the first embodiment FIGS. 3A to 3F are cross-sectional views showing a manufacturing method for a wiring circuit substrate according to the second embodiment of the present invention in the order of manufacturing steps.

Step (A)

Figure 3A:
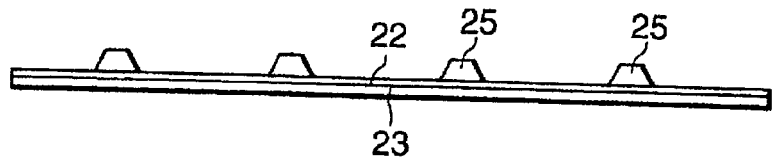
FIGS. 3A to 3F are cross-sectional views showing example manufacturing steps for an example wiring circuit substrate according to the present invention.

The same steps shown in FIGS. 1A to 1D are perform thereby making the substrate in the state where protrusion 25 are formed. FIG. 3A shows the state where the protrusions 25 are formed.

Step (B)

Figure 3B:

Subsequently, as shown in FIG. 3B, depending on the requirement, thin conductive paste 26 is applied on the portion (upper portion) of each of the protrusions 25, thereafter, cures it. This step is not mandatory; how it allows significant improvement in reliability of the connection between each of the protrusions 25 and a copper foil that will be formed in a later step.

In step (B), a step of removing an etching-barrier layer 22 for which etching is carried out using protrusions 25 as masks is not performed.

As will be described below, unnecessary portions of the etching-barrier layer 22 will be removed in perform selective etching for a metal layer 23. Specifically, patterning is performed to form conductor circuits, etching for the etching-barrier layer 22 is performed at the same time when etching is performed for the metal layer 23. This is a characteristic aspect that is different from above-described first embodiment.

Step (C)

Figure 3C:
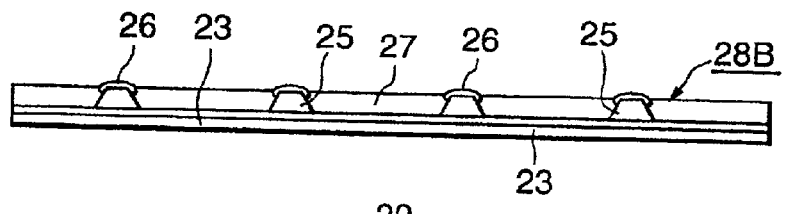

Subsequently, as shown in FIG. 3C, an interlayer-insulating layer 27 is formed, thereby forming a multilayer body 28 at a completion time. The multilayer body 28 includes the metal layer 23, the etching-barrier layer formed on the metal layer 23, the plurality of protrusions 25 provided on the etching-barrier layer 22, conductive paste 26 provided on the top portion of each of the protrusions 25, and the interlayer-insulating layer 27 formed between the protrusions 25.

Step (D)

Figure 3D:
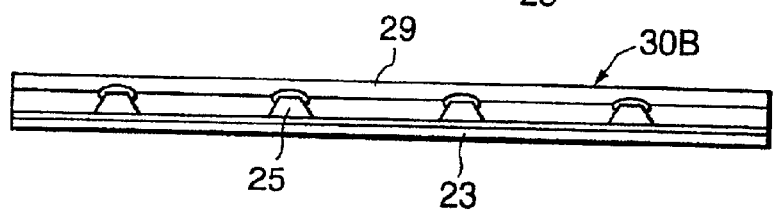

Subsequently, as shown in FIG. 3D, a copper foil 29 (conductor-forming metal layer) is thermally press-bonded and thereby overlaid on the multilayer body 28 by using an overlaying press. Thereby, a multilayer body 30 is formed.

The multilayer body 30 is formed in a state where the metal layers 23 and 29 formed on two faces of the interlayer-insulating layer 27 are interlayer-connected via the protrusions 25.

Step (E)

Figure 3E:
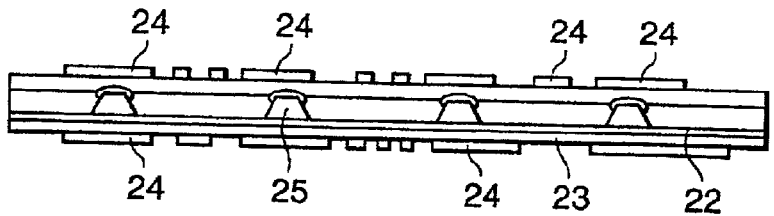

Subsequently, as shown in FIG. 3E, resist films 24 to be used as etching masks are formed on the surface of the metal layer 23. Similarly, the resist films 24 to be used as etching masks are formed on the surface of the metal layer 29.

Thereafter, etching is performed for the metal layers 23 and 29 by using the resist films 24 as masks, and conductor circuits 31 are thereby formed. Similarly, etching is performed for the metal layer 29 by using the resist films 24 as masks, and conductor circuits 32 are thereby formed.

Furthermore, simultaneously the etching-barrier layer 22 in the region contacting with the metal layer 23 is also etched by this etching process. Preferably, the etching-barrier layer 22 is formed of, for example, a nickel material.

The conductor circuits 31 and 32 on two faces are interlayer-connected to each other via the protrusions 25. The wiring circuit substrate 33 is thus produced.

Step (F)

Figure 3F:
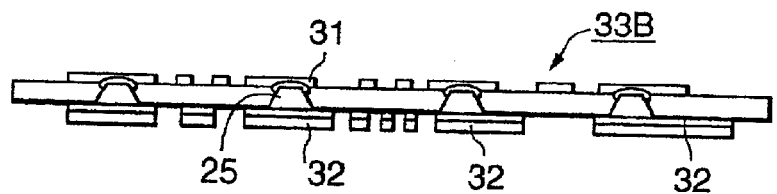

As shown in FIG. 3F, the resist films 24 used as etching masks are removed. The wiring circuit substrate 33 after the removal of the resist film 24 is the second embodiment of the present invention.

For etching to be performed by using the resist films 24 in areas where the conductor circuits 31 and 32 are formed, etchant described below is preferably used. The preferable etchant is capable of etching nickel-based metals as well as copper-based metals. With the etchant of the aforementioned type being used, the etching-barrier layer 22 (for example, a nickel layer) and the metal layer 23 (for example, a copper layer) can be removed by performing selective etching using the resist films 24 as masks. According to the above, after the protrusions 25 are formed, the etching-barrier layer 22 need not be masked for removal. This allows reduction in steps to be implemented.

As described above, according to the second embodiment, while the same advantages as those in the first embodiment, both the etching-barrier layer 22 and the metal layer 23 can be removed by performing single-time selective etching using the same resist films 24 as masks.

Accordingly, compared to the first embodiment, the number of steps can be fewer.

(Third Embodiment)

Hereinbelow, a description will be given of a third embodiment according to the present invention with reference to FIGS. 4A to 4C.

The third embodiment includes configurations and processing steps that are substantially common to those in the first embodiment. FIGS. 4A to 4C are cross-sectional views showing a manufacturing method for a wiring circuit substrate according to the third embodiment of the present invention in the order of manufacturing steps.

The third embodiment is described with reference to an example in which the multilayer bodies 28 formed in step (G) of the first embodiment are overlaid on the two faces of the wiring circuit substrate 33 manufactured in the first embodiment. After the multilayer bodies 28 are overlaid, selective etching is performed for the metal layers 23 in the individual multilayer bodies 28A, patterning is performed therefor, and conductor circuits are thereby formed. This allows the provision of multilayer conductor circuits, for example, four-layer conductor circuits.

Step (A)

Figure 4A:
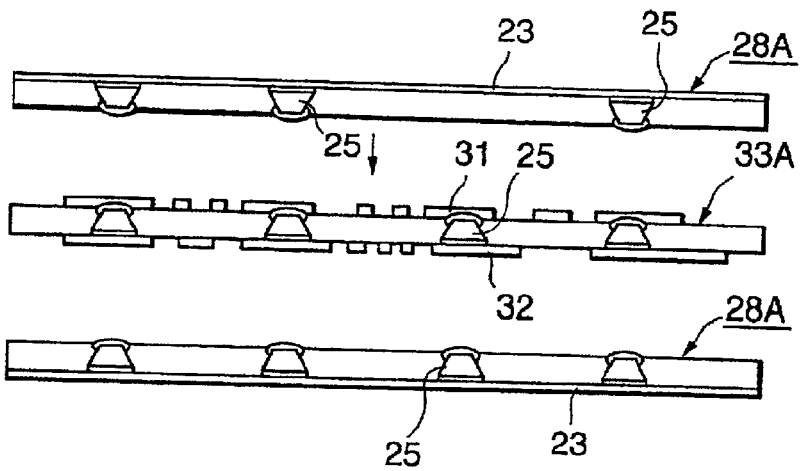
FIGS. 4A to 4C are cross-sectional views showing example manufacturing steps for an example wiring circuit substrate according to the present invention.

First of all, as shown in FIG. 4A, the multilayer body 28 is arranged on one face (upper face) of the wiring circuit substrate 33. At this time, a face on which the protrusions 25 and the interlayer-insulating layer 27 of the multilayer body 28 are formed is arranged so as to oppose the aforementioned one face (upper face).

Similarly, the multilayer body 28 is arranged on the other face (lower face) of the wiring circuit substrate 33. At this time, a face on which the protrusions 25 and the interlayer-insulating layer 27 of the multilayer body 28 are formed is arranged so as to oppose the aforementioned other face (lower face).

In this way, a positioning step is performed for the two multilayer bodies 28, that is, the upper and lower multilayer bodies 28.

After the positioning step is carried out, the layers are thermally press-bonded using an overlaying press, and are thereby integrated into one unit.

Step (B)

Figure 4B:
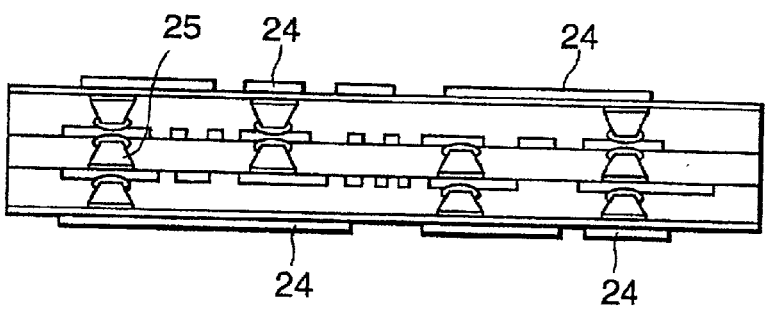
Figure 4C:
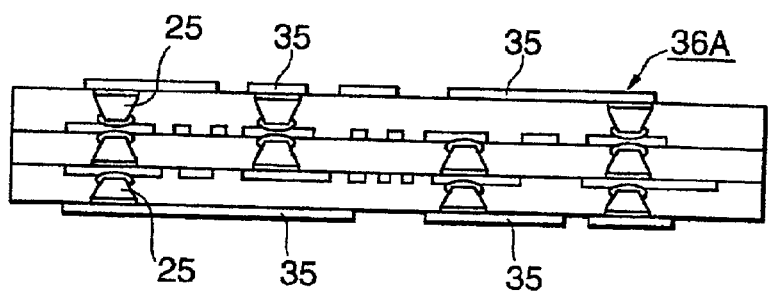

Subsequently, as shown in FIG. 4B, a plurality of resist films 24 is selectively formed on the metal layer 23 of the upper multilayer body 28. Similarly, the resist films 24 are selectively formed on the metal layer 23 of the lower multilayer body 28.

Step (C)

Etching is performed for a metal layer 23 of the upper multilayer body 28 using the resist films 24 as masks, thereby forming upper conductor circuits 35. Similarly, etching is performed for a metal layer 23 of the lower multilayer body 28 using the resist films 24 as masks, thereby forming lower conductor circuits 35.

According to the above, a multilayer wiring circuit substrate 36 of the third embodiment is produced.

The wiring circuit substrate 36 includes the aforementioned wiring circuit substrate 33 and the upper and lower multilayer bodies 28.

According to the third embodiment, the wiring circuit substrate 36 having a plurality of layers of the conductor circuits, for example, four layers of the conductor circuits, can be obtained. This allows the wiring circuit substrate 36 to be of even higher density.

(Fourth Embodiment)

Hereinbelow, a description will be given of a fourth embodiment according to the present invention with reference to FIGS. 5A to 5G and 6A and 6B. The fourth embodiment includes configurations that are substantially common to those in the first embodiment. FIGS. 5A to 5G and 6A and 6B are cross-sectional views showing a manufacturing method for a wiring circuit substrate according to the fourth embodiment of the present invention in the order of manufacturing steps.

Step (A)

Figure 5A:
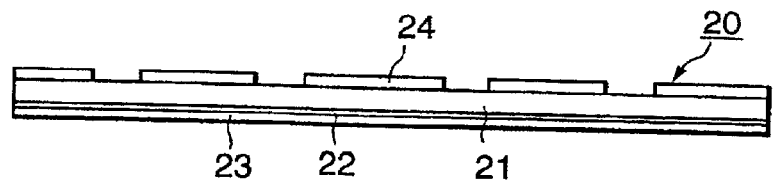
FIGS. 5A to 5G are cross-sectional views showing example manufacturing steps for an example wiring circuit substrate according to the present invention.

The same base member 20 as that shown in FIG. 1A is first prepared. Thereafter, resist films 24 are coated on a surface of a copper foil 21 on which protrusions 25 will be formed in a later step. Then, as shown in FIG. 5A, patterning is performed in ways of exposure and development. In particular, patterning is performed for the resist films 24 so that only portions where the protrusions 25 will be formed are open and the resist films 24 cover portions where the protrusions 25 will not be formed.

Step (B)

Figure 5B:
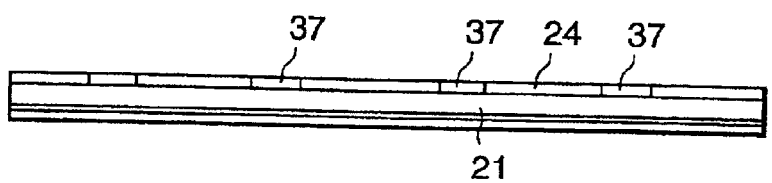

Subsequently, as shown in FIG. 5B, solder-plated layers 37 (each having a thickness, for example, ranging from 19 $\mu$m to 21 $\mu$m) are formed according to an electric plating method by using the resist films 24 as masks.

The solder-plated layers 37 are composed of materials, for example, such as either tin (Sn)/lead (Pb) or tin (Sn)/silver (Ag)/copper (Cu). Alternatively, for the solder-plated layers 37, plated layers of, gold (Au), silver (Ag), or palladium (Pd), may be formed.

Step (C)

Figure 5C:
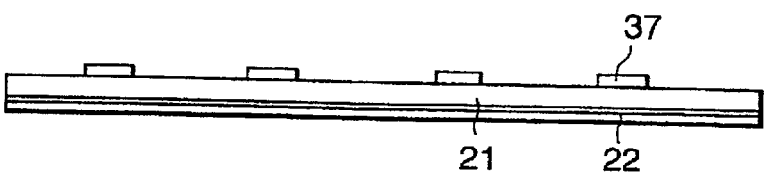

Subsequently, step (C) removes the resist films 24, as shown in FIG. 5C.

Step (D)

Figure 5D:
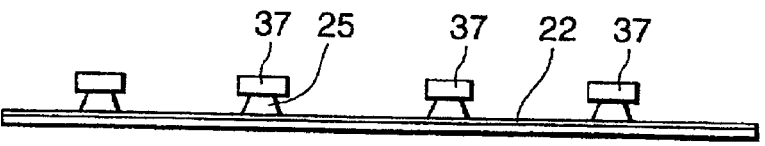

Subsequently, as shown in FIG. 5D, selective etching is performed for the metal layer 21 (for example, a copper layer) by using the solder-plated layers 37 as masks. Thereby, the protrusions 25 are formed.

Step (E)

Figure 5E:

Subsequently, as shown in FIG. 5E, an etching-barrier layer 22 (for example, a nickel layer) is removed.

Step (F)

Figure 5F:

Subsequently, as shown in FIG. 5F, step (F) performs solder-reflow processing. In this step, the individual solder-plated layers 37 are overlaid to cover the surfaces of the individual protrusions 25.

Step (G)

Figure 5G:
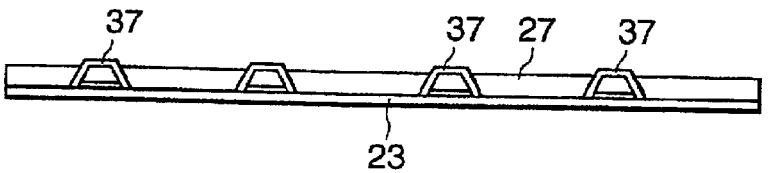

Subsequently, as shown in FIG. 5G, using a heating roller, an insulating sheet is press-bonded on the surface where the protrusions 25 are formed. Thereby, an interlayer-insulating layer 27 made of the insulating sheet is formed. In this case, the top (upper portion) of each of the protrusions 25 protrudes from the surface of the interlayer-insulating layer 27. For this reason, the interlayer-insulating layer 27 is formed so as to have a thickness smaller than the combined thicknesses of the protrusion 25 and the solder-plated layer 37. Thus, in step (G), a multilayer body 28 is formed.

Step (H)

Figure 6A:
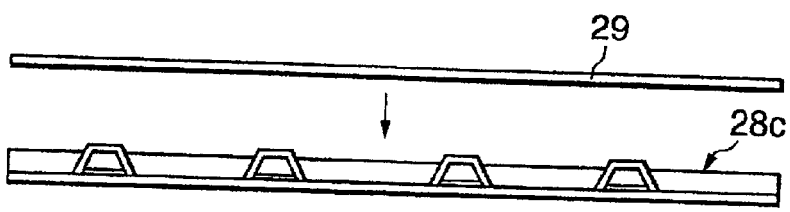
FIGS. 6A and 6B are cross-sectional views showing example manufacturing steps for an example according to a fifth embodiment.

Subsequently, as shown in FIG. 6A, in step (H), a silver foil 28 is coated on the entire face of the multilayer body 29. The silver foil 29 is, for example, a metal layer for forming conductor circuits, and is preferably formed so as to have a thickness ranging, for example, from 17 $\mu$m to 19 $\mu$m.

Step (I)

Then, the layers are thermally press-bonded using an overlaying press. Thereafter, resist films are selectively formed on the silver foil 29 and the metal layer 23. Then, etching is carried out for the individual silver foil 29 and metal layer 23 by using the resist films as masks, thereby forming conductor circuits 31 and 32. According to the processing described above, the wiring circuit substrate 33a of the fourth embodiment is produced.

In the described first embodiment, the resist films 24 are used as masks when etching is selectively performed for the copper foil 21 and the protrusions 25 are thereby formed. In the fourth embodiment, however, the solder-plated layers 37 are instead used.

In addition, the solder-plated layers 37 are not removed and are allowed to remain; and before the interlayer-insulating layer 27 made of the insulating sheet is formed, the condition is arranged such that the protrusions 25 are covered by the solder-plated layers 37 according to the solder-reflow processing.

Accordingly, the fourth embodiment does not require application of the conductive paste 26 onto the top (upper portion) of each of the protrusions 25, while the application is required in the first embodiment.

(Fifth Embodiment)

Hereinbelow, a description will be given of a fifth embodiment according to the present invention with reference to FIGS. 7A to 7H and 8A to 8C. The fifth embodiment includes configurations and processing steps that are substantially common to those in the first embodiment.

FIGS. 7A to 7H and 8A to 8C are cross-sectional views showing a manufacturing method for a wiring circuit substrate according to the fifth embodiment in the order manufacturing steps.

Step (A)

Figure 7A:
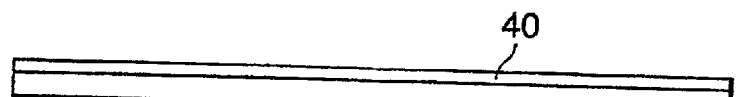
FIGS. 7A to 7H are cross-sectional views showing example manufacturing steps for an example wiring circuit substrate according to the present invention.

First of all, a base metal 21a is first prepared. base metal 21a is preferably formed of a copper material for example. Also, the base metal 21a is used to form protrusions. The copper foil 21 is preferably formed to have a thickness, for example, ranging from 0 to 150 $\mu$m. On one face of the base metal 21a, a photosensitive resin film 40 is coated, as shown in FIG. 7A.

Step (B)

Figure 7B:

Subsequently, as shown in FIG. 7B, openings 41 are formed in the photosensitive resin film 40. The opening 41 are formed so as to oppose the position where protrusions 25 will be formed at a later step.

Step (C)

Figure 7C:
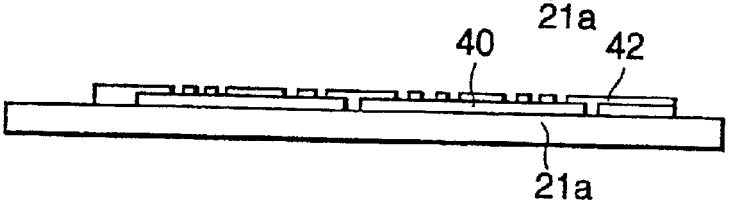

Subsequently, as shown in FIG. 7C, a wiring film 42 formed on the surface of the base metal 21a where the photosensitive resin film 40 is formed. The wiring film is preferably formed of, for example, a copper material. An example forming procedure for the wiring film 42 is described below.

First, for example, a thin conductive layer made of Ni—P material is formed according to an electroless plating method. On the surface of the conductive layer, a resist film having a pattern negative to a wiring film 42 that will be formed is formed. Using the resist film as a mask for example, copper-electrolytic plating is performed, and the wiring film 42 is thereby formed. Thereafter, the wiring film 42 is used as a mask, and the conductive layer is removed to prevent short-circuiting between the wiring films 42.

Step (D)

Figure 7D:
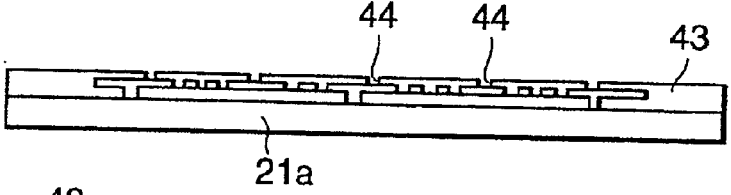

Subsequently, a photosensitive resin film 43 is coated on the surface of the base metal 21a where the wiring 42 is formed. Thereafter, the photosensitive resin film 43 is subjected to exposure and development. Thereby, openings 44 for forming terminals are formed. FIG. 7D shows a state where the openings 44 are formed.

Step (E)

Figure 7E:
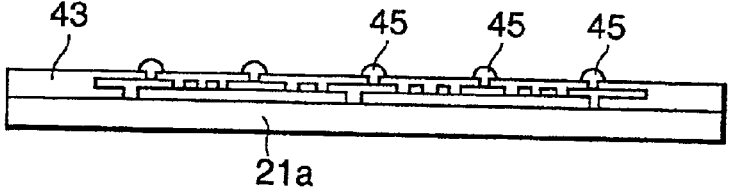

Subsequently, as shown in FIG. 7E, protrusion-like microballs 45 are formed on the openings 44 according for example, an electrolytic plating method.

Step (F)

Figure 7F:
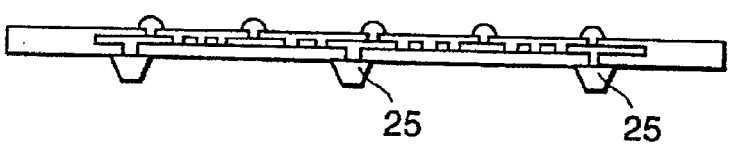

Subsequently, as shown in FIG. 7F, the protrusions are formed in the same method as in the individual embodiments described above.

Step (G)

Figure 7G:
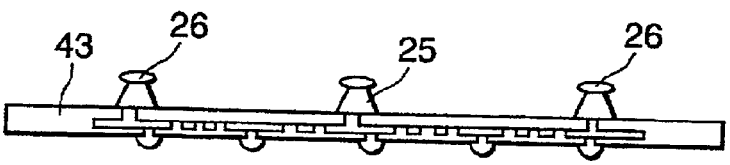

Subsequently, as shown in FIG. 7G, conductive paste 26 is applied on the top of each of the protrusions 25 in the same method as in the described first embodiment.

Step (H)

Figure 7H:
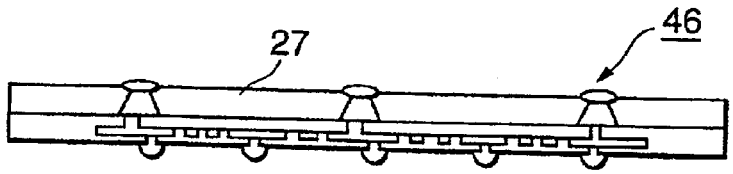

Subsequently, as shown in FIG. 7H, an interlayer-insulating layer 27 made of an insulating sheet is formed in the same method as in the described first embodiment. The wiring substrate after the interlayer-insulating layer 27 is formed is assumed to be a substrate 46 for the description purpose.

Step (I)

Subsequently, a plurality, for example, two of the substrates 46 is prepared, each having been produced according to steps (H). Also, the wiring circuit substrate 33 of the first embodiment is prepared.

Figure 8A:
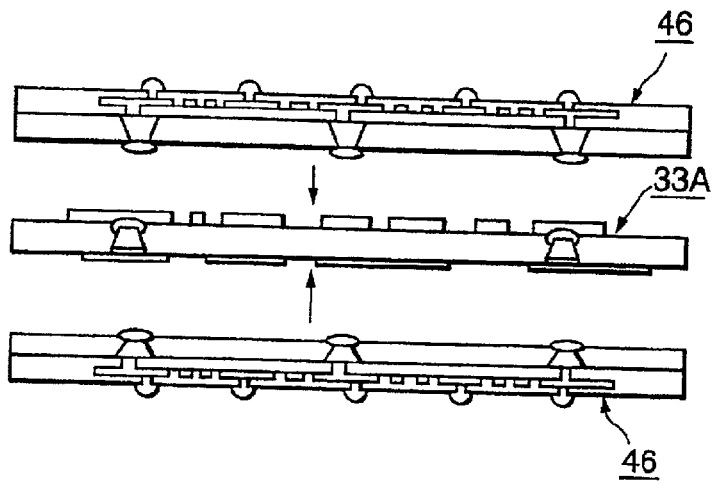
FIGS. 8A to 8C are cross-sectional views showing example manufacturing steps for an example wiring circuit substrate according to the present invention.

Then, as shown in FIG. 8A, the upper substrate 46 positioned on the side of one face of the wiring circuit substrate 33. The one face (upper face) of the wiring circuit substrate 33 and a face of the substrate 46 on which the protrusions 25 and the interlayer-insulating layer 27 are formed are arranged so as to oppose each On the other hand, the lower substrate 46 is positioned on the side of the other face of the wiring circuit substrate 33. The other face (lower face) of wiring circuit substrate 33 and a face of the substrate on which the protrusions 25 and the interlayer-insulating layer 27 are formed are arranged so as to oppose each In this way, a positioning step in the fifth embodiment performed.

Step (J)

Figure 8B:
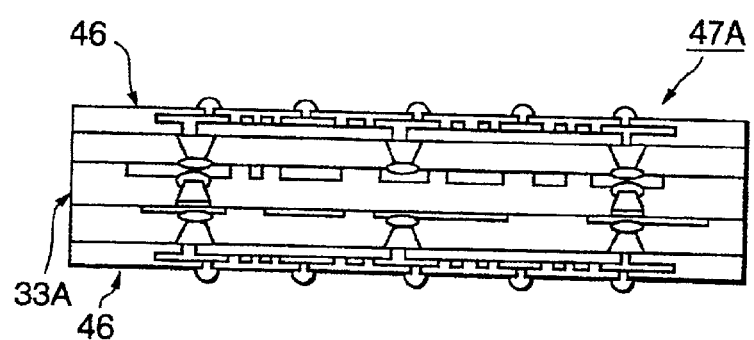

The wiring circuit substrate 33 and the upper and lower substrates 46 sandwiching the wiring circuit substrate 33 are pressure-bonded together. Thereby, as shown in FIG. 8B, a wiring circuit substrate 47 is formed.

Step (K)

Then, as shown in FIG. 8C, a plurality of LSI chips is mounted on one face of the wiring circuit substrate Similarly, a plurality of LSI chips 48 is mounted on the other face of the wiring circuit substrate 47. In this case, the microballs 45 function as connecting means for connecting conductor circuits on the wiring circuit substrate 47 and the LSI chips 48.

According to the described wiring circuit substrate the LSI chips 48 having a very high integration density be mounted.

Figure 8:
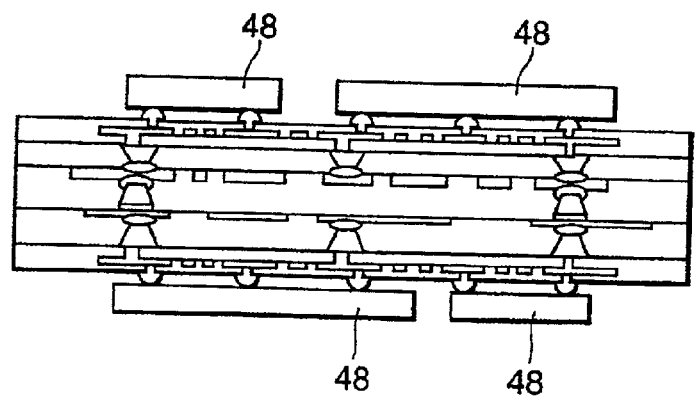

For the embodiment in FIG. 8, various modified examples may be made. First, the described embodiment the wiring circuit substrates 46 that have a single layer of conductor circuits on the face where the protrusion are not formed; however, the number of layers of the conductor circuits formed the wiring circuit substrate not restricted to be single, and it may be two or more The layers to be increased can be easily formed by performing a series of required steps. They are, for example, a step of selectively forming a photosensitive insulating resin layer, a step of a thin conductive layer according to an electroless plating method, a step of forming a resist film having a pattern negative to a formed pattern, a step of forming conductor circuits according to an electrolytic plating method by using the conductive layer as a base and using the resist films as masks, and a step of removing the conductive layer by using the conductor circuits as masks.

Second, in the described present embodiment, the wiring circuit substrates 46 are formed so as to be an integral unit via the wiring circuit substrate 33; however, the configuration is not restricted thereto and may be modified. For example, the wiring circuit substrates 46 may be directly coupled to each other so as to be an integral unit. Alternatively, a configuration may be such that the wiring circuit substrates 46 are overlaid via not only the single wiring circuit substrate, but also a plurality of the wiring circuit substrates. Furthermore, the members to be mounted on the wiring circuit substrate are not restricted to the bare LSI chips 48, and packaged LSI chips may instead be mounted thereon.

(Sixth Embodiment)

Hereinbelow, a description will be given of a sixth embodiment according to the present invention with reference to FIGS. 9A to 9E. The sixth embodiment includes configurations and processing steps that are substantially common to those in the first embodiment. FIGS. 9A to 9E are cross-sectional views showing a manufacturing method for a wiring circuit substrate according to the sixth embodiment in the order of manufacturing steps.

Step (A)

Figure 9A:
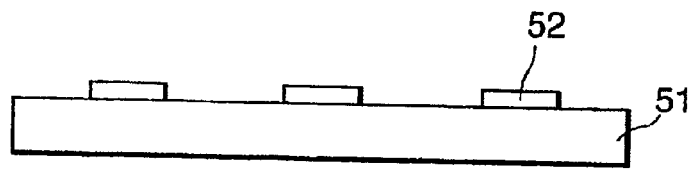
FIGS. 9A to 9E are cross-sectional views showing example manufacturing steps for an example wiring circuit substrate according to the present invention.

First of all, as shown in FIG. 9A, a base member 51 prepared. The base member 51 is in a single-layer structure and is made of, for example, a metal plate such as a copper plate. On one face of the base member 51, resist films 52 are selectively formed.

Step (B)

Figure 9B:
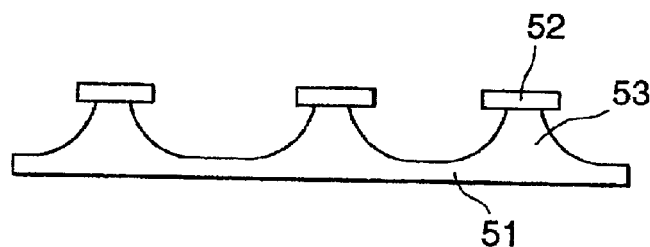

Subsequently, as shown in FIG. 9B, half-etching is performed for the base member 51 by using resist films 52 as masks. By performing half-etching from the surface of the base member 52, protrusions 53 are formed, which work for connecting upper and lower conductors to each other. The half-etching refers to etching for the surface excluding portions that will be used as circuit-layer portions; it does not refer to etching to be performed up to half the thickness of the base member 52. In other words, the half-etching refers to etching to be performed for partial areas.

Step (C)

Figure 9C:
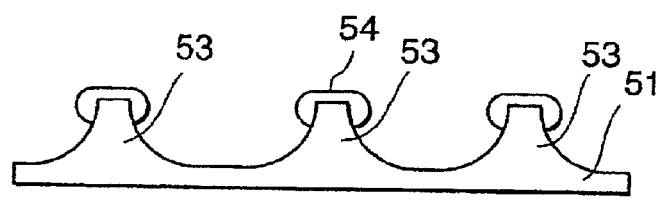

Subsequently, as shown in FIG. 9C, in step (C), a metal film 54 is appropriately coated on the top of each of protrusions 53. The metal film 54 improves connection characteristics and reliability thereof. The metal film 54 is preferably formed of, for example, conductive paste, solder, a noble metal such as gold, or an anisotropic conductive film. Forming the metal film 54 allows connection characteristics and reliability to be improved; however, the metal film 54 is not mandatory.

Step (D)

Figure 9D:
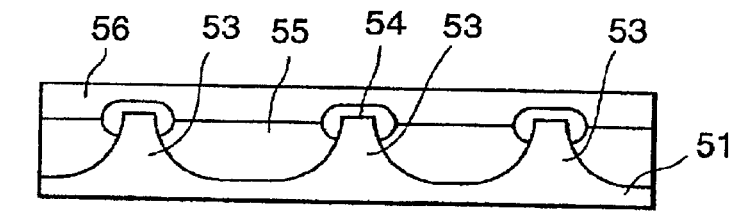

Subsequently, as shown in FIG. 9D, a metal foil 56 made of, for example, a copper material, is overlaid on one face of the base member 51 via an interlayer-insulating layer 55.

Step (E)

Figure 9E:
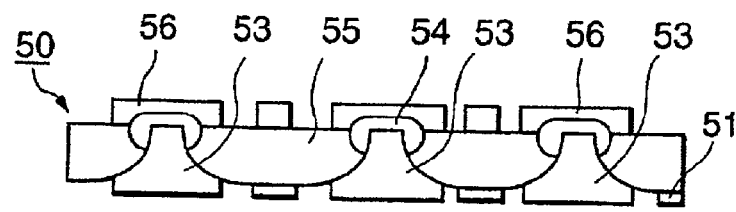

Subsequently, as shown in FIG. 9E, etching is selectively performed for the other face of the base member 51 and the face of the metal foil 56, thereby forming conductor circuits of the individual two faces. In this way, a wiring circuit substrate that is substantially the same as that in FIG. 2D is produced. Therefore, the wiring circuit substrate may be used by making modifications as the wiring circuit substrate 36 of the embodiment shown in FIG. 4C, the wiring circuit substrate 47 shown in FIG. 8B, or the wiring circuit substrates 33, or the like.

That is, for portions where the wiring circuit substrate 33 is used, the wiring circuit substrate of the present embodiment is completely modified thereto, and it can thereby be used.

Also, the wiring circuit substrate in the state before the metal foil 56 made of, for example, a copper material, is formed can be used by modifying it to the wiring circuit substrates 28 shown in FIG. 4, the wiring circuit substrates 46 shown in FIGS. 8A and 8B, or the like. Furthermore, similarly to the wiring circuit substrates 46 shown in FIG. 8, the wiring circuit substrate in the state before the metal foil 56 is formed can be used as a multilayer wiring substrate, thereby allowing the integration density to be increased.

In the described manufacturing method for the wiring circuit substrate, a base member in a multilayer structure having an etching-barrier layer need not be used. In addition, since a step for removing the etching-barrier layer is not required, the manufacturing cost for the wiring circuit substrate can be reduced.

After the protrusions 53 are formed, a tip surface of each of the protrusions 53 may be formed in a rough pattern so that many needle-shaped prickles are formed thereon, thereby allowing improvement in characteristics of connection with the conductor circuits made of the metal foil 56. The rough preparation for the tip can be implemented according to processing such as spray etching or CZ processing. Alternatively, a particle-copper plating method can be used for the rough preparation.

In addition, electrolytic chromate processing may be performed for the entire copper surface and the protrusions 53 to form an electrolytic chromate film. This improves antioxidation characteristics of the protrusions 53 and the copper surface, thereby allowing prevention of deterioration in quality of the copper surface due to oxidation.

Each of the protrusions 53 for connecting upper and lower conductors of the wiring circuit substrate shown in FIG. 9 has the shape of a konide; however, the configuration of the present invention is not restricted thereto and allows other types.

Figure 10A:
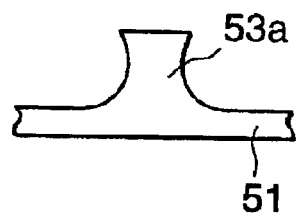
FIGS. 10A and 10B are cross-sectional views individually showing different example protrusions of an example wiring circuit substrate according to the present invention.

For example, as shown in FIG. 10A, protrusions 53a in the shape of a drum may be formed. The protrusions 53a can be obtained by modification in etching conditions. Since the top of the protrusion 53a is wide, soldering and conductive-paste processing can be easily performed. In addition, the protrusions 53a have advantages in that characteristics of connection to the conductor circuit can be easily improved.

Figure 10B:
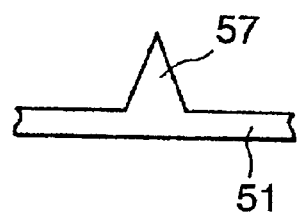

Alternatively, as shown in FIG. 10B, spear-like protrusions 57 may be formed. The spear-like protrusions 57 have a sharp point, thereby improving characteristics of passing through the interlayer-insulating layer 55. Particularly, characteristics of passing through a prepreg containing glass cloth can be improved.

In addition, it is easily engaged with the conductor circuit, thereby improving the characteristics of connection to the conductor circuit.

The spear-like protrusions 57 can be formed by performing etching using a resist mask having the diameter that is smaller than that of the protrusion that will be formed. Alternatively, konide-like (or drum-like) protrusions are first formed by performing selective etching (half-etching) with resist films or the like as masks; and thereafter, the masks are removed, then etching (half-etching) is performed again, thereby allowing the spear-like protrusion 57 to be formed.

(Seventh Embodiment)

Hereinbelow, a description will be given of a seventh embodiment according to the present invention with reference to FIG. 11. The seventh embodiment includes configurations and processing steps that are substantially common to those in the first embodiment.

Figure 11:
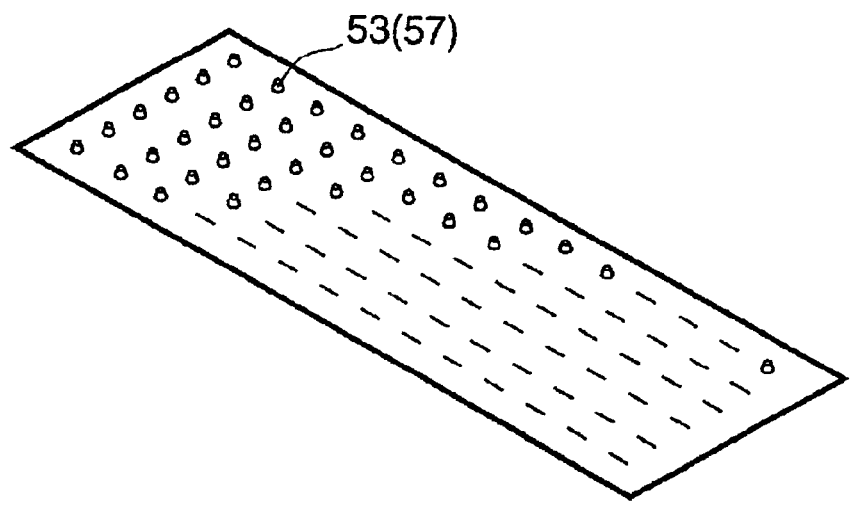
FIG. 11 is a perspective view of a main portion of an embodiment wherein protrusions of a wiring circuit substrate of the present invention are arranged at individual cross sections in a matrix.

FIG. 11 is a perspective view of a wiring circuit substrate according to the seventh embodiment. In the configuration shown in FIG. 11, protrusions 53 (or, protrusion 57 or 25; for the protrusions 25, refer to FIGS. 1 to 8) the wiring circuit substrate of the seventh embodiment are arranged at cross sections of a matrix.

In the seventh embodiment, the protrusions 53 are arranged at cross sections of a matrix, which is made of vertical and horizontal lines (conceptual lines) given at predetermined spaces therebetween. The protrusions to be used in the present embodiment are not restricted to those with the reference number 53, one of other types of protrusions that have different sizes and shapes may be used. The protrusions used in the described embodiments may be arranged in the wiring circuit substrate of the present embodiment.

According to the wiring circuit substrate of the seventh embodiment, conductor circuits having different patterns can be formed depending on the model of the wiring circuit substrate. In specific, at a stage before conductor circuits are formed by performing etching, the wiring circuit substrate having the matrix-type protrusions are mass-produced. Thereafter, conductor circuits of various patterns can be formed depending on the model. Thus, only specific protrusions are used for interlayer connection, and no other protrusions are used. Even in a case where unnecessary protrusions have been formed, they can be removed by performing overetching. The above procedure allows improvement in the productivity of different models of wiring circuit substrates.

(Eighth Embodiment)

Hereinbelow, a description will be given of an eighth embodiment according to the present invention with reference to FIG. 12. The eighth embodiment includes configurations and processing steps that are substantially common to those in the first embodiment.

Figure 12:
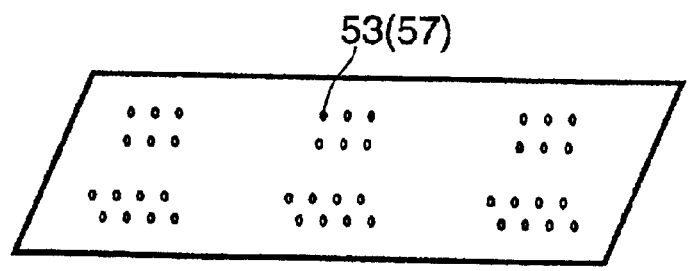
FIG. 12 is a perspective view of an embodiment of an arrangement wherein each protrusion receives a uniformed pressure exerted when an example wiring circuit substrate of the present invention is stacked.

FIG. 12 is a perspective view of a wiring circuit substrate according to the eighth embodiment. As shown in the figure, in the present embodiment, protrusions 53 are formed so that a uniformed pressure is applied to each of the protrusions 53 in overlaying a metal layer 56 via an interlayer-insulating layer 55.

According to this embodiment, the uniformity of the pressure on a face that is applied at the overlaying step can be improved. This improves the uniformity in the collapse degree of the protrusions 53. Also, the present embodiment improves the uniformity in the board thickness of the wiring circuit substrate, thereby allowing the reliability of the wiring circuit substrate to be improved.

(Ninth Embodiment)

Hereinbelow, a description will be given of a ninth embodiment according to the present invention with reference to FIG. 13. The ninth embodiment includes configurations and processing steps that are substantially common to those in the first embodiment.

Figure 13:
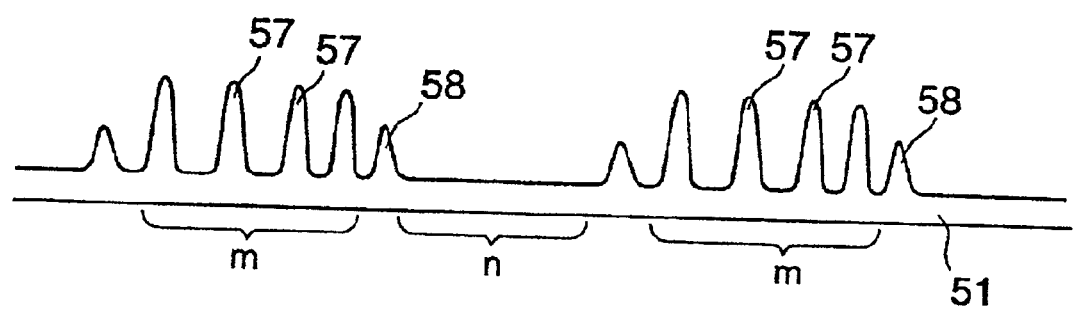
FIG. 13 is a cross-sectional view an embodiment wherein dummy protrusions are provided to uniform etching rates in order to uniform heights and diameters of protrusions for connecting upper and lower conductors of an example wiring circuit substrate according to the present invention.

FIG. 13 is a cross-sectional view of a wiring circuit substrate according to the ninth embodiment. As shown in the figure, in the present embodiment, the density of arrangement of protrusions 57 that connect upper and lower conductors to each other is varied depending on the place. Specifically, the protrusions 57 are arranged to form non-dense areas (n areas) and dense areas (m areas). In addition, around the area where the protrusions 57 are arranged at a high density, dummy protrusions 58 that are lower than the protrusions 57 for connecting upper and lower conductors to each other are arranged. This arrangement allows the uniformity in the diameter and the height to be improved.

More specifically, in the area where the protrusions 57 are formed at a high density, flow of etchant after sprayed differs in peripheral portions and central portions. Accordingly, the etching rate differs in the peripheral portions and the central portions. The etching rate is higher in the peripheral portions of the protrusions where the etchant flows faster than in the central portions. Therefore, the diameter of the protrusion in the peripheral portions tends to be small, and the height thereof also tends to be small.

In view of the above, the ninth embodiment is configured such that the peripheral areas are surrounded by the dummy protrusions 58 that have no direct influence on the circuits (do not configure the circuits). This configuration allows the etching rate to be low for the peripheral protrusions 57 that connect upper and lower conductors to each other. Therefore, even the peripheral protrusions 57 can be made to have the same diameter and height as those of the central protrusions 57.

In addition, it is preferable that the dummy protrusions 58 be formed to have a smaller diameter of a resist portion used for masking than that of other protrusions 57 so that they disappear after etching.

(Tenth Embodiment)

Hereinbelow, a description will be given of a tenth embodiment according to the present invention with reference to FIGS. 14A to 14D. The tenth embodiment includes configurations and processing steps that are substantially common to those in the first embodiment. FIGS. 14A to 14D are plan views individually showing configurations of protrusions of wiring circuit substrates according to the tenth embodiment.

In the above-described ninth embodiment, in a case where the space between the individual protrusions that connect upper and lower conductors to each other is large, the etching rare differs in the peripheral portions and the central portions of the protrusion. In this case, adverse effects are caused due to the difference. In view of the problem, in the tenth embodiment, the dummy protrusions 58 are arranged around the protrusions 57 that connect upper and lower conductors to each other.

Figure 14A:
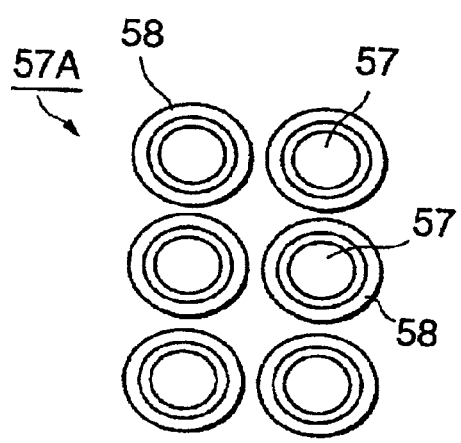
FIGS. 14A to 14D are plan views of individual embodiments wherein dummy protrusions are provided.

In a protrusion 57 in FIG. 14A, dummy protrusions 58 formed as a ring are formed around each of the protrusions 57 that connect upper and lower conductors to each other. In this case, at least, each couple of the adjacent dummy protrusions 58 is formed at a spacing from each other.

Figure 14B:
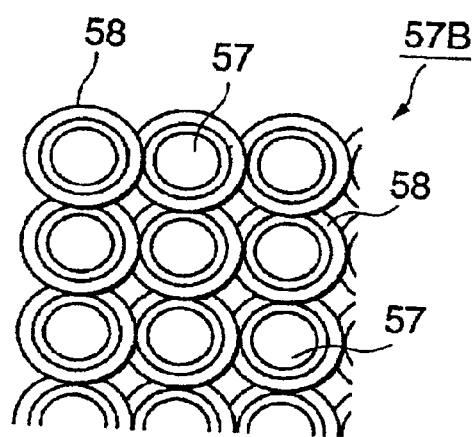

In a protrusion 57 in FIG. 14B, in which ring-like dummy protrusions are arranged are formed similar to the above, but the adjacent dummy protrusions 58 are formed so as to partially overlap with each other.

Figure 14C:
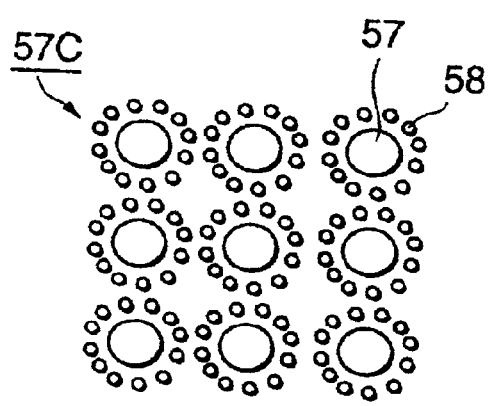

In a protrusion 57C in FIG. 14C, a plurality of ring-like dummy protrusions 58 is formed around each of the protrusions 57 that connect upper and lower conductors to each other. In this case, the plurality of dummy protrusions 58 is formed only on a circular line around each of the protrusions 57.

Figure 14D:
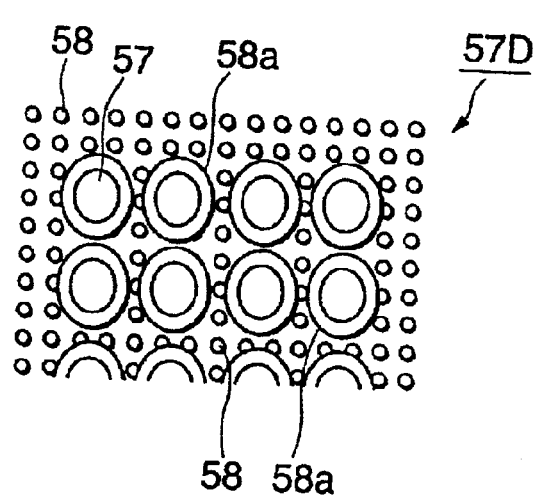

In a protrusion 57D in FIG. 14D, dummy protrusions 58 are formed vertically and horizontally at a predetermined spacing therebetween in the outside area of a circular line 58a around each of the protrusions 57.

(Eleventh Embodiment)

Figure 15:
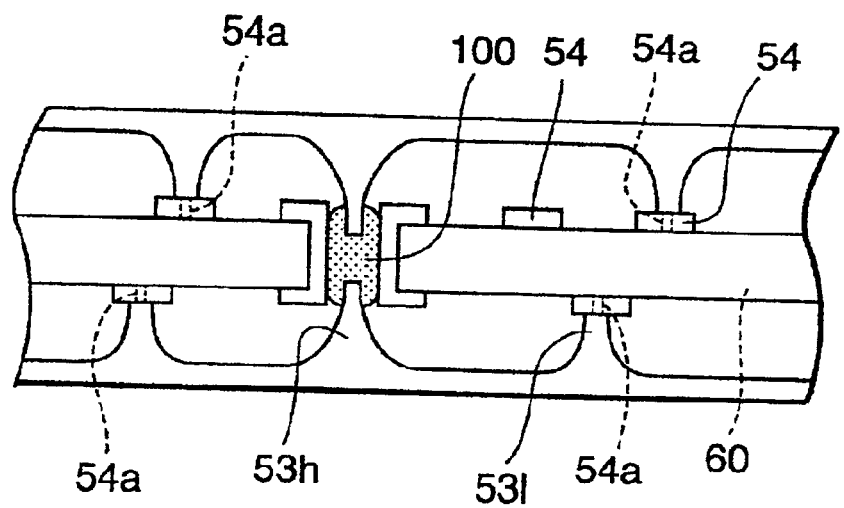
FIG. 15 is a cross-sectional view of an embodiment wherein protrusions individually having different heights of an example wiring circuit substrate of the present invention are arranged so as to correspond to a stepped connection face.

Hereinbelow, a description will be given of an eleventh embodiment according to the present invention with reference to FIG. 15. The eleventh embodiment includes configurations and processing steps that are substantially common to those in the first embodiment. FIG. 15 is a cross-sectional view of a wiring circuit substrate according to the eleventh embodiment.

As shown in FIG. 15, in the wiring circuit substrate of the eleventh embodiment, protrusions 53 for connecting upper and lower conductors to each other are formed including protrusions 53h and 53l that have different heights. These protrusions 53h and 53l, which have different heights, are included to connect the protrusions 53, which connect upper and lower conductors to each other, to stepped connection faces.

In FIG. 15, a core substrate 60 having stepped connection faces is formed. On two faces of the core substrate 60, wiring circuit substrates using the protrusions 53 as means for connecting upper and lower conductors to each other are overlaid. In this case, the high protrusion 53h is connected to the copper paste 100, and the low protrusion 53l is connected to the copper wiring section 54.

The protrusion 53h and the low protrusion 53l, which have different heights, are preferably formed as follows. First of all, mask portions of masks made of resist films used in etching are formed to have different diameters. Then, using the surface of the base member, etching is performed. In specific, a mask portion for covering a portion where the high protrusion 53h will be formed is formed to have a large diameter. On the other hand, a mask portion for masking a portion where the low protrusion 53b will be formed is formed to have a small diameter. The above-described protrusions are thereby formed.

In the wiring circuit substrates shown in FIG. 15, a metal layer (film) is not formed on the copper wiring film 54 of the core substrate 60. The metal layer is supposed to be formed of conductive paste, solder, a noble metal, or the like.

However, the protrusion 53 (57) made of a copper material is directly formed on the copper wiring film 54. Even in this example, the present invention can be effective. This is also applicable either to a configuration having high protrusions 53a and low protrusions 53b or to a configuration having the protrusions 53 (57) that have uniformed heights.

In the configuration in which the each of the copper protrusions 53 (57) is directly connected to each of the copper wiring films 54 without a noble metal layer (film) made of solder, a noble metal, or the like being provided therebetween, as shown by broken lines in FIG. 15, openings 54a each having a diameter smaller than that of the top of each of the protrusions 53 (57) may be formed on the individual copper wiring films 54. The configuration is arranged so that, when the protrusion 53 (57) is connected to the copper wiring film 54, the top of the protrusion 53 (57) abuts the opening 54a and collapses it, thereby allowing the strength of the connection between the protrusion 53 (57) and the metal film 54 to be increased. Of course, forming of the openings 54a is significantly effective in any of the described configurations, that is, either in the configuration having the protrusions 53h and 53l that have different heights, as shown in FIG. 15, or in the configuration having the protrusions 53 that have uniformed heights.

(Twelfth Embodiment)

Hereinbelow, a description will be given of a twelfth embodiment according to the present invention with reference to FIGS. 16A and 16B. The twelfth embodiment includes configurations and processing steps that are substantially common to those in the first embodiment.

Figures 16A, 16B:
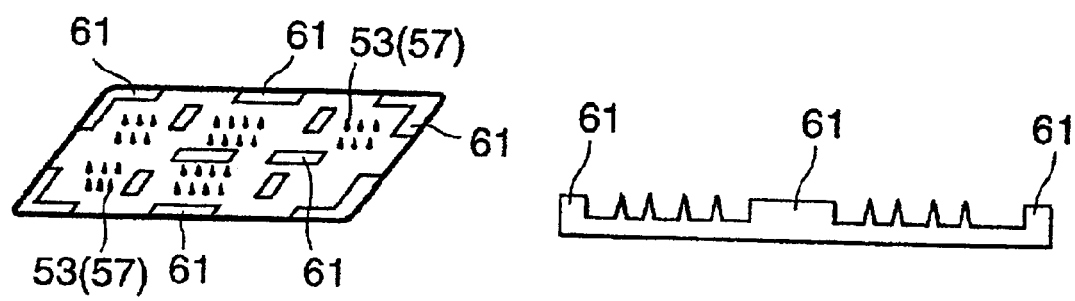
FIG. 16A is a perspective view of an embodiment wherein spacers that are formed of the same material as the protrusions of an example wiring circuit substrate of the present invention and that have the same heights as those thereof.
FIG. 16B is a cross-sectional view of an embodiment wherein spacers that are formed of the same material as the protrusions of an example wiring circuit substrate of the present invention and that have the same heights as those thereof.

FIG. 16A is a perspective view of a wiring circuit substrate according to the twelfth embodiment, and FIG. 16B is a cross-sectional view thereof.

FIGS. 16A (perspective view) and 16B (cross-sectional view) show major portions of the wiring circuit substrate of the present embodiment in a state before conductor circuits are formed. The wiring circuit substrate is arranged such that protrusions for connecting upper and lower conductors to each other are formed; spacers 61 are formed of the same material as that for, for example, the protrusions 57, to have the same height as that of the protrusions in the same step at which the protrusions are formed; and also, a predetermined spacing between conductor circuits formed of a copper base member 51 on the wiring circuit substrate and a core substrate (not shown in FIG. 16) is maintained, and the thickness of an insulating layer is set to a predetermined position; thereby improving impedance-controllability.

Specifically, the protrusions are formed by performing selective etching for the base member 51, and the protrusions thus formed are used for connecting upper and lower conductors to each other. However, generally, an insulating sheet does not have a good characteristic in regard to the thickness tolerance, and also, the finished thickness thereof varies according to temperature and pressure applied at an overlaying step, thereby making it difficult to obtain a uniform thickness of the insulating sheet. Therefore, the spacing between the copper foil overlaid on the insulating sheet and the core substrate is not constant, thereby making impedance control of the wiring circuit substrate to be difficult.

In view of the above problems, the present embodiment is arranged such that the spacers 61 are formed in appropriate portions, and the individual spacers 61 are pressed until they abut the core substrate through a prepreg so as to push out an excessive insulating material to peripheral portions, thereby making the spacing between upper and lower copper patterns to be constant to allow the impedance-controllability to be improved. The spacers 61 may be formed in any pattern, for example, in a matrix or in a frame, unless they become obstacles to forming of the conductor circuits. The spacers 61 can also be used as ground lines for electrostatic shields.

(Thirteenth Embodiment)

Hereinbelow, a description will be given of a thirteenth embodiment according to the present invention with reference to FIG. 17. The thirteenth embodiment includes configurations and processing steps that are substantially common to those in the first embodiment. FIG. 17 is a cross-sectional view showing a protrusion of a wiring circuit substrate according to the thirteenth embodiment.

As shown in FIG. 17, the wiring circuit substrate of the thirteenth embodiment is configured including large-diameter protrusions 53$x$ and small-diameter protrusions 53$y$. A high current is applied to flow in the large-diameter protrusions 53$x$ that connect upper and lower conductors to each other. On the other hand, a low current is applied to flow in the small-diameter protrusions 53$y$ that connect upper and lower conductors to each other.

According to the embodiment described above, either a high current or a low current can be applied to the uniformly small protrusions that connect upper and lower conductors to each other. This prevents a non-negligible voltage drop and heat generation in the high-current-passing protrusions that connect upper and lower conductors to each other. In addition, either a low current or a high current can be applied to flow in the relatively large protrusions (in the uniform size) that connect upper and lower conductors to each other. This arrangement solves a problem possibly arising in that the low-current-passing protrusions exclusively use an unnecessary large area to be an obstacle to improvement in integration density.

(Fourteenth Embodiment)

Hereinbelow, a description will be given of a fourteenth embodiment according to the present invention with reference to FIGS. 18A to 18C. The fourteenth embodiment includes configurations and processing steps that are substantially common to those in the first embodiment.

FIG. 18A is a perspective view showing a configuration of a wiring circuit substrate according to the fourteenth embodiment.

As shown in FIG. 18A, in the same step in which protrusions 53 (57) are formed, alignment marks or identification marks 63 for identification of models or the like are formed.

FIG. 18A shows a stage before a copper foil or the like is formed via an interlayer-insulating layer on the side where the protrusions are formed.

FIG. 18B shows an identification mark 63$a$ (alignment mark pattern) as an example of the identification mark 63. Also, FIG. 18C shows another example identification mark 63$b$ (alignment mark pattern).

In the present embodiment, since the identification marks 63 are formed in the same step at which the protrusions 53 (57) are formed, the identification marks 63 are formed of the same material as that for the protrusions 53 (57) to have the same height as that thereof.

According to the present embodiment described above, since the marks 63 are formed in the same step at which the protrusions 53 (57) are formed, there is an advantage in that a step dedicated to forming the marks 63 is not required. In addition, since the marks 63 are formed in the same step at which the protrusions 53 (57) are formed, the positional deviation between the marks 63 and the individual protrusions can be minimized.

(Fifteenth Embodiment)

Hereinbelow, a description will be given of a fifteenth embodiment according to the present invention with reference to FIGS. 19A to 19D. The fifteenth embodiment includes configurations and processing steps that are substantially common to those in the first embodiment. FIGS. 19A to 19D are cross-sectional views showing a manufacturing method for a wiring circuit substrate according to the fifteenth embodiment in the order of manufacturing steps.

Step (A)

Figure 19A:
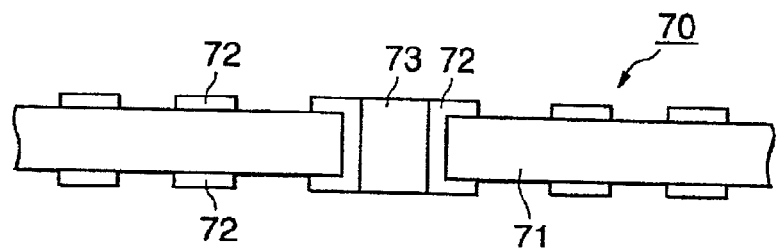
FIGS. 19A to 19D are cross-sectional views showing example manufacturing steps for an example wiring circuit substrate of the present invention.

First of all, as shown in FIG. 19A, a core substrate 70 is prepared. The core substrate 70 is configured including at least one insulating substrate 71, a plurality of conductor circuits 72 formed on two faces of the core substrate 70, and through-holes 73 formed in the insulating substrate 71. Peripheral portions of the through-holes 73 are covered by the conductor circuits 72; that is, the conductor circuit 72 is also formed between the through-hole 73 and the insulating substrate 71.

The insulating substrate 71 is preferably formed of, for example, resin. The conductor circuits 72 are preferably formed of, for example, a copper material. The through-hole 73 functions for connecting conductors formed on one face of the insulating substrate 71 and conductors formed on the other face of the insulating substrate 71.

On the two faces of the core substrate 70 composed as described above, individual wiring circuit substrates including either protrusions 53 or protrusions 57, which will be described below, are overlaid.

Step (B)

Figure 19B:
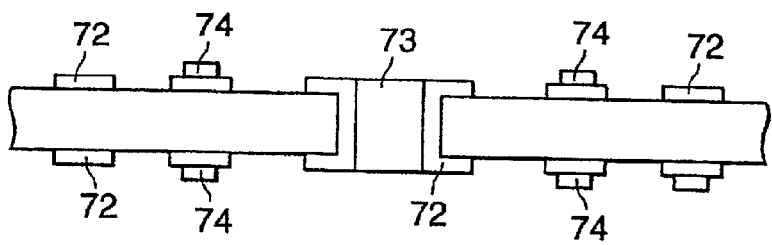

Subsequently, as shown in FIG. 19B, metal layers 74 are formed on the conductor circuits 72 individually corresponding to the protrusions on the wiring circuit substrates that will be overlaid. The metal layers 74 are preferably formed of, for example, conductive paste, solder, and a noble metal.

Step (C)

Figure 19C:
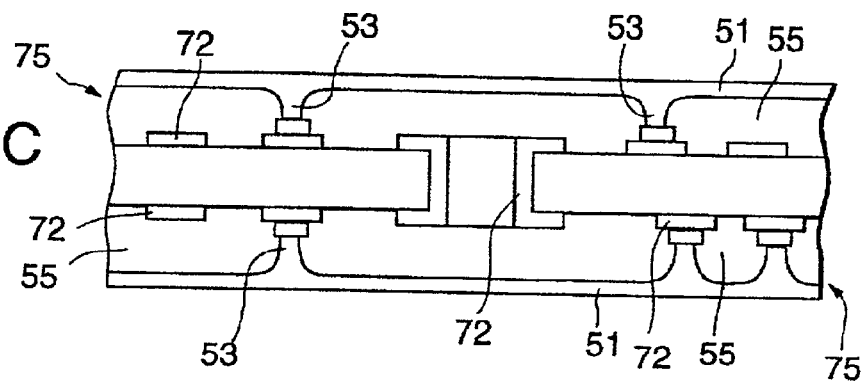

Subsequently, as shown in FIG. 19C, wiring circuit substrates 75 are individually overlaid on two faces of the core substrate 70. Individual protrusions 53 are connected to the metal layers 74 at positions corresponding to the metal layers 74. The protrusions 53 are formed by extending base members 51. An interlayer-insulating layer 55 is formed between one face of the insulating substrate 71 and the base member 51 of one of the wiring circuit substrates 75. Also, an interlayer-insulating layer 55 is formed between the other face of the insulating substrate 71 and the base member 51 of the other one of the wiring circuit substrates 75.

Step (D)

Figure 19D:
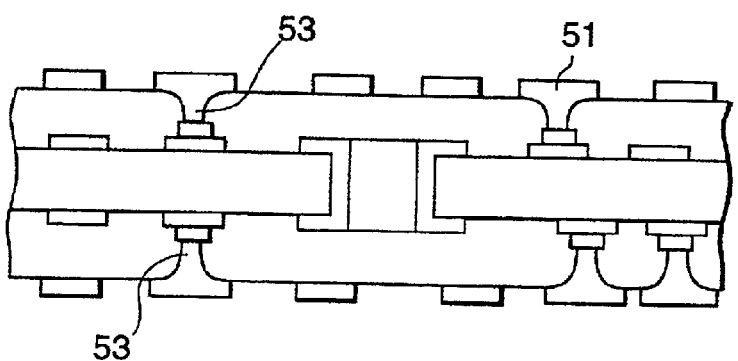

Subsequently, as shown in FIG. 19D, etching is selectively performed for the individual base members 51 on the two faces of the wiring circuit substrates 75. Thereby, patterning is performed to form the conductor circuits. Thus, by arranging the configuration made according to the at least two wiring circuit substrates 75 and the core substrate 70, high circuit integration can be implemented. Furthermore, the reliability of connection between the individual protrusions and the individual conductor circuits is improved, therefore allowing the wiring circuit substrate to be manufactured to have high quality.

The etching step for the base members 51 may be performed prior to the step of overlaying the wiring circuit substrates 75 on the two faces of the core substrate 20.

(Sixteenth Embodiment)

Hereinbelow, a description will be given of a sixteenth embodiment according to the present invention with reference to FIGS. 20A to 20C. The sixteenth embodiment includes configurations and processing steps that are substantially common to those in the first embodiment.

The present embodiment is configured such that, in the described fifteenth embodiment, openings 72$a$ having the diameter larger than that of the top of each of the protrusions 53 are formed in the individual conductor circuits 72 to which the protrusions 53 are connected.

Figure 20A:
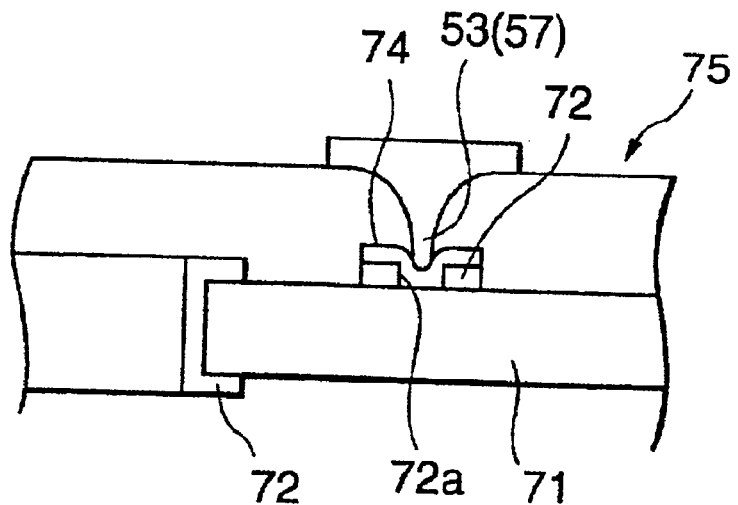
FIG. 20A is a cross-sectional view of an example configuration wherein an opening having a diameter larger than that of the top of each of protrusions is formed in a portion corresponding to the protrusion of a conductor circuit.
Figure 20B:
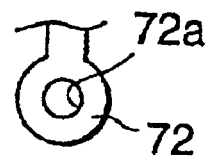
FIG. 20B is a plan view showing the shape of a portion to which a protrusion of a conductor circuit is connected.

FIG. 20A is a cross-sectional view of the embodiment described above. FIG. 20B is a plan view of a configuration of one of the conductor circuits 72 connected to the protrusions 53.

In the present embodiment, as shown in FIG. 20A, the openings 72a are individually formed in the conductor circuits 72.

The conductor circuits 72 are formed on the entire face of, for example, the insulating substrate 71 in the core substrate. The openings 72a are formed in the individual conductor circuits 72 formed on the insulating substrate 71. It is preferable that the openings 72a be formed depending on the size, the shape, the arrangement position, the number, and the like of the protrusions in the individual embodiments described above. For example, a plurality of the openings 72a may be formed in one conductor circuit 72. In addition, the diameters of the individual openings must be larger than the diameter of the protrusions, but may be different from each other. Furthermore, the individual openings are not restricted to be circular, but may be polygonal.

According to the above, the protrusion 53 can be partially inserted into the opening 72a via the metal layer 74. This allows the connection strength between the protrusions 53 and the conductor circuits 72 to be increased. Therefore, the reliability of the connection between the wiring circuit substrates 75 and the core substrate can be further improved.

The metal layers 74 are preferably formed of conductive paste, solder, a noble metal, or the like.

Figure 20C:
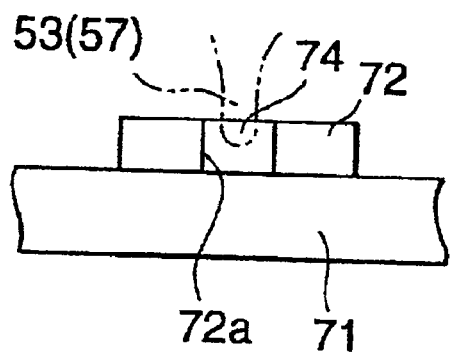
FIG. 20C is a cross-sectional view showing an example state wherein, after one of a conductive-paste layer, a solder layer, and a noble-metal layer is formed, the surface is polished to remove a portion of the layer on a conductor circuit, thereby allowing the conductive paste, the solder, or the noble metal to remain only in an opening.

FIG. 20C is a cross-sectional view of a modified example of the present embodiment. In the figure, first of all, a metal layer 74 is formed on the surface of a conductor circuit 72 and an opening 72a.

After the metal layer 74 is formed, part of the metal layer 74 that protrudes from the surface of the conductor circuit 72 is removed by performing polishing. Thereby, the metal layer 74 can be formed only in the inside of the opening 72a.

In this case, for example, when the wiring circuit substrates 75 are overlaid, they are connected to each other in a condition that each of the protrusions 53 or 57 is inserted into the conductive paste layer, the solder layer, or the metal layer 74 in each of the openings 72a.

(Seventeenth Embodiment)

Hereinbelow, a description will be given of a seventeenth embodiment according to the present invention with reference to FIGS. 21A to 21C. The seventeenth embodiment includes configurations and processing steps that are substantially common to those in the first embodiment.

Figure 21A:
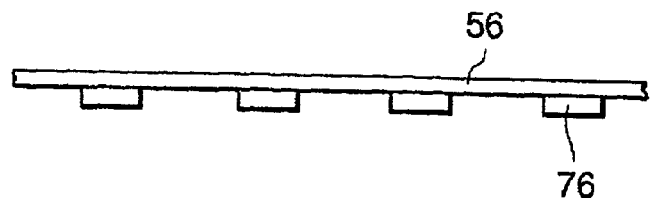
FIGS. 21A to 21C are cross-sectional views of example manufacturing steps of an example wiring circuit substrate according to the present invention.
Figure 21B:
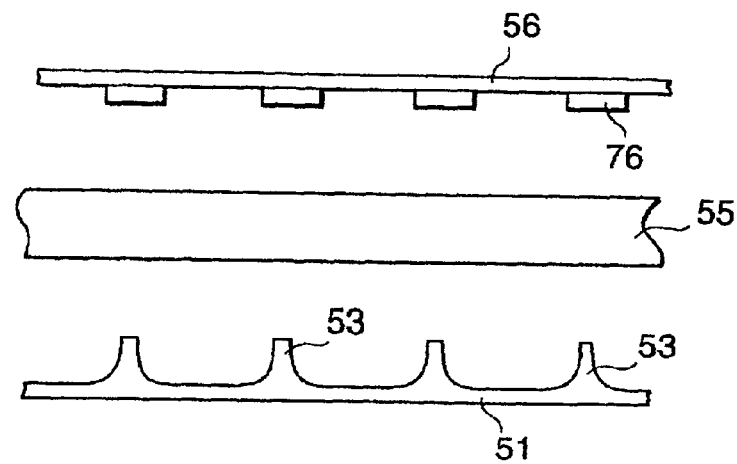
Figure 21C:
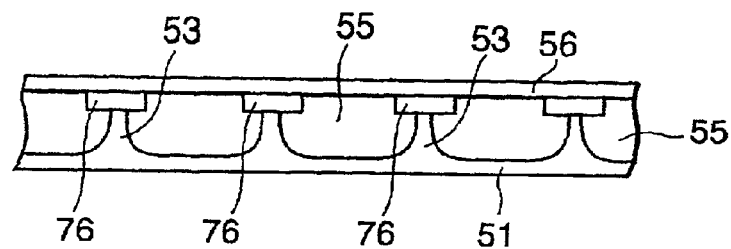

FIGS. 21A to 21C are cross-sectional views showing a manufacturing method for a wiring circuit substrate according to the tenth embodiment in the order of manufacturing steps.

Step (A)

As shown in FIG. 21A, a silver foil 56 is prepared on one side of a wiring circuit substrate that will be connected to protrusions 53 (or, protrusions 57 or the like). A plurality of metal layers 76 is formed in positions corresponding to the protrusions 53 on a face opposing the protrusions 53 of the silver foil 56.

Preferably, the metal layers 76 are members, for example, a conductive-paste layer, a solder layer, and a noble metal (such as gold), that are suitable for securing connection characteristics or improving the connection characteristics.

Step (B)

Subsequently, as shown in FIG. 21B, an interlayer-insulating layer 55 is arranged between the silver foil 56 on which the plurality of metal layers 76 is provided and a base member 51 on which a plurality of protrusions 53 is formed.

Step (C)

Subsequently, as shown in FIG. 21C, the silver foil 56 is overlaid on the base member 51, which has the protrusions 53, via the interlayer-insulating layer 55. At this time, the protrusions 53 pierce the interlayer-insulating layer 55 and are in contact with the metal layers 76.

Subsequently, although it is not shown in the figures, etching is selectively performed for the base member 51 and the silver foil 56 at the same time or at different time, thereby forming conductor circuits on the individual upper and lower faces.

According to the embodiment described above, good characteristics of the connection between the protrusions 53 and the conductor circuits formed of the silver foil 56 can be obtained.

(Eighteenth Embodiment)

Hereinbelow, a description will be given of an eighteen embodiment according to the present invention with reference to FIG. 22. The eighteenth embodiment includes configurations and processing steps that are substantially common to those in the first embodiment.

Figure 22:
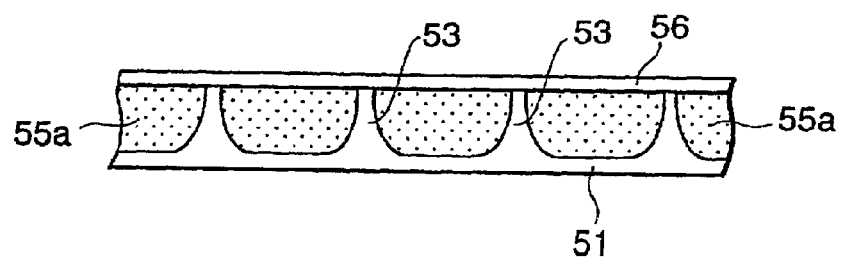
FIG. 22 is a cross-sectional view of an embodiment using an anisotropic conductive film as an interlayer-insulating layer of an example wiring circuit substrate according to the present invention.

FIG. 22 is a cross-sectional view of a wiring circuit substrate of the present embodiment. As shown in FIG. 22, the wiring circuit substrate of the present embodiment uses an anisotropic conductive film 55a as an interlayer-insulating layer 55.

The anisotropic conductive film 55a is formed of dispersed metal particles. According to application of a vertical pressure, conductive particles are forced to fill between each of the protrusions 53 and the silver foil 56. When the conductive particles are pressed, they are inserted into the individual faces, thereby improving the reliability of connection. At this time, the portion sandwiched by each of the protrusions 53 and the interlayer-insulating layer 55 becomes conductive, but other portions retain insulation characteristics.

As described above, characteristics of the connection between the protrusions 53 and the silver foil 56 are secured according to the anisotropic conductive film 55a, and in addition, the insulation characteristics required for the interlayer-insulating layer can be secured.

In the above, the anisotropic conductive film may be formed only on the protrusions 53, and the interlayer-insulating layer may be formed of a standard resin material. In these cases, the protrusions 53 and the silver foil 56 are electrically connected to each other via the anisotropic conductive film, and the insulation is secured via the standard insulating material.

(Nineteenth Embodiment)

Figure 23A:
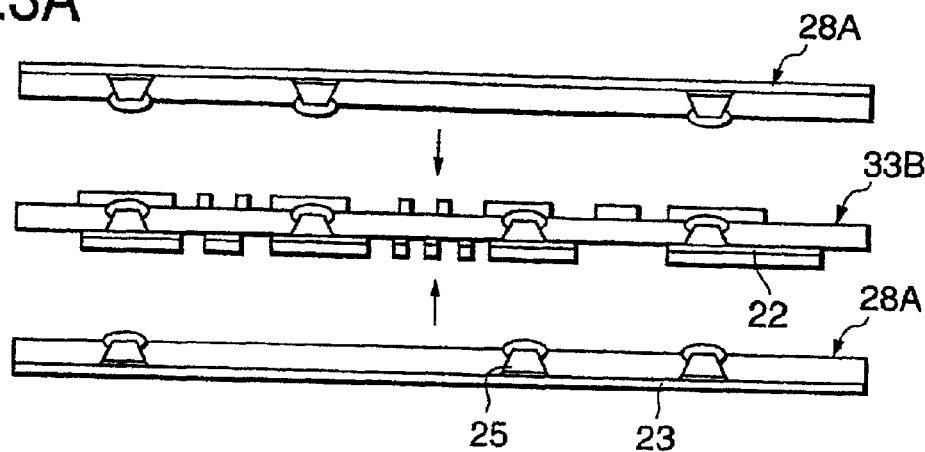
FIGS. 23A to 23C are cross-sectional views of example wiring circuit substrates of the present invention that are to be stacked and/or that are stacked.
Figure 23B:
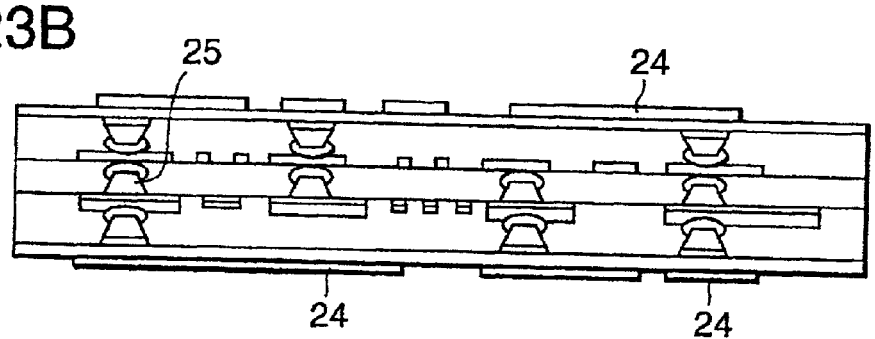
Figure 23C:
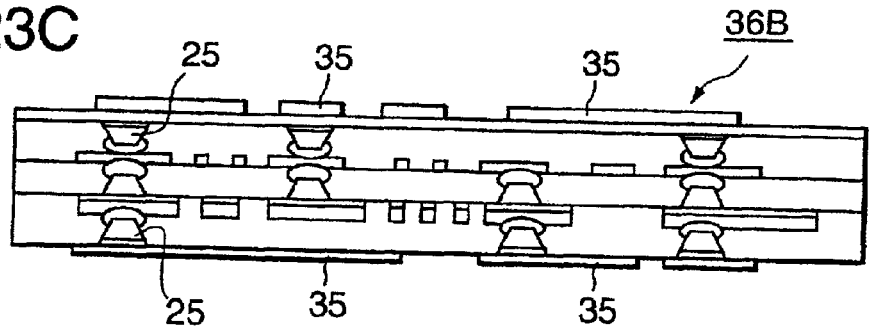

Hereinbelow, a description will be given of a nineteenth embodiment according to the present invention with reference to FIGS. 23A to 23C. The nineteenth embodiment includes configurations and processing steps that are substantially common to those in the individual embodiments described above. For the substantially common configurations and steps, a detailed description will be omitted. FIGS. 23A to 23C are cross-sectional views each showing a multilayer wiring circuit substrate of the present embodiment.

As shown in FIGS. 23A to 23C, a multilayer wiring circuit substrate 36B is formed by overlaying the individual wiring circuit substrates 28A (first and third wiring circuit substrates) shown in FIG. 1G in the described first embodiment, and the wiring circuit substrate 33B (second wiring circuit substrate) shown in FIG. 3F in the described second embodiment. The wiring circuit substrate 33B (second wiring circuit substrate) is overlaid on the wiring circuit substrate 28A (first wiring circuit substrate), and the wiring circuit substrate 28A (third wiring circuit substrate) is overlaid on the wiring circuit substrate 33B (second wiring circuit substrate).

To configure the wiring circuit substrate 36B, the two wiring circuit substrates 28A are preliminarily manufactured according to a manufacturing method similar to that having steps (A) to (G) in the first embodiment. Concurrently, the wiring circuit substrate 33B is preliminarily manufactured according to a manufacturing method similar to that having steps (A) to (F) in the second embodiment.

Subsequently, as shown in FIG. 23A, positioning is carried out by arranging the upper and lower wiring circuit substrates 28A with the wiring circuit substrate 33B being placed therebetween. Then, they are thermally press-bonded to each other by using an overlaying press so as to be a sandwich-like integral unit.

After the above overlaying step, resist films 24 are selectively formed on the upper surface of the upper wiring circuit substrate 28A and the lower surface of the lower wiring circuit substrate 28A. Subsequently, patterning is performed for the individual wiring circuit substrates 28A by performing etching therefor using the resist films 24 as masks, thereby forming conductor circuits 35. According to the above procedure, a plurality of conductor circuits is obtained, and the multilayer wiring circuit substrate 36B is produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher.

(Twentieth Embodiment)

Figure 24A:
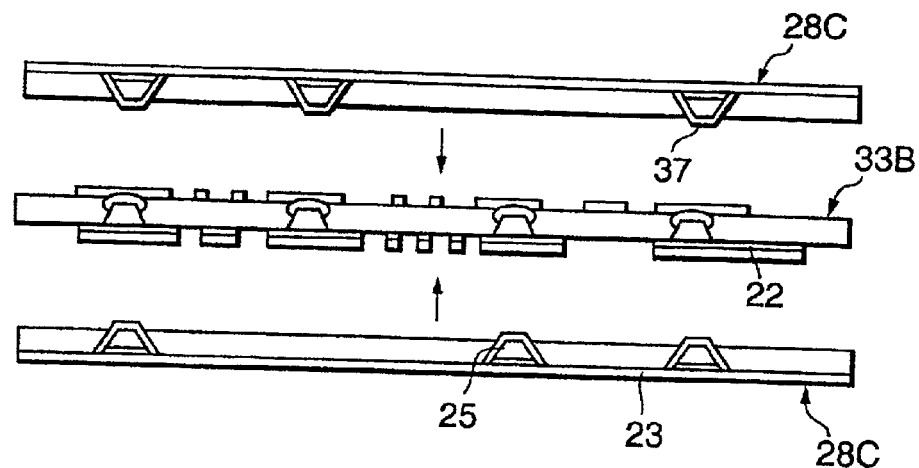
FIGS. 24A to 24C are cross-sectional views of example wiring circuit substrates of the present invention that are to be stacked and/or that are stacked.
Figure 24B:
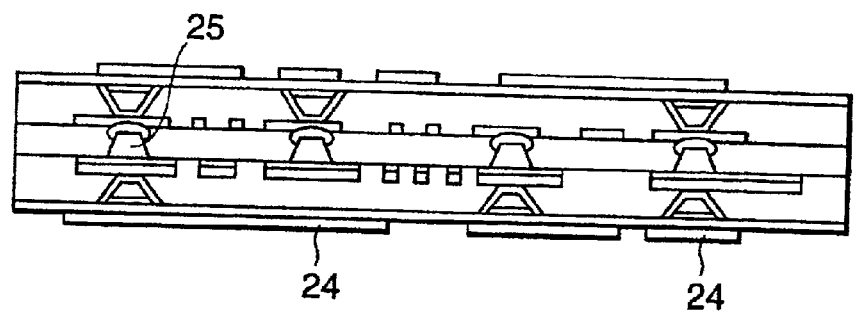
Figure 24C:
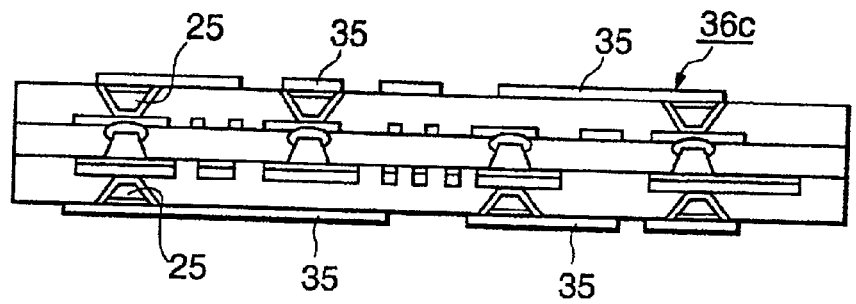

Hereinbelow, a description will be given of a twentieth embodiment according to the present invention with reference to FIGS. 24A to 24C. The twentieth embodiment includes configurations and processing steps that are substantially common to those in the individual embodiments described above. For the substantially common configurations and steps, a detailed description will be omitted. FIGS. 24A to 24C are cross-sectional views each showing a multilayer wiring circuit substrate of the present embodiment.

As shown in FIGS. 24A to 24C, a multilayer wiring circuit substrate 36C is formed by overlaying the individual wiring circuit substrates 28C (first and third wiring circuit substrates) shown in FIG. 6 in the described fourth embodiment, and the wiring circuit substrate 33B (second wiring circuit substrate) shown in FIG. 3F in the described second embodiment. The wiring circuit substrate 33B (second wiring circuit substrate) is overlaid on the wiring circuit substrate 28C (first wiring circuit substrate), and the wiring circuit substrate 28C (third wiring circuit substrate) is overlaid on the wiring circuit substrate 33B (second wiring circuit substrate).

Similarly to the nineteenth embodiment, to configure the wiring circuit substrate 36C, the individual wiring circuit substrates 28C and the wiring circuit substrate 33b are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 36C by using resist films on the individual upper and lower surface as masks. Thereby, a plurality of conductor circuits is obtained, and the multilayer wiring circuit substrate 36C is produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher.

(Twenty-First Embodiment)

Figure 25A:
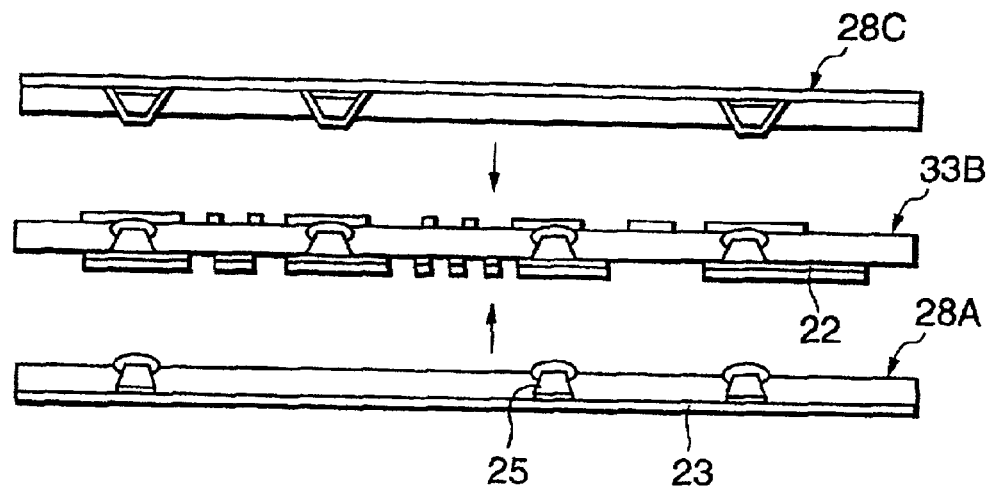
FIGS. 25A to 25C are cross-sectional views of example wiring circuit substrates of the present invention that are to be stacked and/or that are stacked.
Figure 25B:
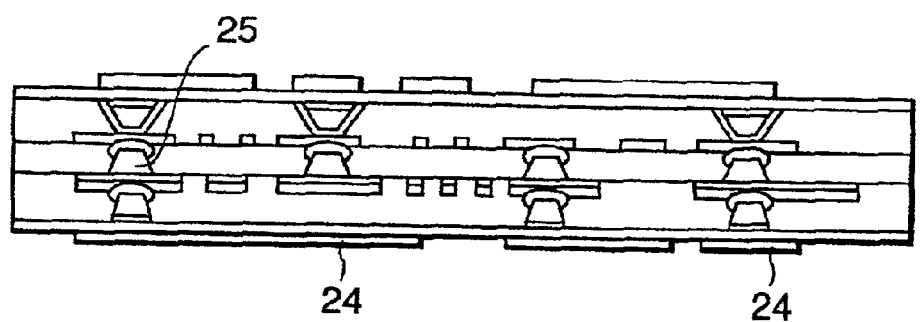
Figure 25C:
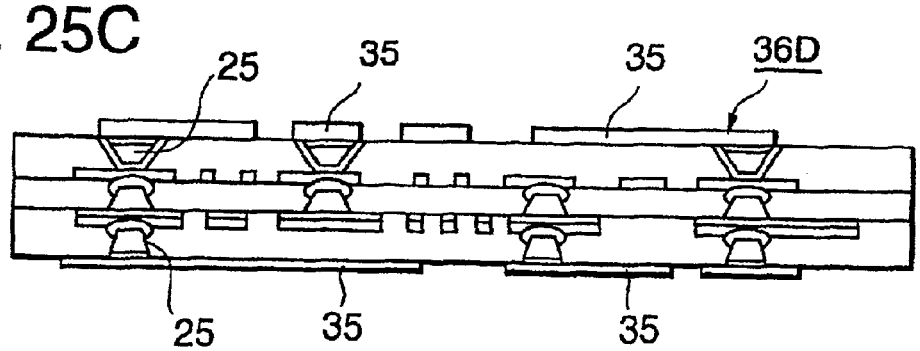

Hereinbelow, a description will be given of a twenty-first embodiment according to the present invention with reference to FIGS. 25A to 25C. The twenty-first embodiment includes configurations and processing steps that are substantially common to those in the individual embodiments described above. For the substantially common configurations and steps, a detailed description will be omitted. FIGS. 25A to 25C are cross-sectional views each showing a multilayer wiring circuit substrate of the present embodiment.

As shown in FIGS. 25A to 25C, a multilayer wiring circuit substrate 36D is formed by overlaying the wiring circuit substrate 28A (first wiring circuit substrate) shown in FIG. 1G in the described first embodiment; the wiring circuit substrate 33B (second wiring circuit substrate) shown in FIG. 3F in the described second embodiment, and the wiring circuit substrate 28C (third wiring circuit substrate) shown in FIG. 6 in the described fourth embodiment. The wiring circuit substrate 33B (second wiring circuit substrate) is overlaid on the wiring circuit substrate 28A (first wiring circuit substrate), and the wiring circuit substrate 28C (third wiring circuit substrate) is overlaid on the wiring circuit substrate 33B (second wiring circuit substrate).

Similarly to the nineteenth embodiment, to configure the wiring circuit substrate 36D, the individual wiring circuit substrates 28A, 33B, and 28C are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 36D by using resist films on the individual upper and lower surface as masks. Thereby, a plurality of conductor circuits is obtained, and the multilayer wiring circuit substrate 36D is produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher.

(Twenty-Second Embodiment)

Figure 26A:
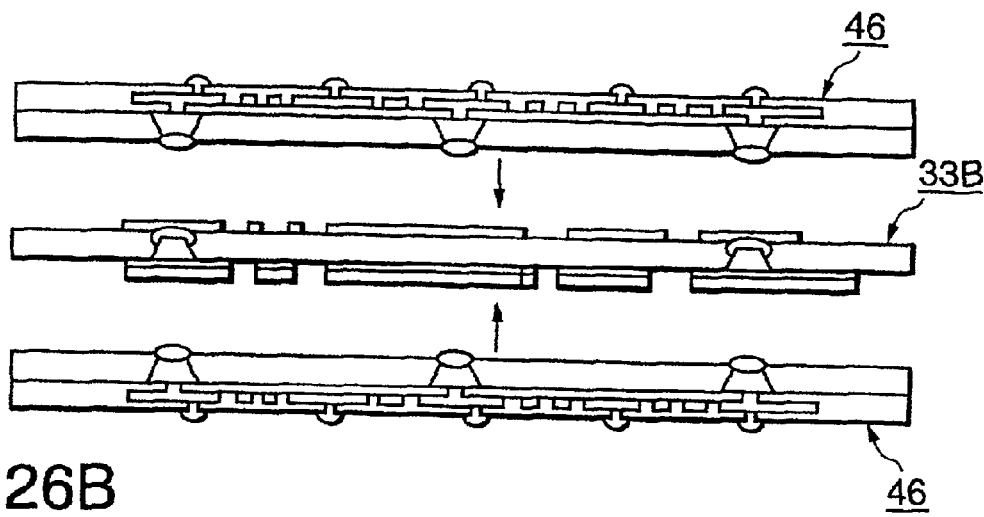
FIGS. 26A to 26C are cross-sectional views of example wiring circuit substrates of the present invention that are to be stacked and/or that are stacked.
Figure 26B:
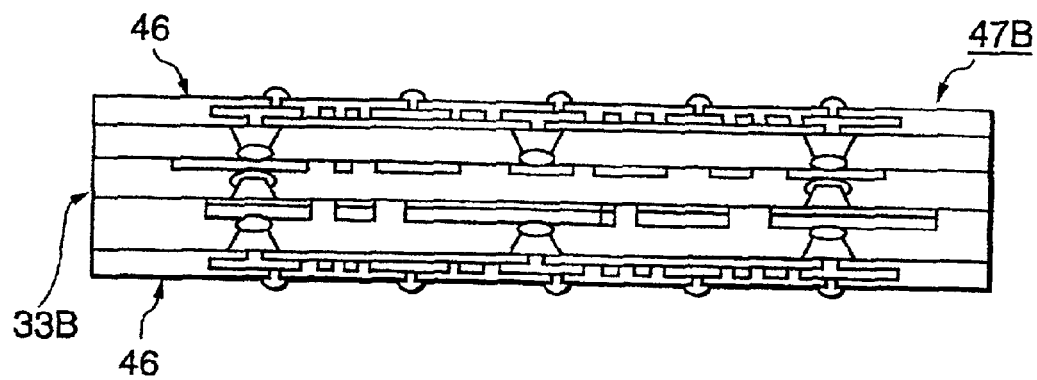
Figure 26C:
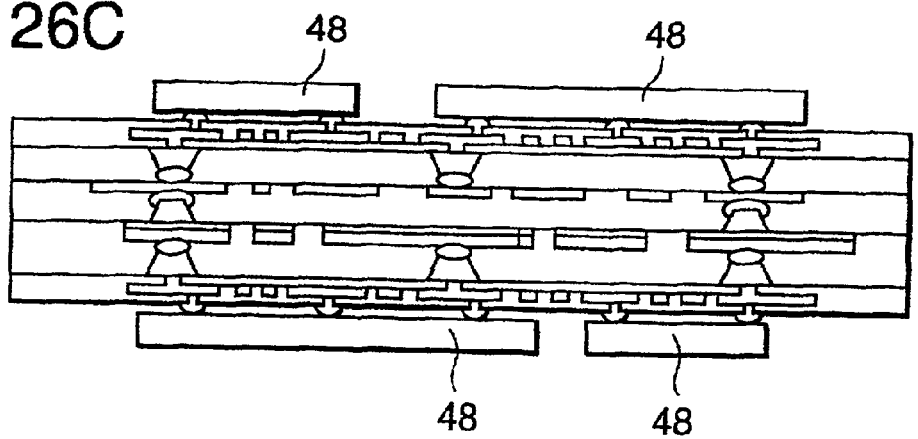

Hereinbelow, a description will be given of a twenty-second embodiment according to the present invention with reference to FIGS. 26A to 26C. The twenty-second embodiment includes configurations and processing steps that are substantially common to those in the individual embodiments described above. For the substantially common configurations and steps, a detailed description will be omitted. FIGS. 26A to 26C are cross-sectional views each showing a multilayer wiring circuit substrate of the present embodiment.

As shown in FIGS. 26A to 26C, a multilayer wiring circuit substrate 47B is formed by overlaying the wiring circuit substrates 46 (first and third wiring circuit substrates) shown in FIG. 7 in the described fifth embodiment, the wiring circuit substrate 33B (second wiring circuit substrate) shown in FIG. 3F in the described second embodiment, and a plurality of LSI chips 48. The wiring circuit substrate 33B (second wiring circuit substrate) is overlaid on the wiring circuit substrate 46 (first wiring circuit substrate), the wiring circuit substrate 46 (third wiring circuit substrate) is overlaid on the wiring circuit substrate 33B (second wiring circuit substrate), and in addition, the plurality of LSI chips 48 is overlaid outside of the wiring circuit substrates 46 (first and third wiring circuit substrates).

Similarly to the nineteenth embodiment, to configure the wiring circuit substrate 47B, the individual wiring circuit substrates 46 and the wiring circuit substrate 33B are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 47B by using resist films on the individual upper and lower surface as masks; thereby, a plurality of conductor circuits is obtained.

In addition, the plurality of LSI chips 48 is mounted from the outside, and the multilayer wiring circuit substrate 47B is thereby produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher, and furthermore, allows the LSI chips having a very high integration density to be mounted.

(Twenty-Third Embodiment)

Figure 27A:
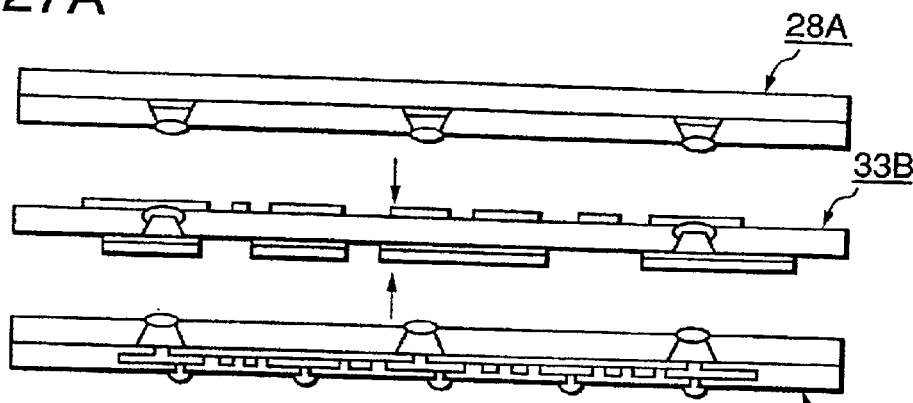
FIGS. 27A to 27C are cross-sectional views of example wiring circuit substrates of the present invention that are to be stacked and/or that are stacked.
Figure 27B:
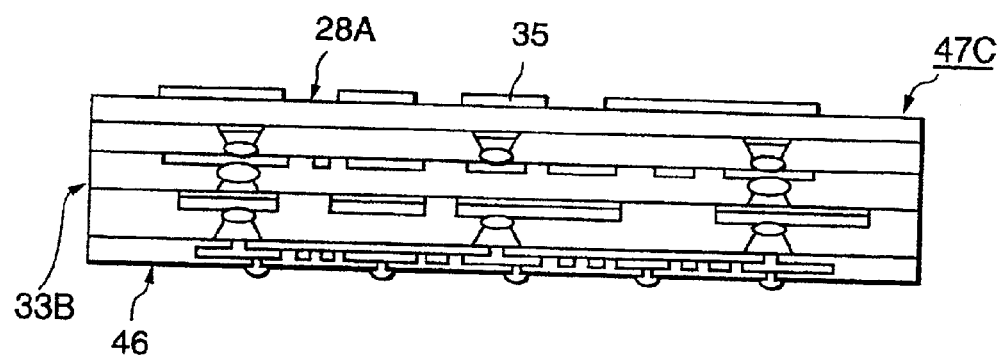
Figure 27C:
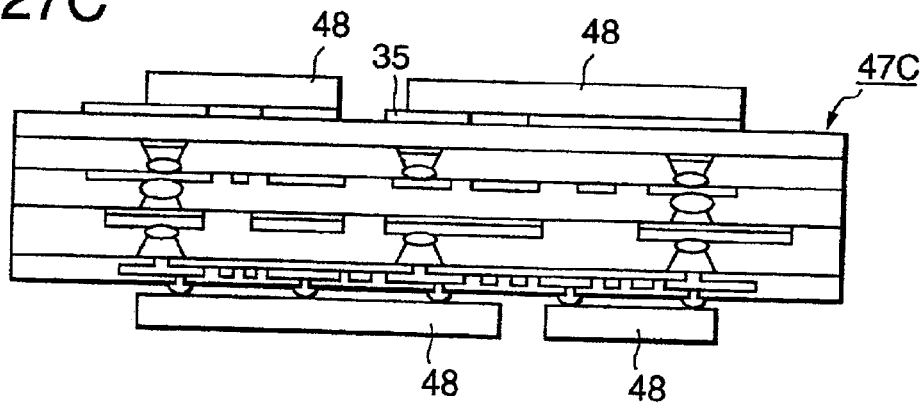

Hereinbelow, a description will be given of a twenty-third embodiment according to the present invention with reference to FIGS. 27A to 27C. The twenty-third embodiment includes configurations and processing steps that are substantially common to those in the individual embodiments described above. For the substantially common configurations and steps, a detailed description will be omitted. FIGS. 27A to 27C are cross-sectional views each showing a multilayer wiring circuit substrate of the present embodiment, As shown in FIGS. 27A to 27C, a multilayer wiring circuit substrate 47C is formed by overlaying the wiring circuit substrate 46 (first wiring circuit substrate) shown in FIG. 7 in the described fifth embodiment, the wiring circuit substrate 33B (second wiring circuit substrate) shown in FIG. 3F in the described second embodiment, the wiring circuit substrate 28A (third wiring circuit substrate) shown in FIG. 1G in the described first embodiment, and a plurality of LSI chips 48. The wiring circuit substrate 33B (second wiring circuit substrate) is overlaid on the wiring circuit substrate 46 (first wiring circuit substrate), the wiring circuit substrate 28A (third wiring circuit substrate) is overlaid on the wiring circuit substrate 33B (second wiring circuit substrate), and in addition, the plurality of LSI chips 48 is overlaid outside of the wiring circuit substrates 28A and 46 (third and first wiring circuit substrates).

Similarly to the nineteenth embodiment, to configure the wiring circuit substrate 47C, the individual wiring circuit substrates 46, 33B, and 28A are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 47C by using resist films on the individual upper and lower surface as masks; thereby, a plurality of conductor circuits is obtained.

In addition, the plurality of LSI chips 48 is mounted from the outside, and the multilayer wiring circuit substrate 47C is thereby produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher, and furthermore, allows the LSI chips having a very high integration density to be mounted.

(Twenty-Fourth Embodiment)

Figure 28:
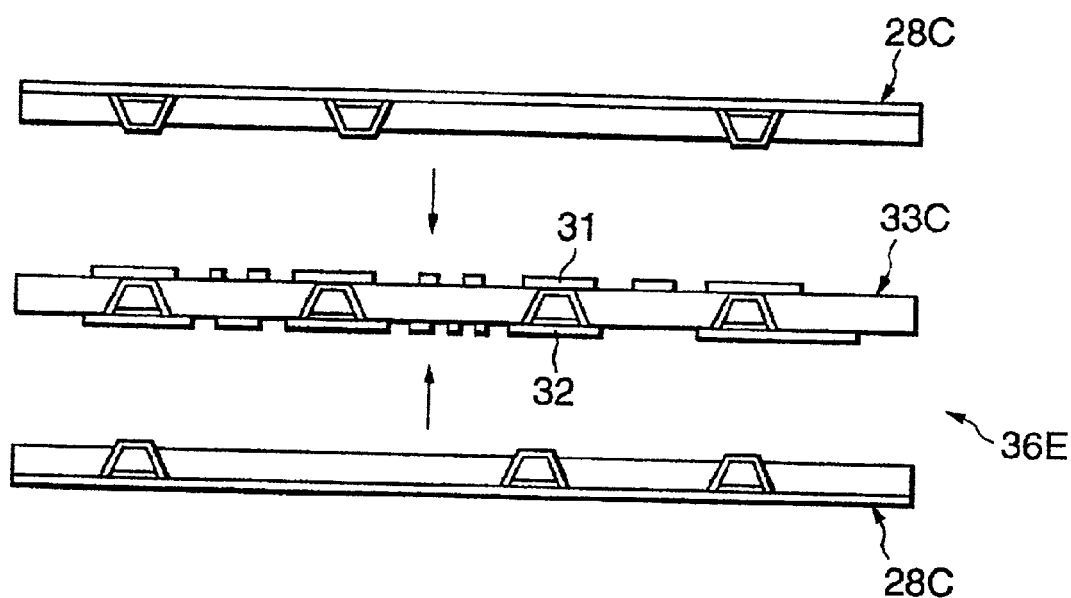
FIG. 28 is a cross-sectional view of an example wiring circuit substrates to be stacked.

Hereinbelow, a description will be given of a twenty-fourth embodiment according to the present invention with reference to FIG. 28. The twenty-fourth embodiment includes configurations and processing steps that are substantially common to those in the individual embodiments described above. For the substantially common configurations and steps, a detailed description will be omitted. FIG. 28 is a cross-sectional view showing a multilayer wiring circuit substrate of the present embodiment.

As shown in FIG. 28, a multilayer wiring circuit substrate 36E is formed by overlaying the wiring circuit substrates 28C (first and third wiring circuit substrates) shown in FIG. 6 in the described fourth embodiment, and the wiring circuit substrate 33C (second wiring circuit substrate) shown in FIG. 6 in the same fourth embodiment. The wiring circuit substrate 33C (second wiring circuit substrate) is overlaid on the wiring circuit substrate 28C (first wiring circuit substrate), and the wiring circuit substrate 28C (third wiring circuit substrate) is overlaid on the wiring circuit substrate 33C (second wiring circuit substrate).

Similarly to the nineteenth embodiment, to configure the wiring circuit substrate 36E, the individual wiring circuit substrates 28C and the wiring circuit substrate 33C are preliminarily manufactured according to a manufacturing method similar to that in the corresponding embodiment. Subsequently, they are thermally press-bonded to each other by using an overlaying press so as to be a sandwich-like integral unit. After the overlaying step, etching is performed for the upper and lower wiring circuit substrates of the wiring circuit substrate 36E by using resist films on the individual upper and lower surface as masks; thereby, a plurality of conductor circuits is obtained, and in addition, the multilayer wiring circuit substrate 36E is produced.

In this way, according to the present embodiment, advantageous effects similar to those in the described embodiment are produced, and concurrently, the multilayer wiring circuit substrate having the plurality of conductor circuits can be obtained. This allows the density of the wiring circuit substrate to be even higher.

(Twenty-Fifth Embodiment)

Figure 29A:
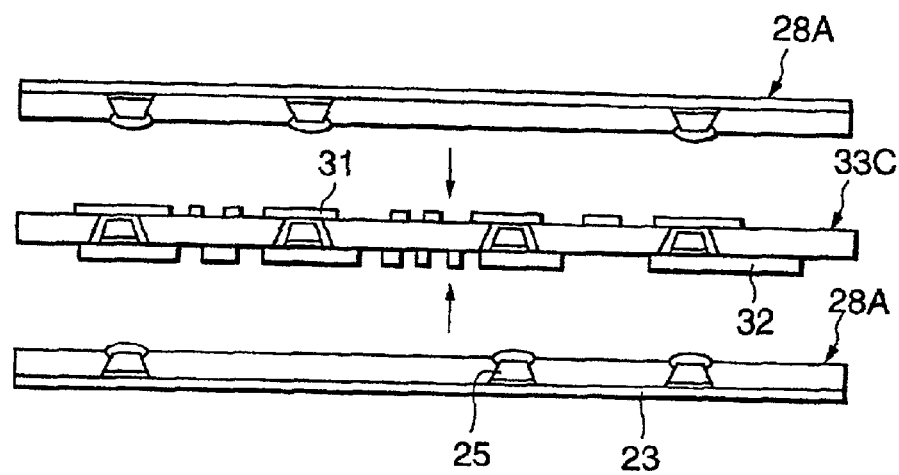
FIGS. 29A to 29C are cross-sectional views of example wiring circuit substrates of the present invention that are to be stacked and/or that are stacked.
Figure 29B:
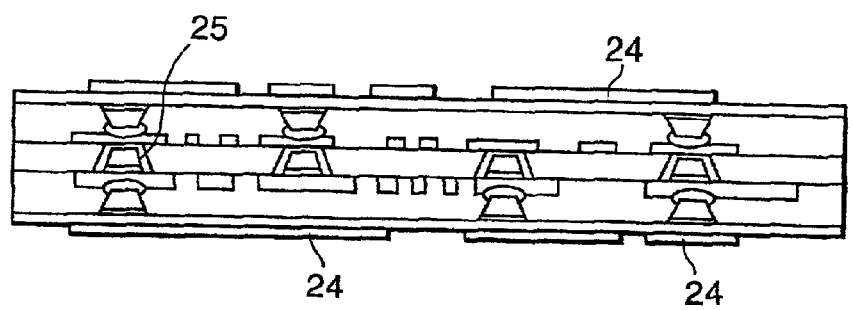
Figure 29C:
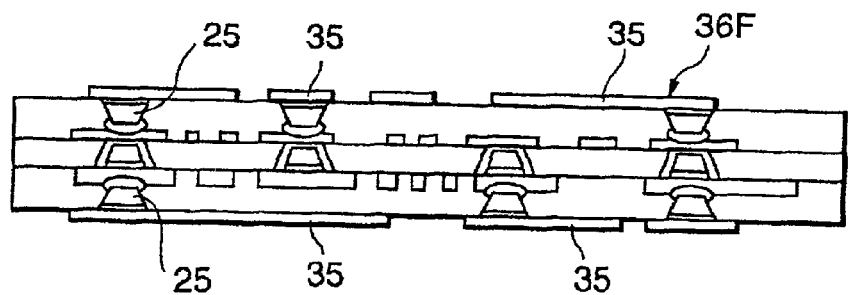

Hereinbelow, a description will be given of a twenty-fifth embodiment according to the present invention with reference to FIGS. 29A to 29C. The twenty-fifth embodiment includes configurations and processing steps that are substantially common to those in the individual embodiments described above. For the substantially common configurations and steps, a detailed description will be omitted. FIGS. 29A to 29C are cross-sectional views each showing a multilayer wiring circuit substrate of the present embodiment.

As shown in FIGS. 29A to 29C, a multilayer wiring circuit substrate 36F is formed by overlaying the wiring circuit substrates 28A (first and third wiring circuit substrates) shown in FIG. 1G in the described first embodiment, and the wiring circuit substrate 33C (second wiring circuit substrate) shown in FIG. 6 in the fourth embodiment. The wiring circuit substrate 33C (second wiring circuit substrate) is overlaid on the wiring circuit substrate 28A (first wiring circuit substrate), and the wiring circuit substrate 28A (third wiring circuit substrate) is overlaid on the wiring circuit substrate 33C (second wiring circuit substrate).

Similarly to the nineteenth embodiment, to configure the wiring circuit substrate 36F, the individual wiring circuit substrates 28A and the wiring circuit substrate 33C are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 36F by using resist films on the individual upper and lower surface as masks; thereby, a plurality of conductor circuits is obtained, and in addition, the multilayer wiring circuit substrate 36F is produced.

In this way, according to the present embodiment, advantageous effects similar to those in the described embodiment are produced, and concurrently, the multilayer wiring circuit substrate having the plurality of conductor circuits can be obtained. This allows the density of the wiring circuit substrate to be even higher.

(Twenty-Sixth Embodiment)

Figure 30A:
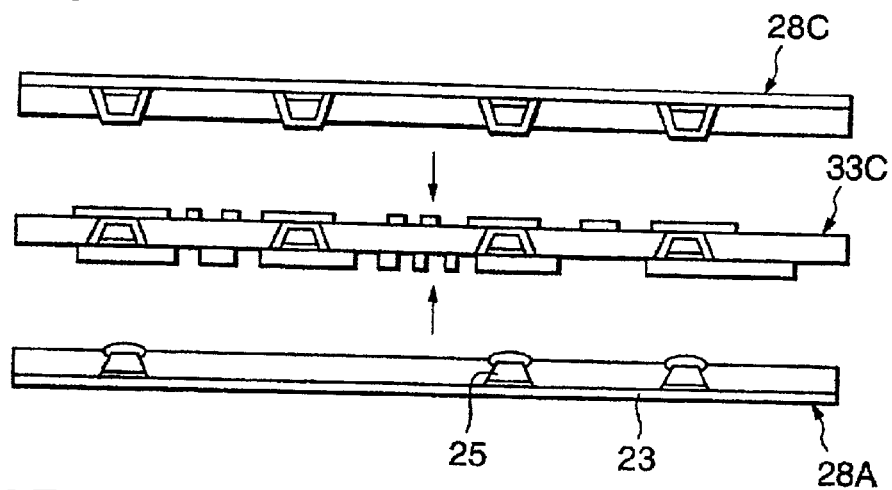
FIGS. 30A to 30C are cross-sectional views of example wiring circuit substrates of the present invention that are to be stacked and/or that are stacked.
Figure 30B:
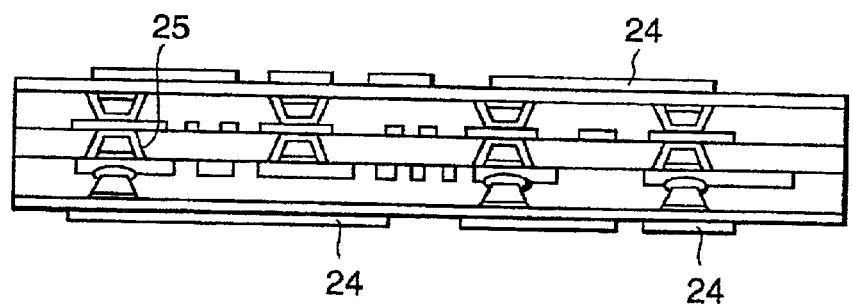
Figure 30C:
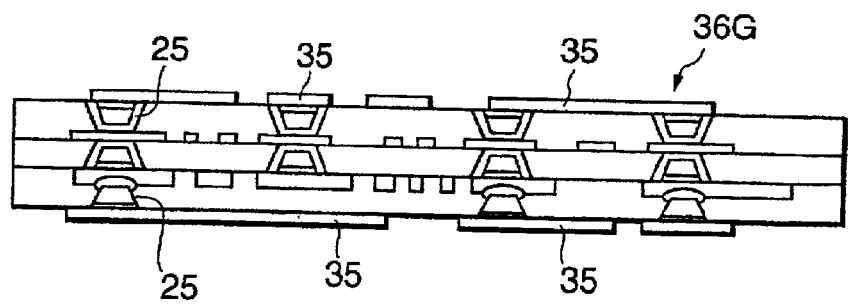

Hereinbelow, a description will be given of a twenty-sixth embodiment according to the present invention with reference to FIGS. 30A to 30C. The twenty-sixth embodiment includes configurations and processing steps that are substantially common to those in the individual embodiments described above. For the substantially common configurations and steps, a detailed description will be omitted. FIGS. 30A to 30C are cross-sectional views each showing a multilayer wiring circuit substrate of the present embodiment.

As shown in FIGS. 30A to 30C, a multilayer wiring circuit substrate 36G is formed by overlaying the wiring circuit substrate 28A (first wiring circuit substrate) shown in FIG. 1G in the described first embodiment; the wiring circuit substrate 33C (second wiring circuit substrate) shown in FIG. 6 in the described fourth embodiment, and the wiring circuit substrate 28C (third wiring circuit substrate) shown in FIG. 6 in the described fourth embodiment. The wiring circuit substrate 33C (second wiring circuit substrate) is overlaid on the wiring circuit substrate 28A (first wiring circuit substrate), and the wiring circuit substrate 28C (third wiring circuit substrate) is overlaid on the wiring circuit substrate 33C (second wiring circuit substrate).

Similarly to the nineteenth embodiment, to configure the wiring circuit substrate 36G, the individual wiring circuit substrates 28A, 33C, and 28C are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 36G by using resist films on the individual upper and lower surface as masks. Thereby, a plurality of conductor circuits is obtained, and the multilayer wiring circuit substrate 36G is produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher.

(Twenty-Seventh Embodiment)

Figure 31A:
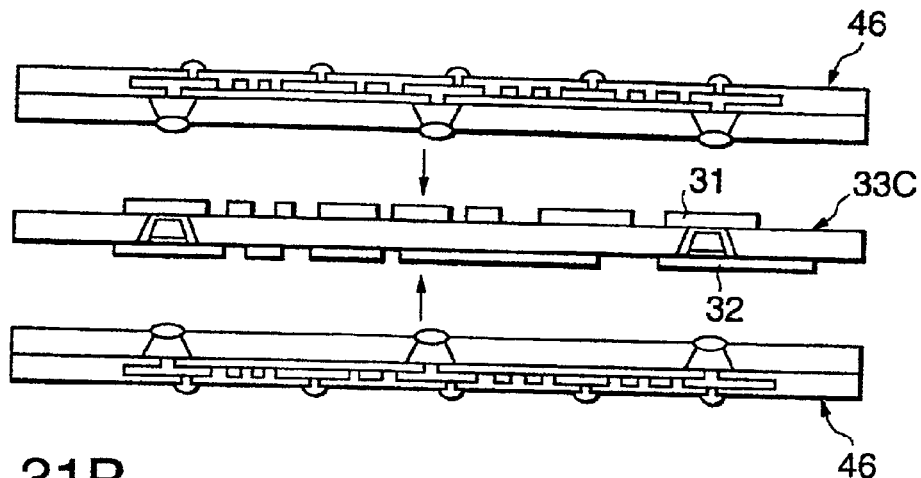
FIGS. 31A to 31C are cross-sectional views of example wiring circuit substrates of the present invention that are to be stacked and/or that are stacked.
Figure 31B:
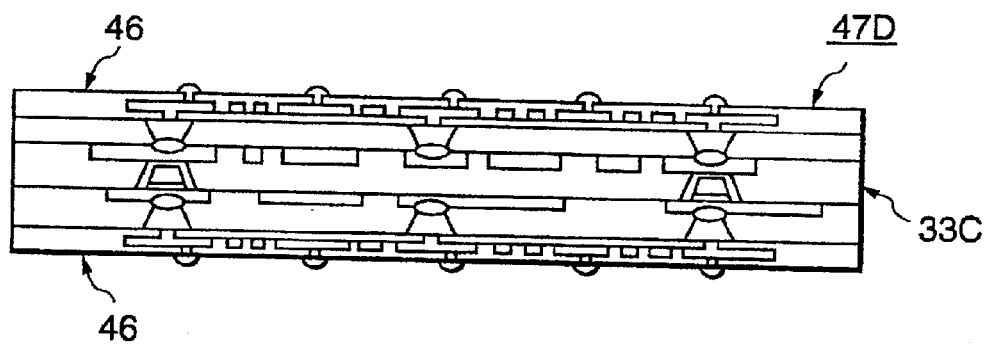
Figure 31C:
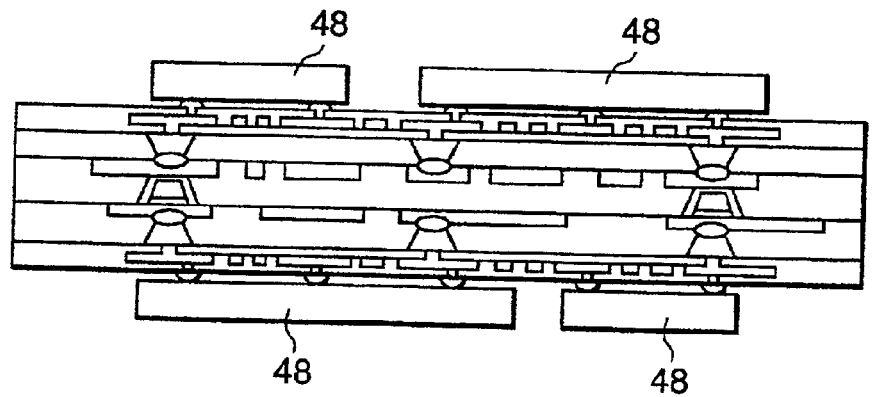

Hereinbelow, a description will be given of a twenty-seventh embodiment according to the present invention with reference to FIGS. 31A to 31C. The twenty-seventh embodiment includes configurations and processing steps that are substantially common to those in the individual embodiments described above. For the substantially common configurations and steps, a detailed description will be omitted. FIGS. 31A to 31C are cross-sectional views each showing a multilayer wiring circuit substrate of the present embodiment.

As shown in FIGS. 31A to 31C, a multilayer wiring circuit substrate 47D is formed by overlaying the wiring circuit substrates 46 (first and third wiring circuit substrates) shown in FIG. 7 in the described fifth embodiment, the wiring circuit substrate 33C (second wiring circuit substrate) shown in FIG. 6 in the described fourth embodiment, and a plurality of LSI chips 48. The wiring circuit substrate 33C (second wiring circuit substrate) is overlaid on the wiring circuit substrate 46 (first wiring circuit substrate), the wiring circuit substrate 46 (third wiring circuit substrate) is overlaid on the wiring circuit substrate 33C (second wiring circuit substrate), and in addition, the plurality of LSI chips 48 is overlaid outside of the wiring circuit substrates 46 (first and third wiring circuit substrates).

Similarly to the nineteenth embodiment, to configure the wiring circuit substrate 47D, the individual wiring circuit substrates 46 and the wiring circuit substrate 33C are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 47D by using resist films on the individual upper and lower surface as masks; thereby, a plurality of conductor circuits is obtained.

In addition, the plurality of LSI chips 48 is mounted from the outside, and the multilayer wiring circuit substrate 47D is thereby produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher, and furthermore, allows the LSI chips having a very high integration density to be mounted.

(Twenty-Eighth Embodiment)

Figure 32A:
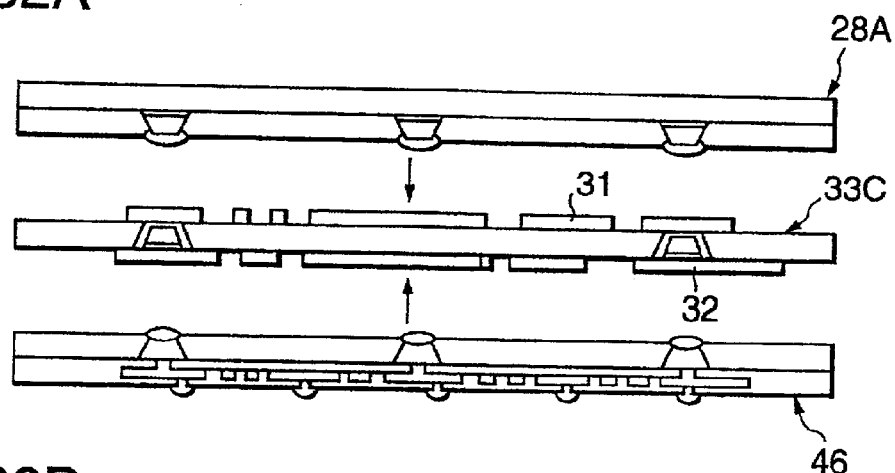
FIGS. 32A to 32C are cross-sectional views of example wiring circuit substrates of the present invention that are to be stacked and/or that are stacked.
Figure 32B:
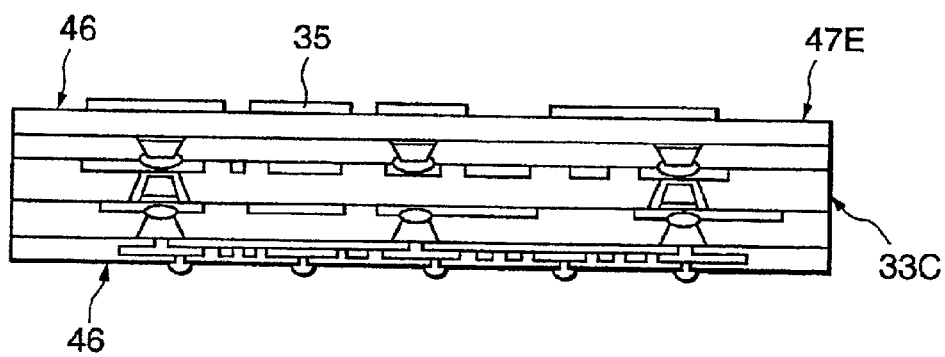
Figure 32C:
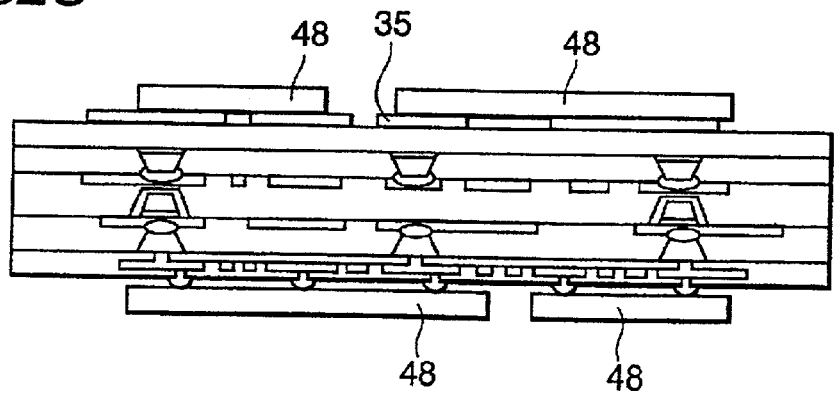

Hereinbelow, a description will be given of a twenty-eighth embodiment according to the present invention with reference to FIGS. 32A to 32C. The twenty-eighth embodiment includes configurations and processing steps that are substantially common to those in the individual embodiments described above. For the substantially common configurations and steps, a detailed description will be omitted. FIGS. 32A to 32C are cross-sectional views each showing a multilayer wiring circuit substrate of the present embodiment.

Figure 6B:
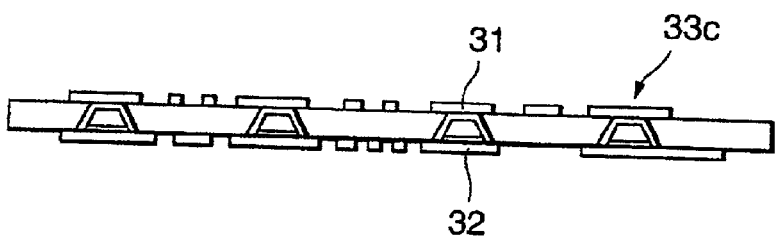

As shown in FIGS. 32A to 32C, a multilayer wiring circuit substrate 47E is formed by overlaying the wiring circuit substrate 46 (first wiring circuit substrate) shown in FIG. 7 in the described fifth embodiment, the wiring circuit substrate 33C (second wiring circuit substrate) shown in FIG. 6B in the described fourth embodiment, the wiring circuit substrate 28A (third wiring circuit substrate) shown in FIG. 1G in the described first embodiment, and a plurality of LSI chips 48. The wiring circuit substrate 33C (second wiring circuit substrate) is overlaid on the wiring circuit substrate 46 (first wiring circuit substrate), the wiring circuit substrate 28A (third wiring circuit substrate) is overlaid on the wiring circuit substrate 33C (second wiring circuit substrate), and in addition, the plurality of LSI chips 48 is overlaid outside of the wiring circuit substrates 28A and 46 (third and first wiring circuit substrates).

Similarly to the nineteenth embodiment, to configure the wiring circuit substrate 47E, the individual wiring circuit substrates 46, 33C, and 28A are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 47E by using resist films on the individual upper and lower surface as masks; thereby, a plurality of conductor circuits is obtained.

In addition, the plurality of LSI chips 48 is mounted from the outside, and the multilayer wiring circuit substrate 47E is thereby produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher, and furthermore, allows the LSI chips having a very high integration density to be mounted.

(Twenty-Ninth Embodiment)

Figure 33A:
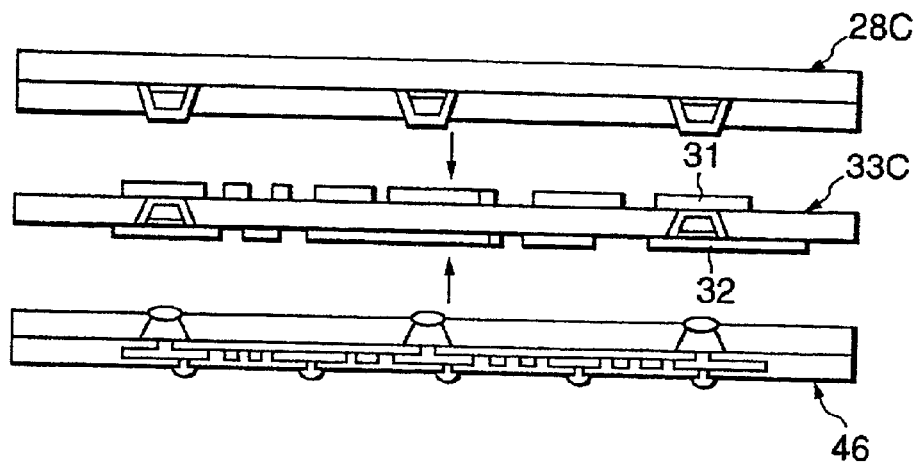
FIGS. 33A to 33C are cross-sectional views of example wiring circuit substrates of the present invention that are to be stacked and/or that are stacked.
Figure 33B:
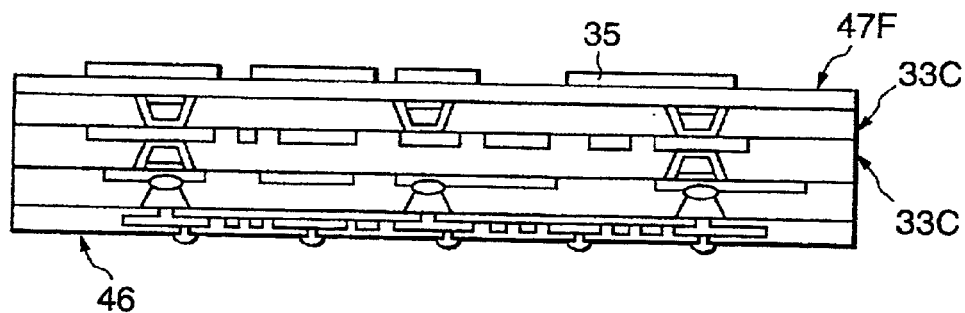
Figure 33C:
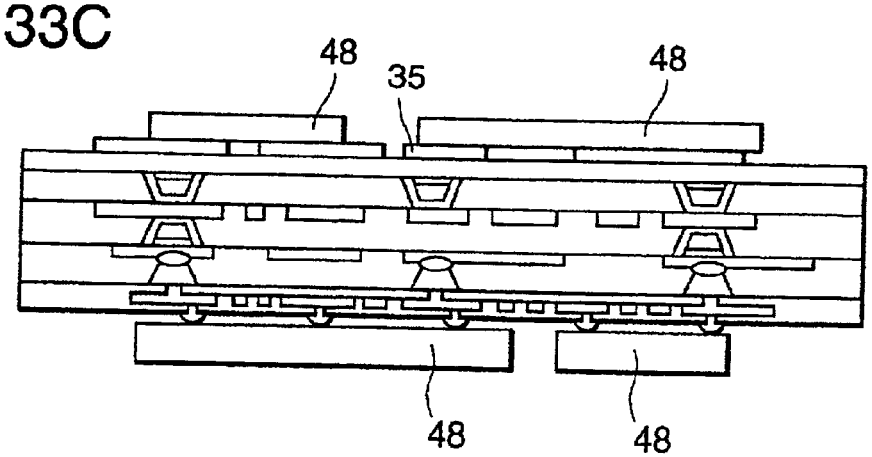

Hereinbelow, a description will be given of a twenty-ninth embodiment according to the present invention with reference to FIGS. 33A to 33C. The twenty-ninth embodiment includes configurations and processing steps that are substantially common to those in the individual embodiments described above. For the substantially common configurations and steps, a detailed description will be omitted. FIGS. 33A to 33C are cross-sectional views each showing a multilayer wiring circuit substrate of the present embodiment.

As shown in FIGS. 33A to 33C, a multilayer wiring circuit substrate 47F is formed by overlaying the wiring circuit substrate 46 (first wiring circuit substrate) shown in FIG. 7 in the described fifth embodiment, the wiring circuit substrate 33C (second wiring circuit substrate) shown in FIG. 6 in the described fourth embodiment, the wiring circuit substrate 28C (third wiring circuit substrate) shown in FIG. 6 in the described fourth embodiment, and a plurality of LSI chips 48. The wiring circuit substrate 33C (second wiring circuit substrate) is overlaid on the wiring circuit substrate 46 (first wiring circuit substrate), the wiring circuit substrate 28C (third wiring circuit substrate) is overlaid on the wiring circuit substrate 33C (second wiring circuit substrate), and in addition, the plurality of LSI chips 48 is overlaid outside of the wiring circuit substrates 28C and 46 (third and first wiring circuit substrates).

Similarly to the nineteenth embodiment, to configure the wiring circuit substrate 47F, the individual wiring circuit substrates 46, 33C, and 28C are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 47F by using resist films on the individual upper and lower surface as masks; thereby, a plurality of conductor circuits is obtained.

In addition, the plurality of LSI chips 48 is mounted from the outside, and the multilayer wiring circuit substrate 47F is thereby produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher, and furthermore, allows the LSI chips having a very high integration density to be mounted.

(Thirtieth Embodiment)

Figure 34:
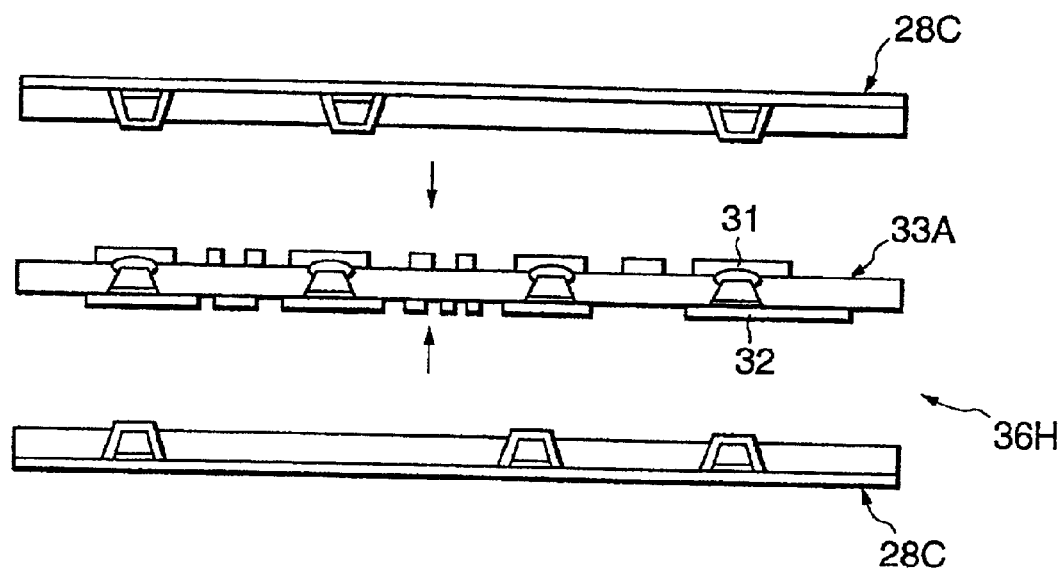
FIG. 34 is a cross-sectional view of an example wiring circuit substrates of the present invention to be stacked.

Hereinbelow, a description will be given of a thirtieth embodiment according to the present invention with reference to FIG. 34. The thirtieth embodiment includes configurations and processing steps that are substantially common to those in the individual embodiments described above. For the substantially common configurations and steps, a detailed description will be omitted. FIG. 34 is a cross-sectional view showing a multilayer wiring circuit substrate of the present embodiment.

As shown in FIG. 34, a multilayer wiring circuit substrate 36H is formed by overlaying the wiring circuit substrates 28C (first and third wiring circuit substrates) shown in FIG. 5A (FIG. 6) in the described fourth embodiment, and the wiring circuit substrate 33A (second wiring circuit substrate) shown in FIG. 2D (FIG. 2) in the described first embodiment. The wiring circuit substrate 33A (second wiring circuit substrate) is overlaid on the wiring circuit substrate 28C (first wiring circuit substrate), and the wiring circuit substrate 28C (third wiring circuit substrate) is overlaid on the wiring circuit substrate 33A (second wiring circuit substrate).

Similarly to the nineteenth embodiment, to configure the wiring circuit substrate 36H, the individual wiring circuit substrates 28C and the wiring circuit substrate 33A are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 36H by using resist films on the individual upper and lower surface as masks; thereby, a plurality of conductor circuits is obtained, and in addition, the multilayer wiring circuit substrate 36H is produced.

In this way, according to the present embodiment, advantageous effects similar to those in the described embodiment are produced, and concurrently, the multilayer wiring circuit substrate having the plurality of conductor circuits can be obtained. This allows the density of the wiring circuit substrate to be even higher.

(Thirty-First Embodiment)

Figure 35A:
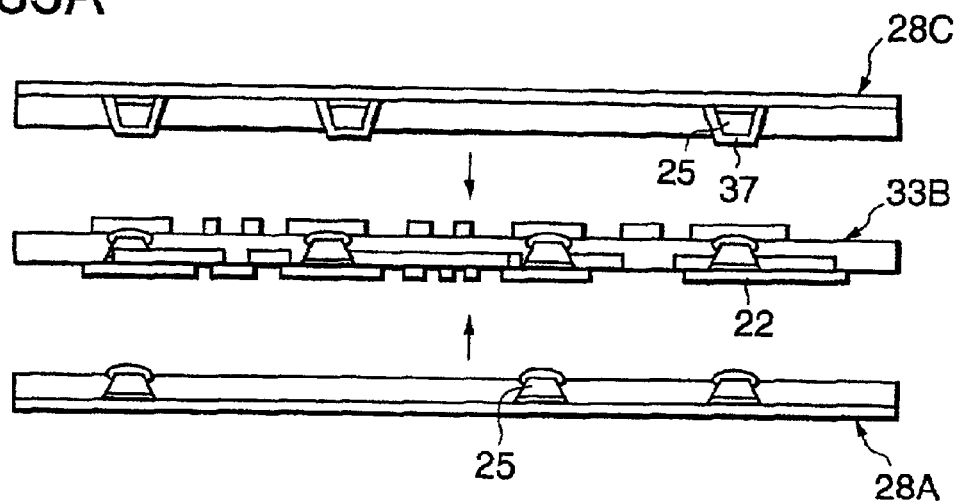
FIGS. 35A to 35C are cross-sectional views of example wiring circuit substrates of the present invention that are to be stacked and/or that are stacked.
Figure 35B:
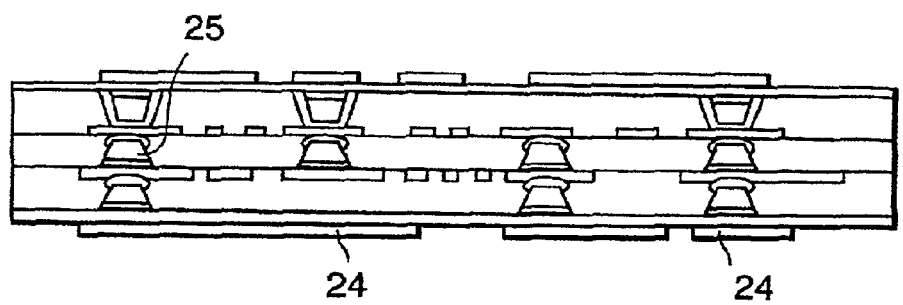
Figure 35C:
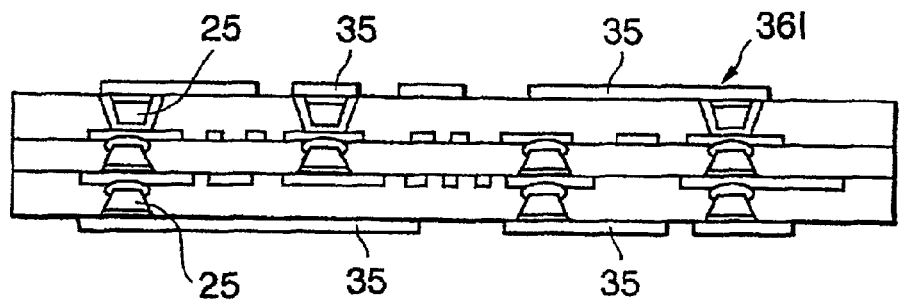

Hereinbelow, a description will be given of a thirty-first embodiment according to the present invention with reference to FIGS. 35A to 35C. The thirty-first embodiment includes configurations and processing steps that are substantially common to those in the individual embodiments described above. For the substantially common configurations and steps, a detailed description will be omitted. FIGS. 35A to 35C are cross-sectional views each showing a multilayer wiring circuit substrate of the present embodiment.

As shown in FIGS. 35A to 35C, a multilayer wiring circuit substrate 36I is formed by overlaying the wiring circuit substrate 28A (first wiring circuit substrate) shown in FIG. 1G in the described first embodiment, the wiring circuit substrate 33B (second wiring circuit substrate) shown in FIG. 1 in the first embodiment, and the wiring circuit substrate 28C (third wiring circuit substrate) shown in FIG. 6 in the fourth embodiment. The wiring circuit substrate 33B (second wiring circuit substrate) is overlaid on the wiring circuit substrate 28A (first wiring circuit substrate), and the wiring circuit substrate 28C (third wiring circuit substrate) is overlaid on the wiring circuit substrate 33B (second wiring circuit substrate).

Similarly to the nineteenth embodiment, to configure the wiring circuit substrate 36I, the individual wiring circuit substrates 28A, 33B, and 28C are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 36I by using resist films on the individual upper and lower surface as masks; thereby, a plurality of conductor circuits is obtained, and in addition, the multilayer wiring circuit substrate 36I is produced.

In this way, according to the present embodiment, advantageous effects similar to those in the described embodiment are produced, and concurrently, the multilayer wiring circuit substrate having the plurality of conductor circuits can be obtained. This allows the density of the wiring circuit substrate to be even higher.

(Thirty-Second Embodiment)

Figure 36A:
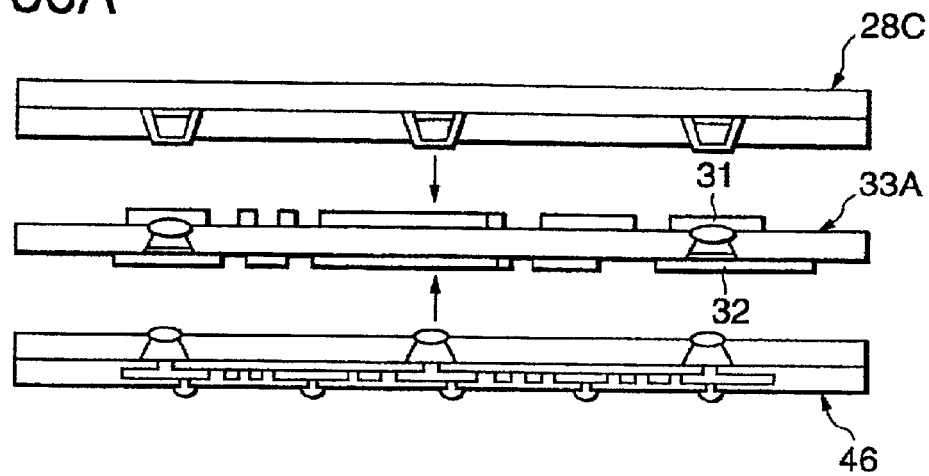
FIGS. 36A to 36C are cross-sectional views of example wiring circuit substrates of the present invention that are to be stacked and/or that are stacked.
Figure 36B:
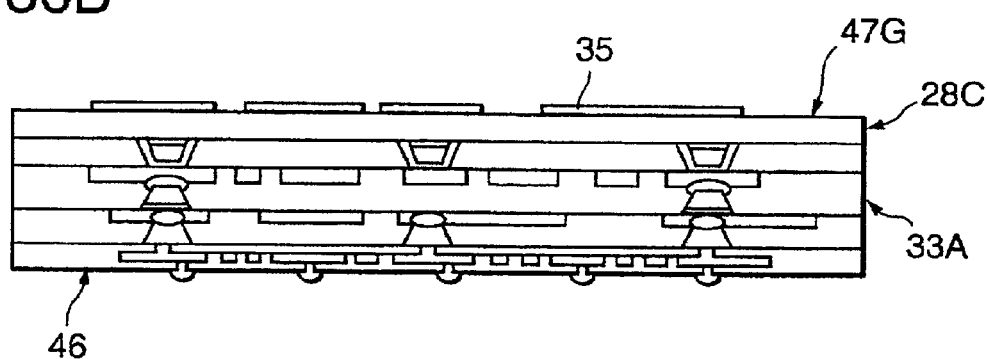
Figure 36C:
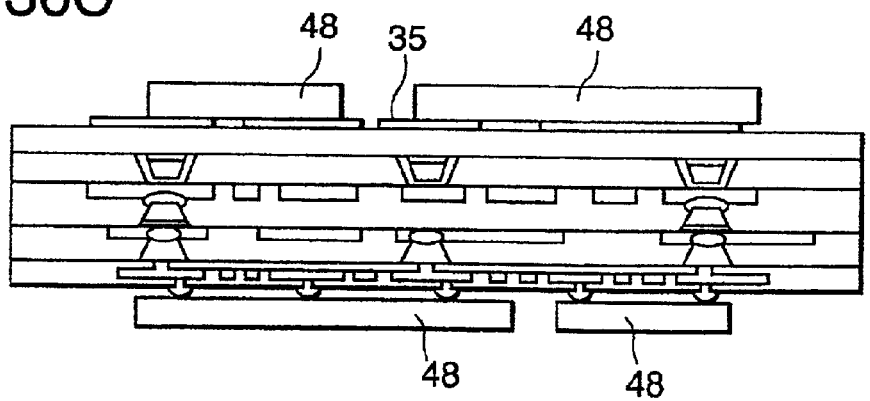

Hereinbelow, a description will be given of a thirty-second embodiment according to the present invention with reference to FIGS. 36A to 36C. The thirty-second embodiment includes configurations and processing steps that are substantially common to those in the individual embodiments described above. For the substantially common configurations and steps, a detailed description will be omitted. FIGS. 36A to 36C are cross-sectional views each showing a multilayer wiring circuit substrate of the present embodiment.

As shown in FIGS. 36A to 36C, a multilayer wiring circuit substrate 47G is formed by overlaying the wiring circuit substrate 46 (first wiring circuit substrate) shown in FIG. 7 in the described fifth embodiment, the wiring circuit substrate 33A (second wiring circuit substrate) shown in FIG. 1 in the described first embodiment, the wiring circuit substrate 28C (third wiring circuit substrate) shown in FIG. 6 in the described fourth embodiment, and a plurality of LSI chips 48. The wiring circuit substrate 33A (second wiring circuit substrate) is overlaid on the wiring circuit substrate 46 (first wiring circuit substrate), the wiring circuit substrate 28C (third wiring circuit substrate) is overlaid on the wiring circuit substrate 33A (second wiring circuit substrate), and in addition, the plurality of LSI chips 48 is overlaid outside of the wiring circuit substrates 46 and 28C (first and third wiring circuit substrates).

Similarly to the nineteenth embodiment, to configure the wiring circuit substrate 47G, the individual wiring circuit substrates 46, 33A, and 28C are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 47G by using resist films on the individual upper and lower surface as masks; thereby, a plurality of conductor circuits is obtained.

In addition, the plurality of LSI chips 48 is mounted from the outside, and the multilayer wiring circuit substrate 47G is thereby produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher, and furthermore, allows the LSI chips having a very high integration density to be mounted.

(Thirty-Third Embodiment)

Figure 37A:
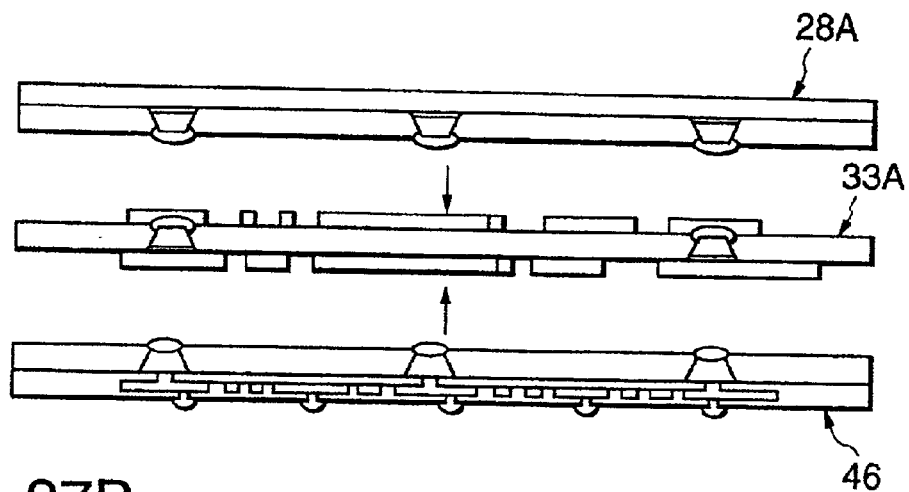
FIGS. 37A to 37C are cross-sectional views of example wiring circuit substrates of the present invention that are to be stacked and/or that are stacked.
Figure 37B:
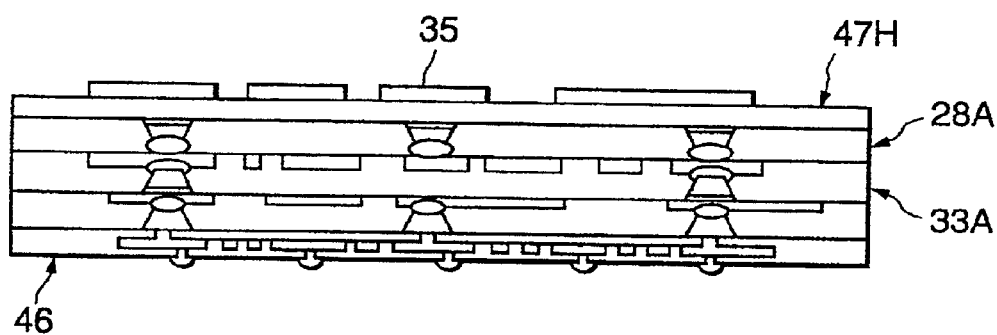
Figure 37C:
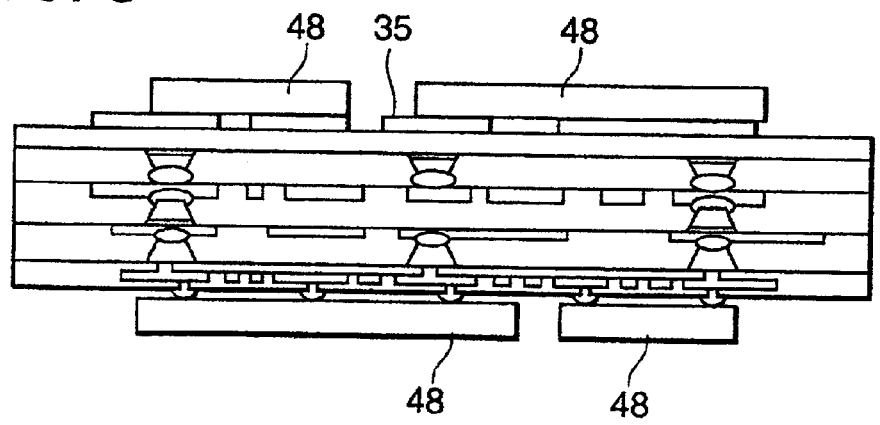

Hereinbelow, a description will be given of a thirty-third embodiment according to the present invention with reference to FIGS. 37A to 37C. The thirty-third embodiment includes configurations and processing steps that are substantially common to those in the individual embodiments described above. For the substantially common configurations and steps, a detailed description will be omitted. FIGS. 37A to 37C are cross-sectional views each showing a multilayer wiring circuit substrate of the present embodiment.

As shown in FIGS. 37A to 37C, a multilayer wiring circuit substrate 47H is formed by overlaying the wiring circuit substrate 46 (first wiring circuit substrate) shown in FIG. 7 in the described fifth embodiment, the wiring circuit substrate 33A (second wiring circuit substrate) shown in FIG. 1G in the described first embodiment, the wiring circuit substrate 28A (third wiring circuit substrate) shown in FIG. 1G in the described first embodiment, and a plurality of LSI chips 48. The wiring circuit substrate 33A (second wiring circuit substrate) is overlaid on the wiring circuit substrate 46 (first wiring circuit substrate), the wiring circuit substrate 28A (third wiring circuit substrate) is overlaid on the wiring circuit substrate 33A (second wiring circuit substrate), and in addition, the plurality of LSI chips 48 is overlaid outside of the wiring circuit substrates 28A and 46 (third and first wiring circuit substrates).

Similarly to the nineteenth embodiment, to configure the wiring circuit substrate 47H, the individual wiring circuit substrates 46, 33A, and 28A are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 47H by using resist films on the individual upper and lower surface as masks; thereby, a plurality of conductor circuits is obtained.

In addition, the plurality of LSI chips 48 is mounted from the outside, and the multilayer wiring circuit substrate 47H is thereby produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher, and furthermore, allows the LSI chips having a very high integration density to be mounted.

(Thirty-Fourth Embodiment)

Figure 38A:
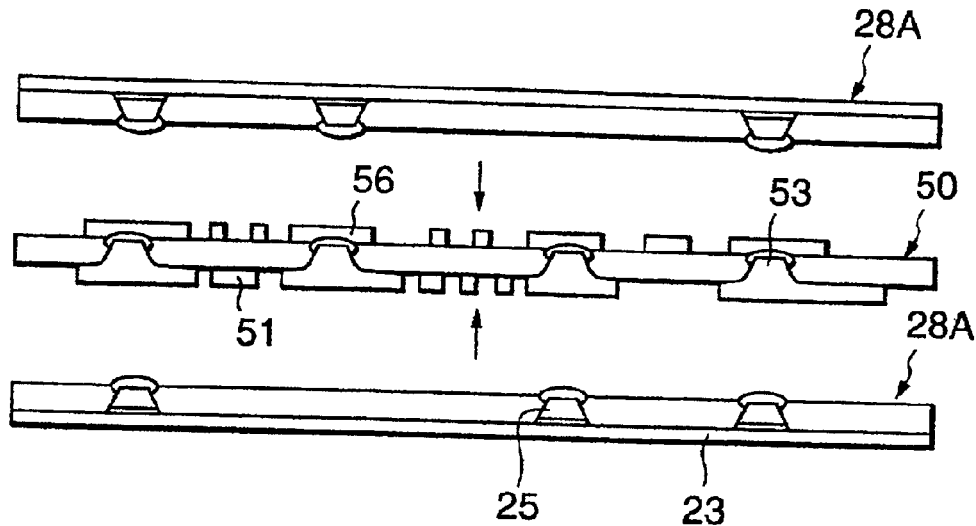
FIGS. 38A to 38C are cross-sectional views of example wiring circuit substrates of the present invention that are to be stacked and/or that are stacked.
Figure 38B:
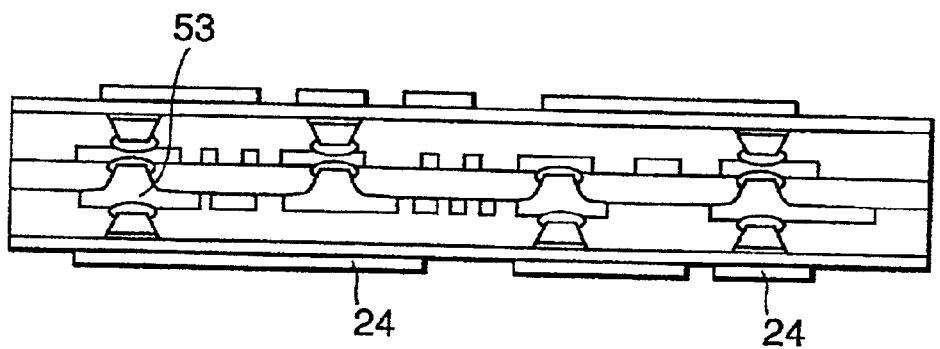
Figure 38C:
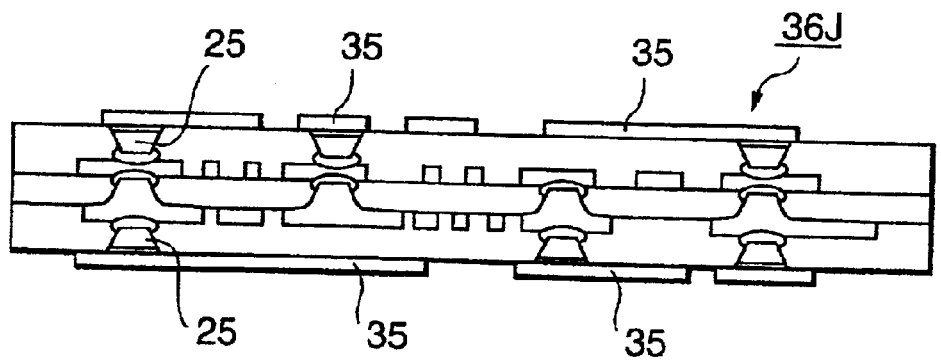

Hereinbelow, a description will be given of a thirty-fourth embodiment according to the present invention with reference to FIGS. 38A to 38C. The thirty-fourth embodiment includes configurations and processing steps that are substantially common to those in the individual embodiments described above. For the substantially common configurations and steps, a detailed description will be omitted. FIGS. 38A to 38C are cross-sectional views each showing a multilayer wiring circuit substrate of the present embodiment.

As shown in FIGS. 38A to 38C, a multilayer wiring circuit substrate 36J is formed by overlaying the wiring circuit substrates 28A (first and third wiring circuit substrates) shown in FIG. 1G in the described first embodiment, and the wiring circuit substrate 50 (second wiring circuit substrate) shown in FIG. 9 in the sixth embodiment. The wiring circuit substrate 50 (second wiring circuit substrate) is overlaid on the wiring circuit substrate 28A (first wiring circuit substrate), and the wiring circuit substrate 28A (third wiring circuit substrate) is overlaid on the wiring circuit substrate 50 (second wiring circuit substrate).

Similarly to the nineteenth embodiment, to configure the wiring circuit substrate 36J, the individual wiring circuit substrates 28A and the wiring circuit substrate 50 are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 36J by using resist films on the individual upper and lower surface as masks; thereby, a plurality of conductor circuits is obtained, and in addition, the multilayer wiring circuit substrate 36J is produced.

In this way, according to the present embodiment, advantageous effects similar to those in the described embodiment are produced, and concurrently, the multilayer wiring circuit substrate having the plurality of conductor circuits can be obtained. This allows the density of the wiring circuit substrate to be even higher.

(Thirty-Fifth Embodiment)

Figure 39:
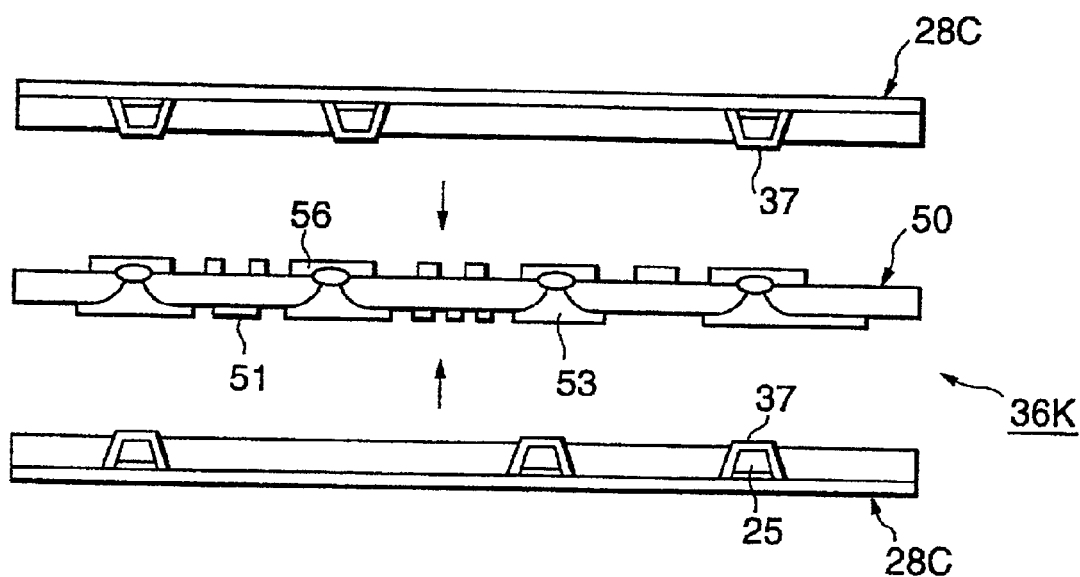
FIG. 39 is a cross-sectional view of an example wiring circuit substrates of the present invention to be stacked.

Hereinbelow, a description will be given of a thirty-fifth embodiment according to the present invention with reference to FIG. 39. The thirty-fifth embodiment includes configurations and processing steps that are substantially common to those in the individual embodiments described above. For the substantially common configurations and steps, a detailed description will be omitted. FIG. 39 is a cross-sectional view showing a multilayer wiring circuit substrate of the present embodiment.

As shown in FIG. 39, a multilayer wiring circuit substrate 36K is formed by overlaying the wiring circuit substrates 28C (first and third wiring circuit substrates) shown in FIG. 6 in the described fourth embodiment, and the wiring circuit substrate 50 (second wiring circuit substrate) shown in FIG. 9 in the described sixth embodiment. The wiring circuit substrate 50 (second wiring circuit substrate) is overlaid on the wiring circuit substrate 28C (first wiring circuit substrate), and the wiring circuit substrate 28C (third wiring circuit substrate) is overlaid on the wiring circuit substrate 50 (second wiring circuit substrate).

Similarly to the nineteenth embodiment, to configure the wiring circuit substrate 36K, the individual wiring circuit substrates 28C and the wiring circuit substrate 50 are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 36K by using resist films on the individual upper and lower surface as masks; thereby, a plurality of conductor circuits is obtained, and in addition, the multilayer wiring circuit substrate 36K is produced.

In this way, according to the present embodiment, advantageous effects similar to those in the described embodiment are produced, and concurrently, the multilayer wiring circuit substrate having the plurality of conductor circuits can be obtained. This allows the density of the wiring circuit substrate to be even higher.

(Thirty-Sixth Embodiment)

Figure 40A:
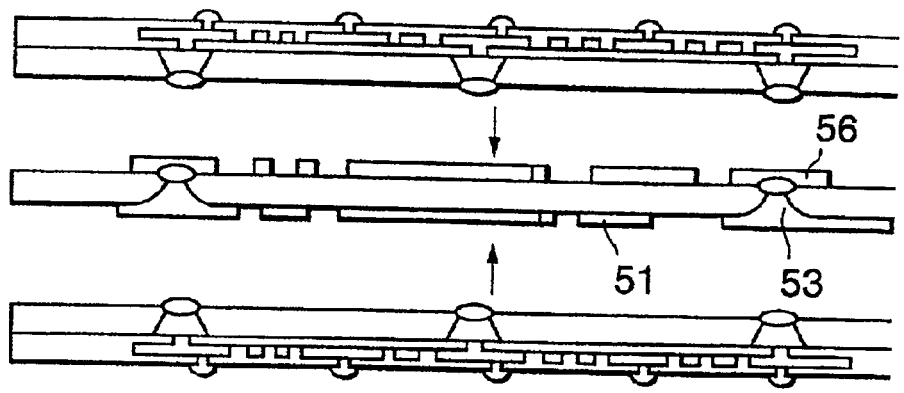
FIGS. 40A to 40C are cross-sectional views of example wiring circuit substrates of the present invention that are to be stacked and/or that are stacked.
Figure 40B:
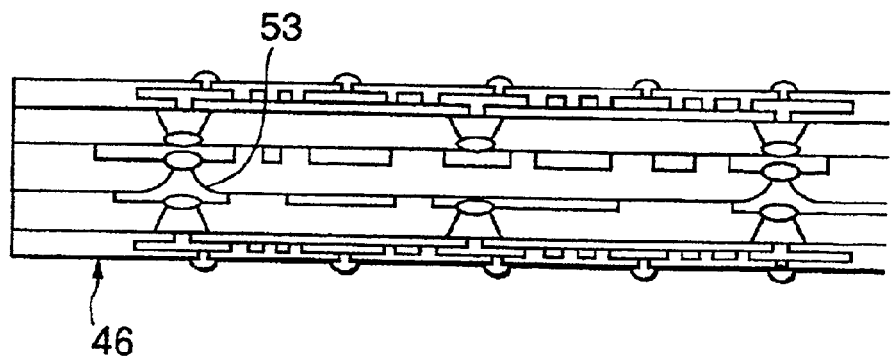
Figure 40C:
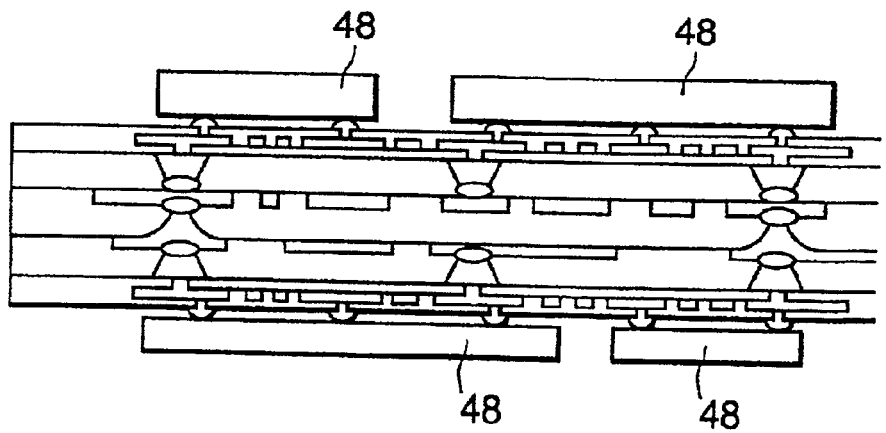

Hereinbelow, a description will be given of a thirty-sixth embodiment according to the present invention with reference to FIGS. 40A to 40B. The thirty-sixth embodiment includes configurations and processing steps that are substantially common to those in the individual embodiments described above. For the substantially common configurations and steps, a detailed description will be omitted. FIGS. 40A to 40C are cross-sectional views each showing a multilayer wiring circuit substrate of the present embodiment.

As shown in FIGS. 40A to 40C, a multilayer wiring circuit substrate 47I is formed by overlaying the wiring circuit substrates 46 (first and third wiring circuit substrates) shown in FIG. 7 in the described fifth embodiment, the wiring circuit substrate 50 (second wiring circuit substrate) shown in FIG. 9 in the described sixth embodiment, and a plurality of LSI chips 48. The wiring circuit substrate 50 (second wiring circuit substrate) is overlaid on the wiring circuit substrate 46 (first wiring circuit substrate), the wiring circuit substrate 46 (third wiring circuit substrate) is overlaid on the wiring circuit substrate 50 (second wiring circuit substrate), and in addition, the plurality of LSI chips 48 is overlaid outside of the wiring circuit substrates 46 (first and third wiring circuit substrates).

Similarly to the nineteenth embodiment, to configure the wiring circuit substrate 47I, the individual wiring circuit substrates 46 and the wiring circuit substrate 50 are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 47I by using resist films on the individual upper and lower surface as masks; thereby, a plurality of conductor circuits is obtained.

In addition, the plurality of LSI chips 48 is mounted from the outside, and the multilayer wiring circuit substrate 47I is thereby produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher, and furthermore, allows the LSI chips having a very high integration density to be mounted.

(Thirty-Seventh Embodiment)

Figure 41A:
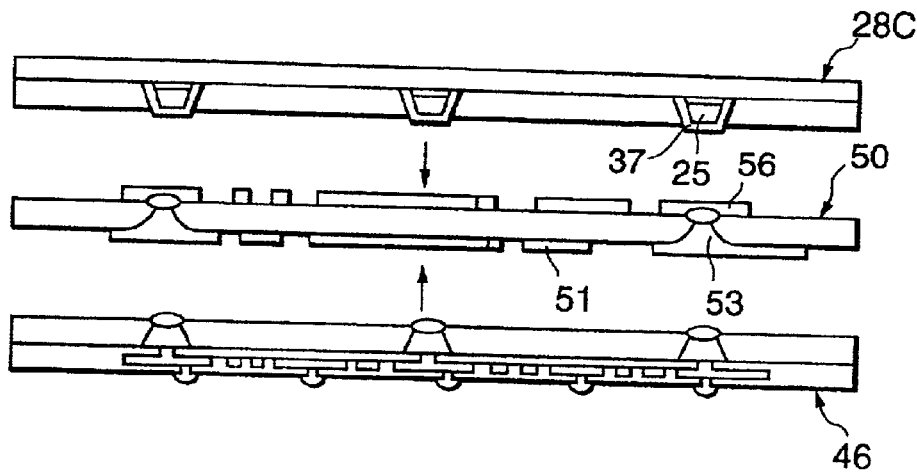
FIGS. 41A to 41C are cross-sectional views of example wiring circuit substrates of the present invention that are to be stacked and/or that are stacked.
Figure 41B:
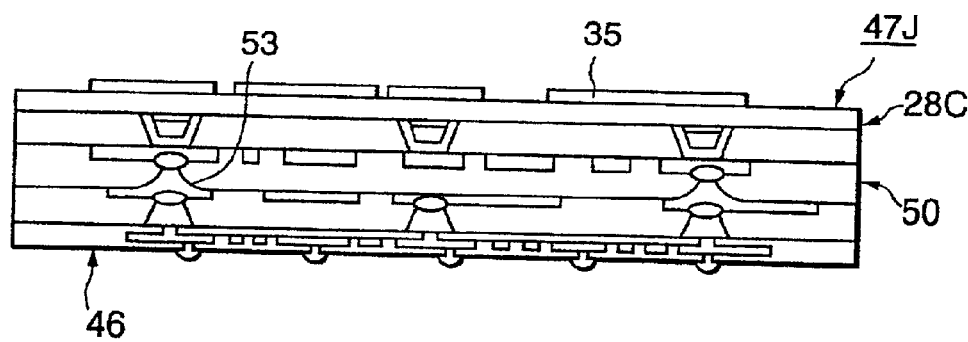
Figure 41C:
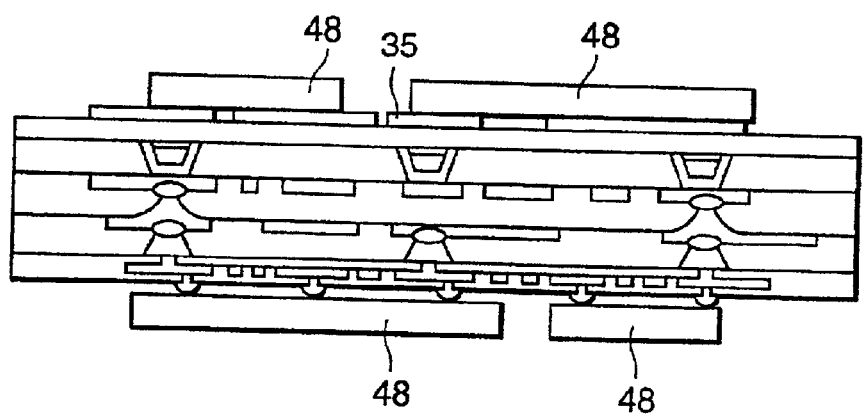

Hereinbelow, a description will be given of a thirty-seventh embodiment according to the present invention with reference to FIGS. 41A to 41C. The thirty-seventh embodiment includes configurations and processing steps that are substantially common to those in the individual embodiments described above. For the substantially common configurations and steps, a detailed description will be omitted. FIGS. 41A to 41C are cross-sectional views each showing a multilayer wiring circuit substrate of the present embodiment.

As shown in FIGS. 41A to 41C, a multilayer wiring circuit substrate 47J is formed by overlaying the wiring circuit substrate 46 (first wiring circuit substrate) shown in FIG. 7 in the described fifth embodiment, the wiring circuit substrate 50 (second wiring circuit substrate) shown in FIG. 9 in the sixth embodiment, the wiring circuit substrate 28C (third wiring circuit substrate) shown in FIG. 6 in the fourth embodiment, and a plurality of LSI chips 48. The wiring circuit substrate 50 (second wiring circuit substrate) is overlaid on the wiring circuit substrate 46 (first wiring circuit substrate), the wiring circuit substrate 28C (third wiring circuit substrate) is overlaid on the wiring circuit substrate 50 (second wiring circuit substrate), and in addition, the plurality of LSI chips 48 is overlaid outside of the wiring circuit substrates 46 and 28C.

Similarly to the nineteenth embodiment, to configure the wiring circuit substrate 47J, the individual wiring circuit substrates 46, 50, and 28C are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 47J by using resist films on the individual upper and lower surface as masks; thereby, a plurality of conductor circuits is obtained.

In addition, the plurality of LSI chips 48 is mounted from the outside, and the multilayer wiring circuit substrate 47J is thereby produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher, and furthermore, allows the LSI chips having a very high integration density to be mounted.

(Thirty-Eighth Embodiment)

Figure 42A:
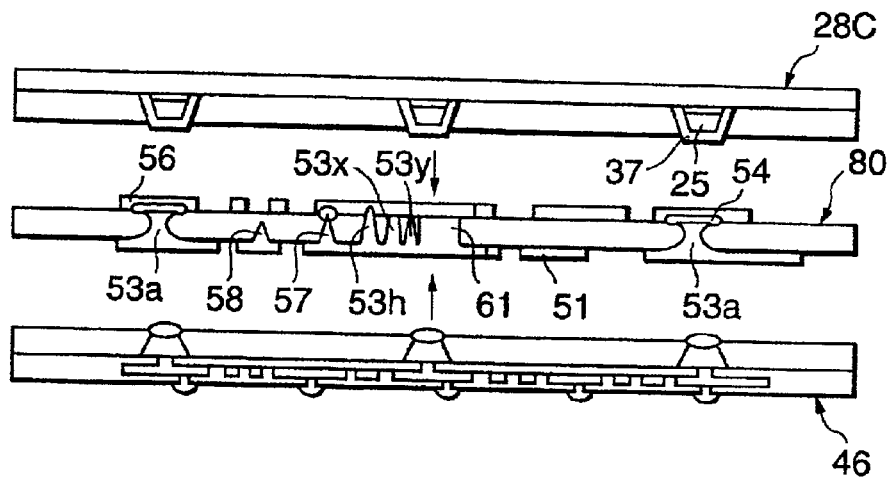
FIGS. 42A to 42C are cross-sectional views of example wiring circuit substrates of the present invention that are to be stacked and/or that are stacked.
Figure 42B:
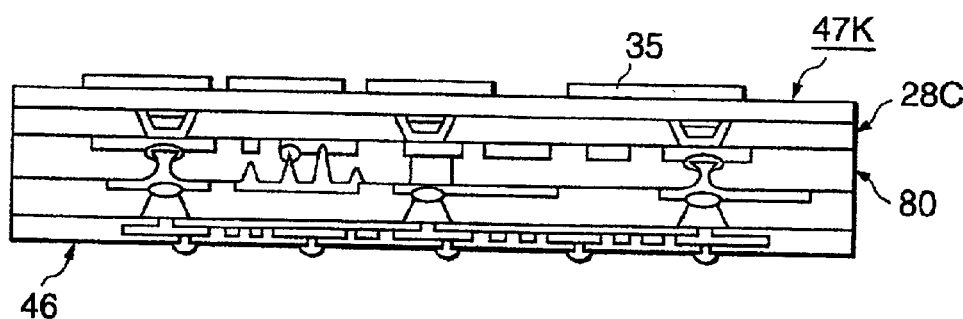
Figure 42C:
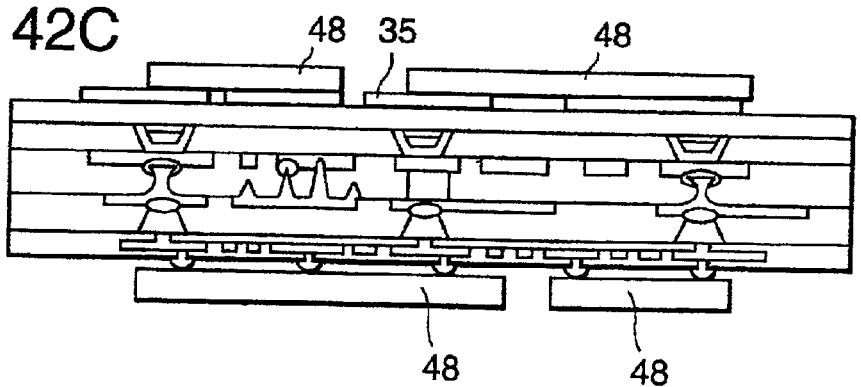

Hereinbelow, a description will be given of a thirty-eighth embodiment according to the present invention with reference to FIGS. 42A to 42C. The thirty-eighth embodiment includes configurations and processing steps that are substantially common to those in the individual embodiments described above. For the substantially common configurations and steps, a detailed description will be omitted. FIGS. 42A to 42C are cross-sectional views each showing a multilayer wiring circuit substrate of the present embodiment.

As shown in FIGS. 42A to 42C, a multilayer wiring circuit substrate 47K is formed by overlaying the wiring circuit substrate 46 (first wiring circuit substrate) shown in FIG. 7 in the described fifth embodiment, a wiring circuit substrate 80 (second wiring circuit substrate) that is specific to the present embodiment, the wiring circuit substrate 28C (third wiring circuit substrate) shown in FIG. 6 in the fourth embodiment, and a plurality of LSI chips 48. The wiring circuit substrate 80 (second wiring circuit substrate) is overlaid on the wiring circuit substrate 46 (first wiring circuit substrate), the wiring circuit substrate 28C (third wiring circuit substrate) is overlaid on the wiring circuit substrate 80 (second wiring circuit substrate), and in addition, the plurality of LSI chips 48 is overlaid outside of the wiring circuit substrates 46 and 28C.

In the wiring circuit substrate 80, which is specific to the present embodiment, various protrusions extended from one metal layer are formed in the interlayer-insulating layer formed between the upper and lower metal layers. Specifically, the wiring circuit substrate 80 is composed including konide-like protrusions 53a, the protrusions 53x, 53y which are different in diameter from each other and which are shown in the described thirteenth embodiment, the dummy protrusions 58 formed around each of the protrusions shown in the described ninth embodiment, the protrusions 53h each having unique height as shown in the described eleventh embodiment, and the spacers 61 shown in the described twelfth embodiment. When the wiring circuit substrate 80 is formed, the aforementioned protrusions and the spacers 61 are formed in the same step.

Similarly to the nineteenth embodiment, to configure the wiring circuit substrate 47K, the individual wiring circuit substrates 46, 80, and 46 are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 47K by using resist films on the individual upper and lower surface as masks; thereby, a plurality of conductor circuits is obtained.

In addition, the plurality of LSI chips 48 is mounted from the outside, and the multilayer wiring circuit substrate 47K is thereby produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher, and furthermore, allows the LSI chips having a very high integration density to be mounted.

(Thirty-Ninth Embodiment)

Figure 43A:
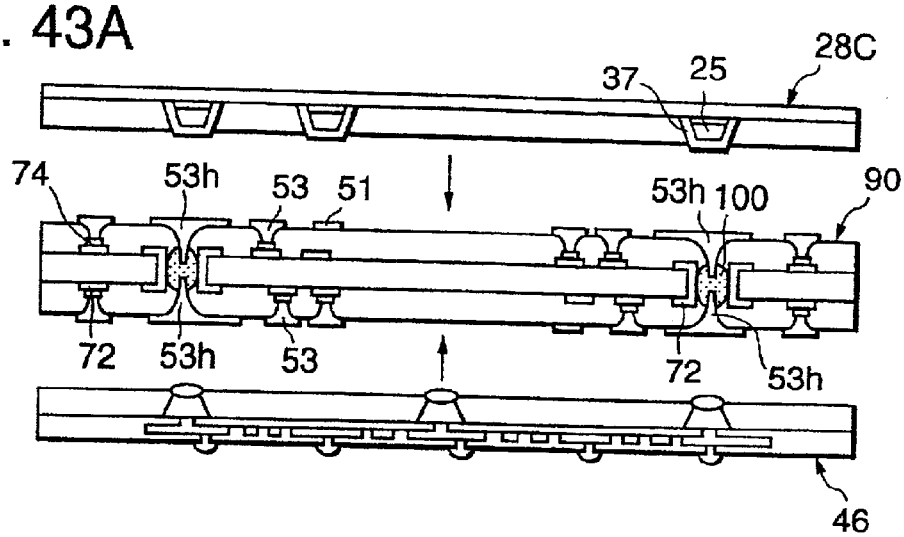
FIGS. 43A to 43C are cross-sectional views of example wiring circuit substrates of the present invention that are to be stacked and/or that are stacked.
Figure 43B:
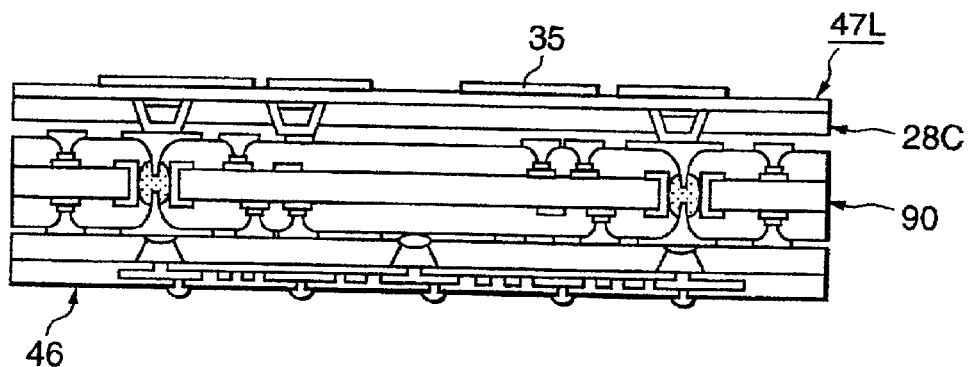
Figure 43C:
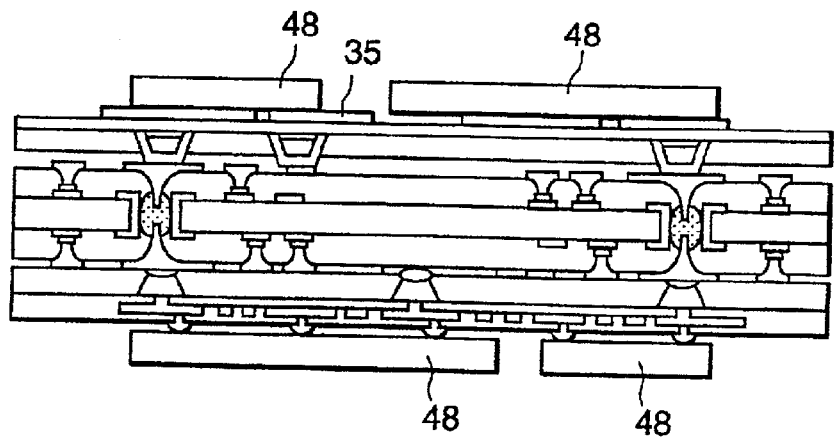

Hereinbelow, a description will be given of a thirty-ninth embodiment according to the present invention with reference to FIGS. 43A to 43C. The thirty-ninth embodiment includes configurations and processing steps that are substantially common to those in the individual embodiments described above. For the substantially common configurations and steps, a detailed description will be omitted. FIGS. 43A to 43C are cross-sectional views each showing a multilayer wiring circuit substrate of the present embodiment.

As shown in FIGS. 43A to 43C, a multilayer wiring circuit substrate 47L is formed by overlaying the wiring circuit substrate 46 (first wiring circuit substrate) shown in FIG. 7 in the described fifth embodiment, a wiring circuit substrate 90 (second wiring circuit substrate), ( ) the wiring circuit substrate 28C (third wiring circuit substrate) shown in FIG. 6 in the fourth embodiment, and a plurality of LSI chips 48. The wiring circuit substrate 90 (second wiring circuit substrate) is overlaid on the wiring circuit substrate 46 (first wiring circuit substrate), the wiring circuit substrate 28C (third wiring circuit substrate) is overlaid on the wiring circuit substrate 90 (second wiring circuit substrate), and in addition, the plurality of LSI chips 48 is overlaid outside of the wiring circuit substrates 46 and 28C.

As shown in FIG. 43A, the wiring circuit substrate 90 is composed including a plurality of conductor circuits 72, a metal layer 74 formed on the conductor circuits 72, through-holes formed so as to pass through the insulating substrate, and protrusions 53 formed so as to protrude from a base member 51 to the inside of the insulating substrate. A copper paste 100 is filled in the through-holes and is cured. High protrusions 53h are connected to the copper paste 100, and the low protrusions are connected to the metal layer 74. In addition, peripheral portions of the through-holes 73 are covered by the conductor circuits 72.

Composing the wiring circuit substrate 90 as described above allows high circuit integration to be implemented and improves the reliability of the connection between the individual protrusions and the individual conductor circuits.

Similarly to the nineteenth embodiment, to configure the wiring circuit substrate 47L, the individual wiring circuit substrates 46, 90, and 28C are preliminarily manufactured according to manufacturing methods similar to those in the corresponding embodiments. Subsequently, they are thermally press-bonded to each other by using an overlaying press so as to be a sandwich-like integral unit. After the overlaying step, etching is performed for the upper and lower wiring circuit substrates of the wiring circuit substrate 47L by using resist films on the individual upper and lower surface as masks; thereby, a plurality of conductor circuits is obtained.

In addition, the plurality of LSI chips 48 is mounted from the outside, and the multilayer wiring circuit substrate 47L is thereby produced.

In this way, according to the present embodiment, advantageous effects similar to those in the described individual embodiments are produced, and concurrently, the multilayer wiring circuit substrate having the plurality of conductor circuits can be obtained. This allows the density of the wiring circuit substrate to be even higher, and furthermore, allows the LSI chips having a very high integration density to be mounted.

(Fortieth Embodiment)

Figure 44:
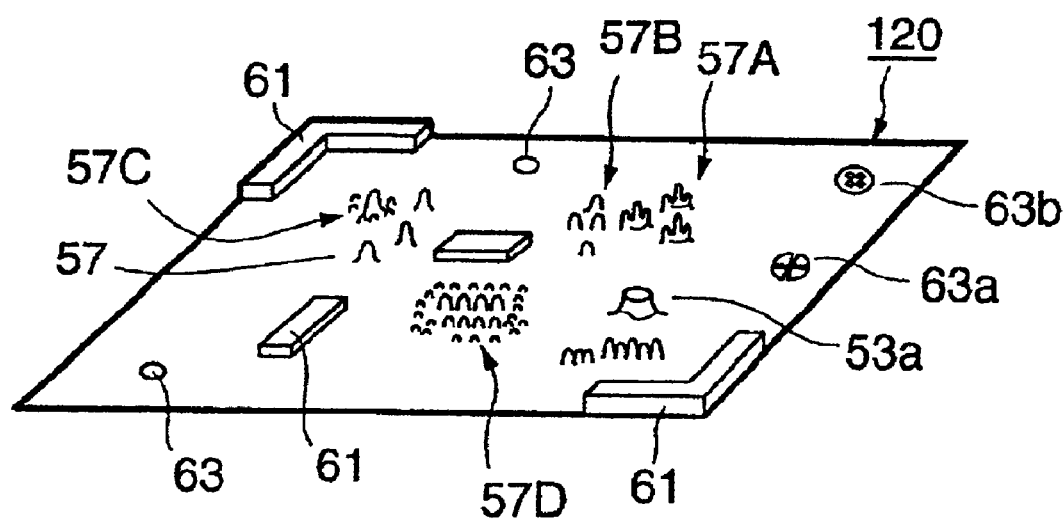
FIG. 44 is a perspective view of an example stacked wiring circuit substrate according to the present invention.

Hereinbelow, a description will be given of a fortieth embodiment according to the present invention with reference to FIG. 44. The fortieth embodiment includes configurations and processing steps that are substantially common to those in the individual embodiments described above. For the substantially common configurations and steps, a detailed description will be omitted. FIG. 44 is a perspective view showing the overall configuration of the present embodiment.

As shown in the figure, a multilayer wiring circuit substrate 120 is configured including spear-like protrusions 57, konide-like protrusions 53a, protrusions 57A similar to those as shown in FIG. 14A in the described tenth embodiment, protrusions 57B similar to those shown in FIG. 14B therein, protrusions 57C similar to those shown in FIG. 14C therein, protrusions 57D similar to those shown in FIG. 14D therein, identification marks 63 formed of the same material as that for the aforementioned protrusions either for positioning or identification of models and the like, an identification mark 63a similar to that shown in FIG. 18B in the described fourteenth embodiment, an identification mark 63b similar to that shown in FIG. 18C therein, and spacers 61. The individual protrusions are arranged so as to receive a uniformed pressure.

In the described wiring circuit substrate 120, the various protrusions, identification marks, and spacers can be in the same step.

According to the present embodiment described above, advantageous effects similar to those in the described individual embodiments are produced, and concurrently, the marks and the individual protrusions can be formed in the same step. In addition, the spacers are used so as to make the spacing between upper and lower patterns to be constant, thereby allowing the provision of the wiring circuit substrate that allows the impedance controllability to be improved.

(Forty-First Embodiment)

Figure 45:
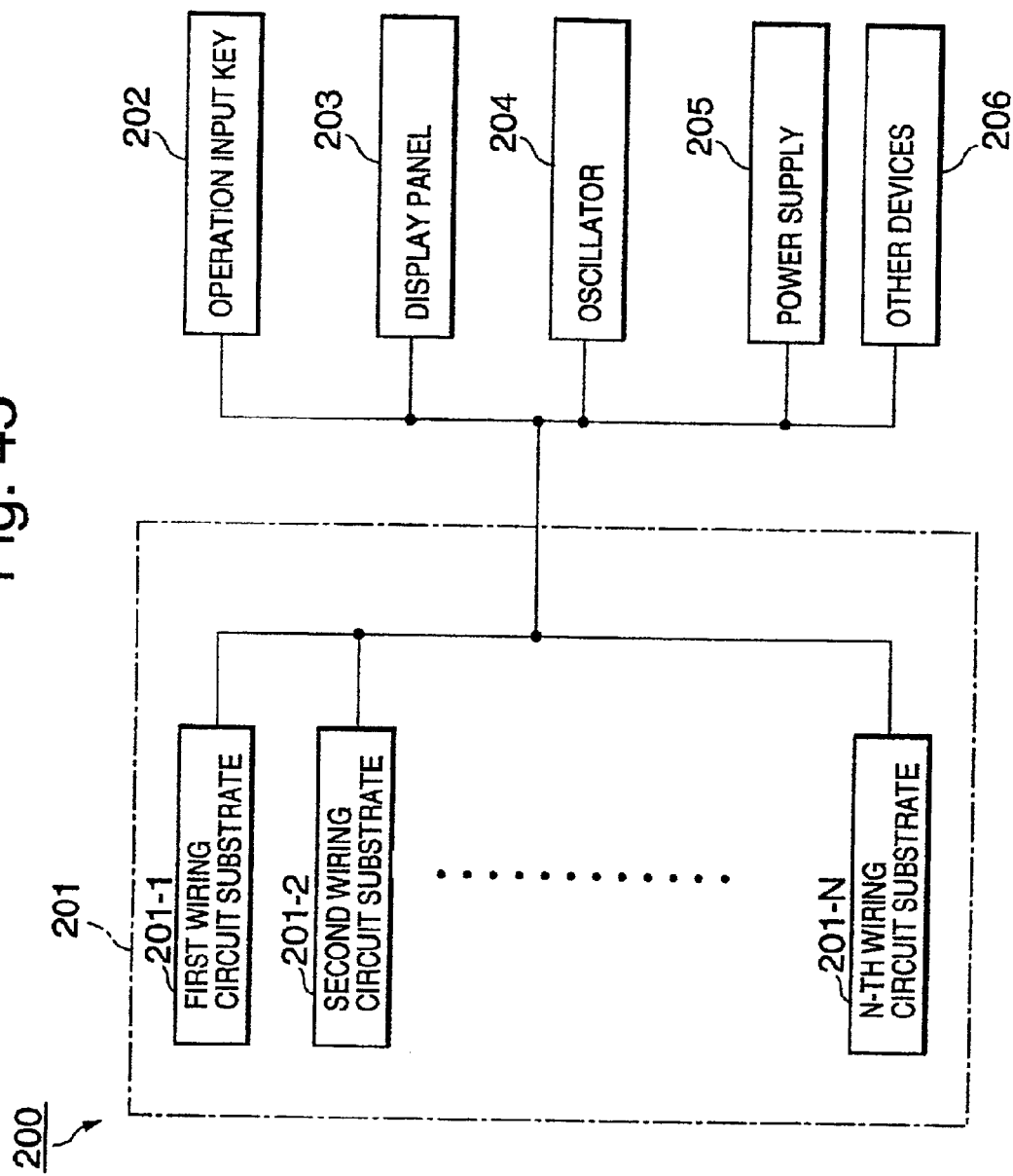
FIG. 45 is a block diagram of an example electronic apparatus including wiring circuit substrates according to the present invention.

Hereinbelow, a description will be given of a forty-first embodiment according to the present invention with reference to FIG. 45. The forty-first embodiment includes configurations and processing steps that are substantially common to those in the individual embodiments described above. For the substantially common configurations and steps, a detailed description will be omitted. FIG. 45 is a block diagram of the present embodiment of an electronic apparatus using the individual wiring circuit substrates described above.

Disclosed as the present embodiment is an example electronic apparatus 200 in which the described wiring circuit substrates are stacked.

The electronic apparatus 200 is configured including a wiring circuit section 201 and component members connected to the wiring circuit section 201. The wiring circuit section 201 has first to N-th wiring circuit substrates 201-1 to 201-N that are formed by making various combinations of the wiring circuit substrates according to the described embodiments. The component member connected to the wiring circuit section 201 includes an operation input key 202, a display panel 203, an oscillator 204, a power supply 205, and other devices 206.

Thus, the various types of the wiring circuit substrates according to the individual embodiments described above can be used in the above example electronic apparatus and various other types of electronic apparatuses requiring high-density circuit integration.

(Forty Second Embodiment)

Subsequently, a forty second embodiment of the present invention will be described with reference to FIGS. 46A to 46D and 47A to 47C. FIGS. 46A to 46D an 47A to 47C are cross-sectional views showing production steps of a wiring circuit substrate of this embodiment.

The outline of the wiring circuit substrate of this embodiment will be explained. The wiring circuit substrate of this embodiment comprises a base sheet 301, and a laminating sheet 306 to be laminated on one or both surfaces of the base sheet 301. Here, the base sheet 301 has an insulating resin 302, wiring films 303 each formed on both surfaces of the insulating resin 302, one or a plurality of through holes 304 formed through the wiring films 303 and the insulating resin 302, and one or a plurality of conductive materials 305 formed so as to fill the one or the plurality of the through holes 304. Moreover, the laminating sheet 306 has a metal foil 307, and one or a plurality of protrusion parts 308 formed, projecting from the metal foil 307 at a position facing to the one or the plurality of the through holes 304. Furthermore, the laminating sheet 306 is laminated in the state with the one or the plurality of the protrusion parts 308 and the one or the plurality of the conductive materials 305 connected.

Here, unlike the conventional example, a copper film needs not be formed by an electroless plating and a subsequent electrolytic plating after filling the through holes with the insulating resin in the base sheet 301. That is, the through holes 304 needs only to be filled with the conductive material 305 in the base sheet 301 of this embodiment. The conductive material 305 is preferably made from a copper paste, and a silver paste.

As described later, the laminating sheet 306 may have an etching barrier layer. The etching barrier layer is preferably made from, for example, a nickel (for example by a 2 μm thickness), or a silver (for example by a 0.5 μm thickness).

Moreover, it is preferable that the metal foil 307 is made from a silver, or the like and the protrusion parts 308 are made from a copper, a copper alloy, or the like.

Furthermore, a wiring film can be formed by further laminating another laminating sheet (second laminating sheet) on a laminating sheet (first laminating sheet) laminated on a base sheet, and patterning a metal foil on the surface of the laminating sheet (second laminating sheet). Or, it is also possible to achieve a multi-layer structure by increasing the number of laminations by further laminating a laminating sheet (third laminating sheet) on the laminating sheet (second laminating sheet).

Hereinafter production steps of the wiring circuit substrate of this embodiment will be explained successively.

Step (A)

Figure 46A:
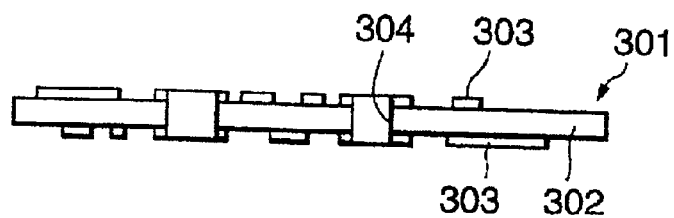
FIGS. 46A to 46D are cross-sectional views showing an embodiment of production steps of a wiring circuit substrate according to the present invention.

First of all, as shown in FIG. 46A, the base sheet 301 as the base member is prepared. A copper-plated laminated plate with the copper foil 303 laminated on both surfaces of the sheet-like insulating resin 302 is prepared. The through holes 304 are formed through the insulating resin 302 and the copper foil 303 by drilling or laser processing. Thereafter, a wiring film is formed by selectively etching the copper foil 303 on both surfaces for patterning.

The production method for the base sheet 301 will be described later with reference to FIGS. 48A to 48C. Furthermore, a base sheet produced by the method shown in FIGS. 49A to 49D may be used. The production method will also be explained later in detail.

Step (B)

Figure 46B:
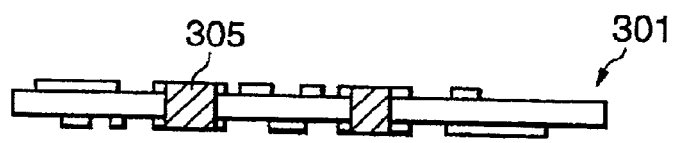

Subsequently, as shown in FIG. 46B, the through holes 304 are filled with the conductive material 305. The conductive material is preferably made from a conductive paste containing a copper or a silver.

Step (C)

Figure 46C:
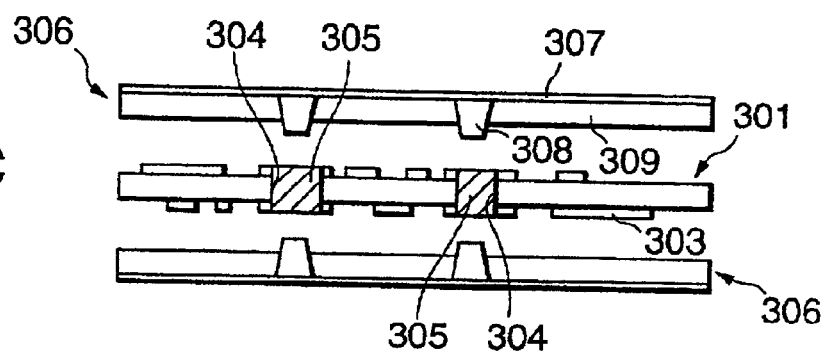

Subsequently, as shown in FIG. 46C, two pieces of the laminating sheets 306 are prepared so that the laminating sheets 306 are disposed, facing with both surfaces of the base sheet 301.

The laminating sheets 306 have the protrusion parts 308 on one surface of the metal foil made from a copper or a copper alloy (or a metal foil made from a silver) (corresponding to the "metal layer" in the present invention) 307 to be the wiring film (corresponding to the "wiring layer" of the present invention) at a position corresponding to the through holes 304 of the base sheet 301. In the aspect of the present invention corresponding to this embodiment, the state before etching is referred to as the "metal layer", and the state after the etching is referred to as the "wiring layer" so as to distinguish the same member by its state. Moreover, also in other aspects of the present invention corresponding to other embodiments related to this embodiment, the same terminology is partially applied.

Furthermore, the laminating sheets 306 have a bonding sheet 309 formed by bonding at a height lower than that of the protrusion parts 308 on the surface of the metal foil 307 provided with the protrusion parts 308.

Here, the vertex part of each protrusion part 308 projects from the bonding sheet 309. The protrusion parts 308 are preferably made from a metal such as a copper.

The laminating sheets 306 are disposed such that the projecting direction of the protrusion parts 308 faces with the base sheet 301. The laminating sheets 306 are positioned with respect to the base sheet 308 such that each protrusion part 308 and each through hole 304 face with each other.

Step (D)

Figure 46D:
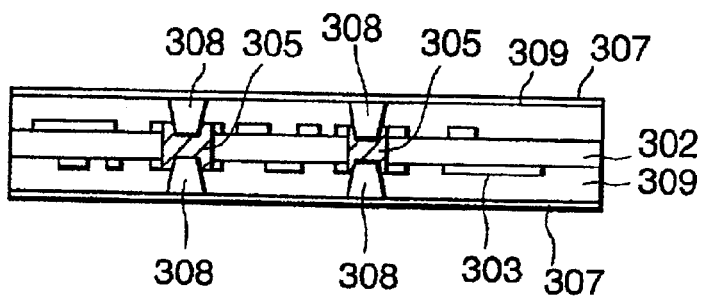

Subsequently, as shown in FIG. 46D, the laminating sheets 306 are laminated on both surfaces of the base sheet 301 so as to be integrated by pressuring. At the time, the protrusion parts 308 enter into the conductive material (corresponding to the "conductive member" of the present invention) 305 filling the through holes 304 so as to be bonded firmly. As a result, electric connection between the conductive material 305 and the protrusion parts 308 can be provided substantially completely. Furthermore, the metal foil 307 cannot be deflected in the area with the through holes 304 formed.

Step (E)

Figure 47A:
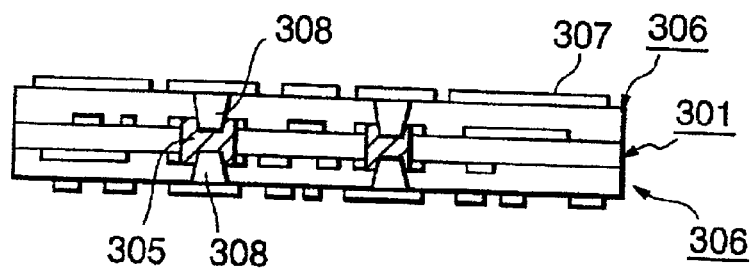
FIGS. 47A to 47C are cross-sectional views showing an embodiment of production steps of a wiring circuit substrate according to the present invention.

Subsequently, as shown in FIG. 47A, a wiring film is formed by patterning the metal foils 307 on the laminating sheets 306.

The patterning operation is executed by forming a mask pattern by application of a resist film, exposure, development, and etching with the mask pattern used as the mask. Thereafter, the resist film used as the mask is eliminated. For the selective etching, for example, spray etching of an aqueous solution of a ferric chloride from both surfaces is preferable.

Step (F)

Figure 47B:
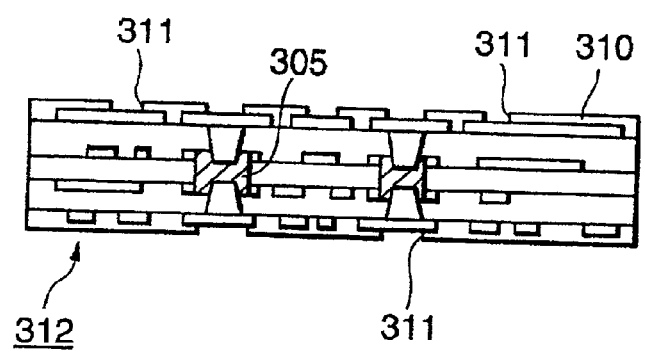

Subsequently, as shown in FIG. 47B, a solder resist film 310 is formed selectively on the surface of the laminating sheets 306. The numeral 311 denotes a recess part formed by the selective formation of the solder resist film 310. The recess parts 311 are formed such that the portion connected with a solder bump 14 comprising an electrode of an LSI chip 313 of the wiring film 307 is exposed. Or, the recess parts 311 are formed such that the part wherein a solder ball 15 is formed is exposed.

By finishing this step, a wring circuit substrate 312 can be completed.

Step (G)

Figure 47C:
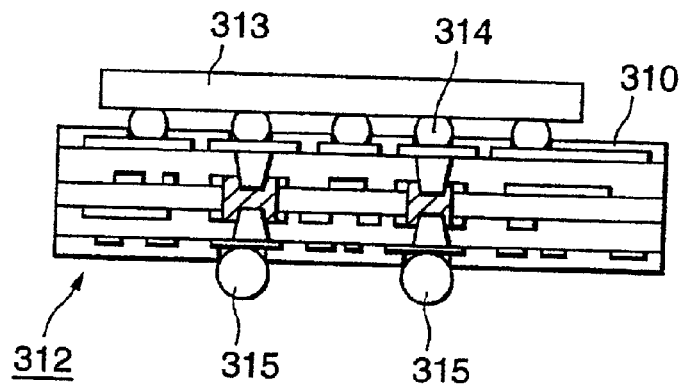

FIG. 47C shows the state with the LSI chip 313 mounted on the wiring circuit substrate 312. The numeral 314 denotes a solder bump, 315 a solder ball for connecting the wiring circuit substrate 312 of this embodiment with an unillustrated mother board.

Although an example of the wiring circuit substrate 312 as a multi-layer wiring substrate for the semiconductor package is described here, it can also be used as a mother board.

As mentioned above, according to this embodiment, the wiring circuit substrate 312 is formed by filling the through holes 304 with the conductive material 305. Accordingly, formation of a copper film for the wiring film formation by an electroless plating and a subsequent electrolytic plating can be eliminated after filling the through holes of the copper-plated laminating plate. Therefore, a problem of difficulty of providing a sufficient copper film thickness can be prevented as well as the risk of generating film thickness irregularity can be avoided.

Besides, the copper film for the wiring film formation cannot be deflected in the area with the through holes 304 formed. Accordingly, the wiring film 307 can be formed relatively easily with a sufficient thickness and a minute pattern.

Moreover, the protrusion parts 308 of the laminating sheets 306 are connected, entering into the conductive material 305 filling the through holes 304. Therefore, electric connection between the laminating sheets 306 and the base sheet 301 can be better and certain, and thus a wiring circuit substrate can be formed with a simple production process and a high reliability.

(Forty Third Embodiment)

A forty third embodiment of the present invention will be described with reference to FIGS. 48A to 48C. FIGS. 48A to 48C are cross-sectional views showing an embodiment of production steps of a base member (base sheet) to be used in the above-mentioned wiring circuit substrate.

Hereinafter, the production steps of the base sheet of this embodiment will be explained successively.

Step (A)

Figure 48A:
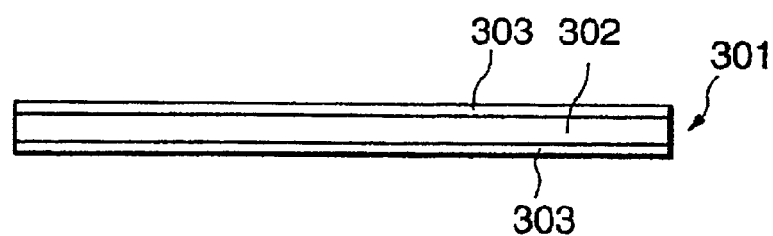
FIGS. 48A to 48C are cross-sectional views showing an embodiment of production steps of a base member of a wiring circuit substrate according to the present invention.

As shown in FIG. 48A, a three-layered laminating member with both surfaces copper-plated is prepared as the base member for the base sheet 301.

The laminating member is formed by laminating the copper foils 303 on both surfaces of the sheet-like insulating resin (corresponding to the "insulating layer" of the present invention) 302.

Step (B)

Figure 48B:
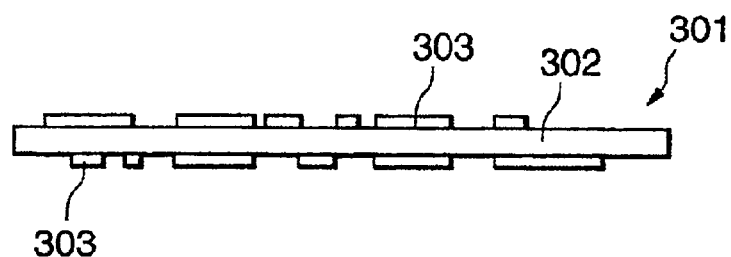

Subsequently, as shown in FIG. 48B, a wiring film comprising a circuit (corresponding to the "metal wiring layer" of the present invention) 303 is provided by patterning the copper foils 303 on both surfaces of the base sheet 301 by selective etching.

The selective etching for patterning is executed by applying a resist film, exposure, development for patterning, and etching the silver foils 303 with the patterned resist film used as the mask. After finishing the etching, the resist film is eliminated.

Step (C)

Figure 48C:
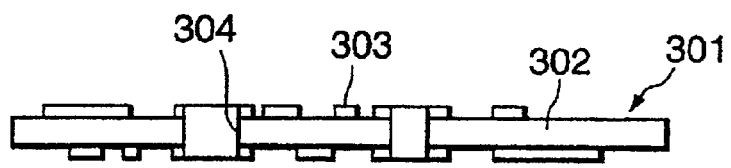

Subsequently, as shown in FIG. 48C, the through holes 304 are formed by, for example drilling. Or the through holes 304 are formed by laser processing. It is preferable to form the through holes 304 with a hole size of about 0.1 to 0.3 mm.

As mentioned above, production of the base sheet 301 is executed.

(Forty Fourth Embodiment)

Figure 49A:
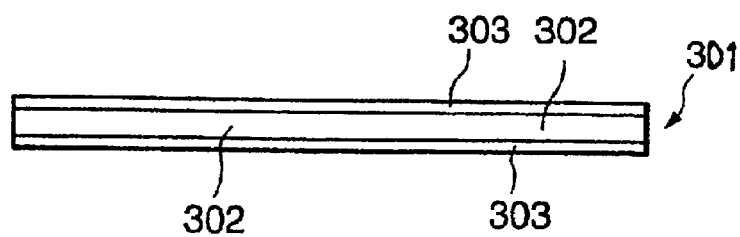
FIGS. 49A to 49D are cross-sectional views showing an embodiment of production steps of a base member of a wiring circuit substrate according to the present invention.
Figure 49B:
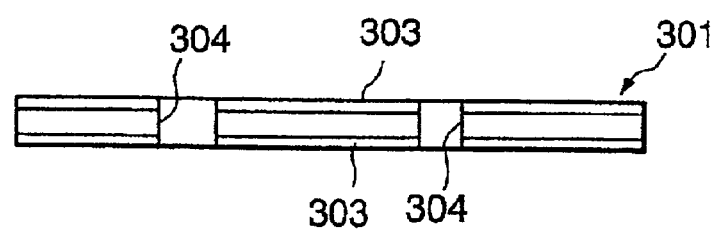
Figure 49C:
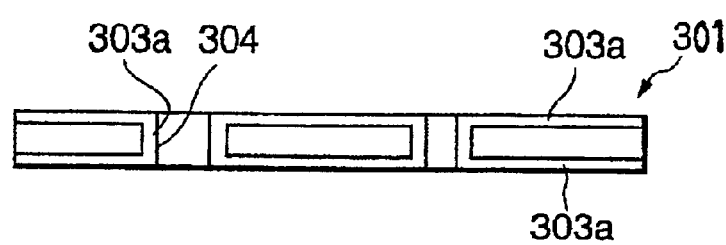

A forty fourth embodiment of the present invention will be described with reference to FIGS. 49A to 49D. FIGS. 49A to 49C are cross-sectional views showing an embodiment of production steps of a base member (base sheet) to be used in the above-mentioned wiring circuit substrate.

Hereinafter, the production steps of the base sheet of this embodiment will be explained successively.

Step (A)

As shown in FIG. 49A, similar to the above-mentioned forty third embodiment, a three-layered laminating member with both surfaces copper-plated is prepared as the base member for the base sheet 301.

The laminating member is formed by laminating the copper foils 303 on both surfaces of the sheet-like insulating resin 302.

Step (B)

Subsequently, as shown in FIG. 49B, the through holes 304 are formed by, for example drilling. Or the through holes 304 are formed by laser processing. The hole size (diameter) of the through holes 304 is preferably about 0.1 to 0.3 mm.

Step (C)

Subsequently, an electroless copper plating process is executed on the entire surface. Thereafter, an electrolytic copper plating process is executed on the entire surface. Accordingly, a copper film 303a is formed as shown in FIG. 49C.

Step (D)

Figure 49D:
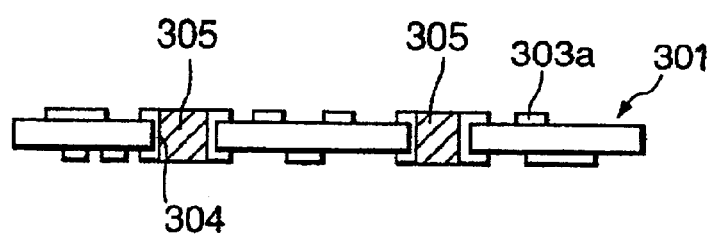

Subsequently, by selectively etching the copper film 303a, a wiring film as shown in FIG. 49D is provided. The etching is executed by photolithography using a resist film. Accordingly, the base sheet 301 is formed.

As the base sheet 301 used in the wiring circuit substrate of the present invention, any one produced in either of the production methods described in the above-mentioned embodiments can be used.

(Forty Fifth Embodiment)

Figure 50A:
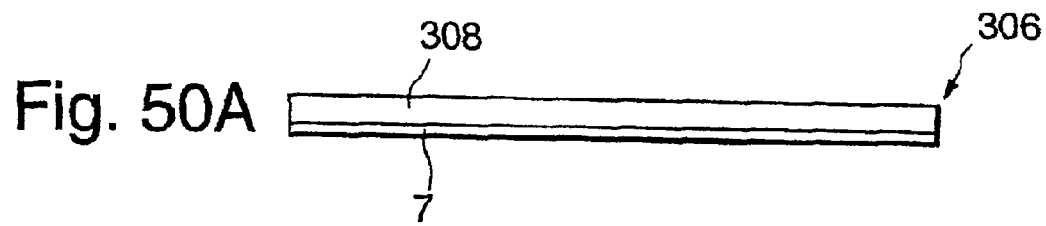
FIGS. 50A to 50D are cross-sectional views showing an embodiment of production steps of a laminating sheet of a wiring circuit substrate according to the present invention.
Figure 50B:
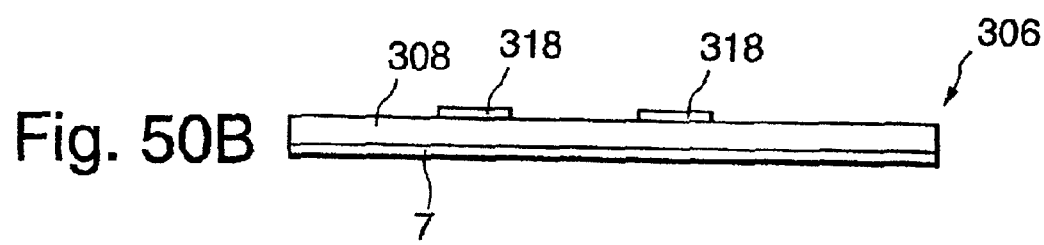
Figure 50C:
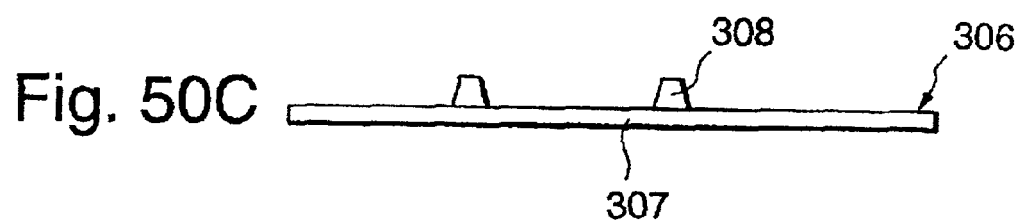

A forty fifth embodiment of the present invention will be described with reference to FIGS. 50A to 50D. FIGS. 50A to 50C are cross-sectional views showing an embodiment of production steps of a laminating sheet to be used in the above-mentioned wiring circuit substrate.

Hereinafter, the production steps of the laminating sheet of this embodiment will be explained successively.

Step (A)

As shown in FIG. 50A, a laminating plate obtained by laminating a metal layer (of, for example a 100 μm thickness) 308 made from a copper or a copper alloy on the surface of a metal base member 307 made from, for example a silver (of, for example, a 12 μm thickness) is prepared.

Step (B)

Subsequently, as shown in FIG. 50B, a resist film 318 is formed selectively on the surface of the metal layer 308 made from a copper or a copper alloy. The resist film 318 is to be used as an etching mask in the etching for forming the protrusion parts 308. Accordingly, application, exposure and development of the resist film 318 are executed.

Step (C)

The protrusion parts 308 are formed by selective etching of the metal layer 318 with the resist film 318 used as the mask. Thereafter, the resist film 318 is eliminated. FIG. 50C shows the state after eliminating the resist film 318. For the etching, for example, an alkaline etching liquid is used preferably.

Step (D)

Figure 50D:
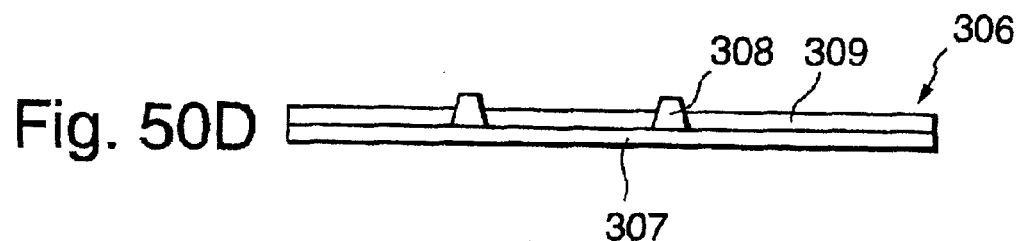

Subsequently, as shown in FIG. 50D, a bonding sheet 309 with a height lower than that of the protrusion parts 308 is attached on the surface of the metal base member 307 with the protrusion parts 308 formed. Therefore, the vertex part of each protrusion part 308 projects from the surface of the bonding sheet 30.

In the case the laminating sheet 306 is used, the metal base member 307 made from a silver, corresponding to the surface of the laminating sheet 306 is etched selectively so as to form the wiring film 307. Therefore, the wiring film 307 on the surface of the wiring circuit substrate is made from a silver.

(Forty Sixth Embodiment)

Figure 51A:
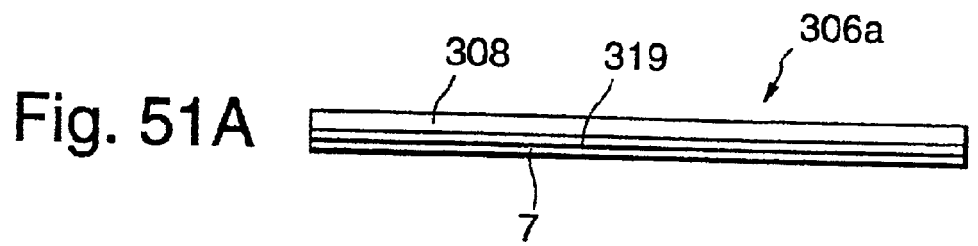
FIGS. 51A to 51D are cross-sectional views showing an embodiment of production steps of a laminating sheet of a wiring circuit substrate according to the present invention.
Figure 51B:
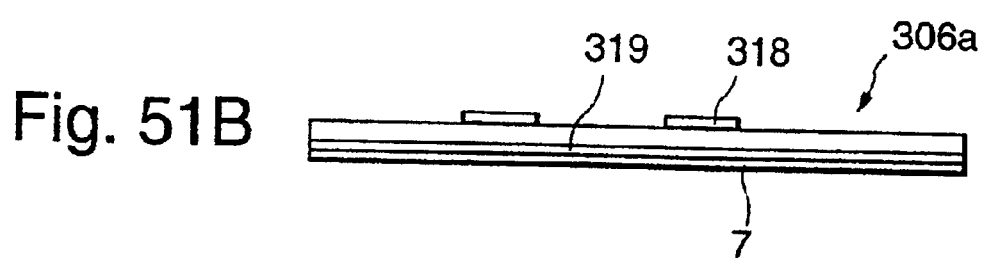
Figure 51C:
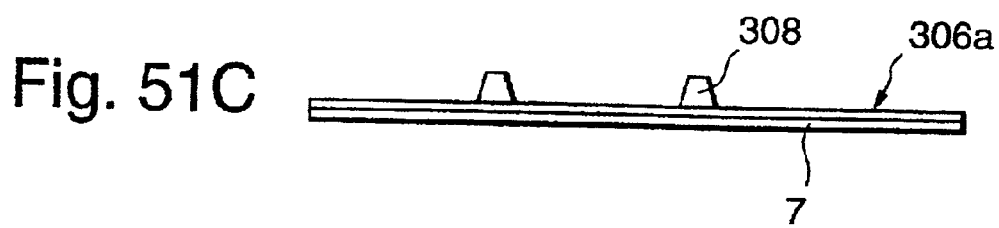

A forty sixth embodiment of the present invention will be described with reference to FIGS. 51A to 51D. FIGS. 51A to 51C are cross-sectional views showing an embodiment of production steps of a laminating sheet to be used in the above-mentioned wiring circuit substrate.

Hereinafter, the production steps of the laminating sheet of this embodiment will be explained successively. The laminating sheet 306a of this embodiment has a larger number of layers compared with that of the laminating sheet 306 shown in FIGS. 50A to 50D.

Step (A)

As shown in FIG. 51A, an etching barrier layer 319 is formed on the surface of the metal base member 307. Here, it is preferable that the metal base member 307 is made, for example, from a copper with a 18 μm thickness. Moreover, it is preferable that the etching barrier layer 319 is made, for example, from a nickel with a 2 μm thickness. Furthermore, it is preferable that the etching barrier layer 319 is made, for example, from a silver with a 0.5 μm thickness.

The metal layer 308 is further laminated on the surface of the etching barrier layer 319. It is preferable that the metal layer 308 is made, for example, from a copper, or a copper alloy, with a 100 µm thickness.

Accordingly, a laminating plate formed with the three-layer structure including the metal base member 307, the etching barrier layer 319, and the metal layer 308 is prepared.

Step (B)

Subsequently, as shown in FIG. 51B, the resist film 318 is formed selectively on the surface of the on the surface of the metal layer 308 made from a copper or a copper alloy. The resist film 318 is to be used as an etching mask in the etching for forming the protrusion parts 308. Accordingly, application, exposure and development of the resist film 318 are executed.

Step (C)

Subsequently, the protrusion parts 308 are formed by selective etching of the metal layer 318 with the resist film 318 used as the mask. Thereafter, the resist film 318 is eliminated. For the etching, for example, an alkaline etching liquid is used preferably.

In the etching, the etching barrier layer 319 provides a function for preventing damage on the metal base member 307 made from a copper by the etching. FIG. 51C shows the state after eliminating the resist film 318.

Step (D)

Figure 51D:
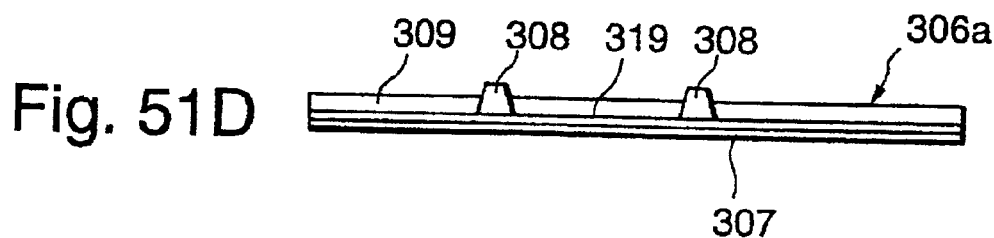

Subsequently, as shown in FIG. 51D, a bonding sheet 309 with a height lower than that of the protrusion parts 308 is attached on the surface of the metal base member 307 with the protrusion parts 308 formed.

Therefore, the vertex part of each protrusion part 308 projects from the surface of the bonding sheet 30.

Accordingly, the laminating sheet of this embodiment is formed.

(Forty Seventh Embodiment)

A forty seventh embodiment of the present invention will be described with reference to FIGS. 52A to 52F and 53A to 53C. FIGS. 52A to 52F are cross-sectional views showing an embodiment of production steps of a laminating sheet to be used in a wiring circuit substrate of this embodiment. FIGS. 53A to 53C are cross-sectional views showing an embodiment of production steps of a wiring circuit substrate of this embodiment.

Hereinafter, the production steps of the wiring circuit substrate of this embodiment will be explained successively.

Step (A)

Figure 52A:
FIGS. 52A to 52F are cross-sectional views showing an embodiment of production steps of a laminating sheet of a wiring circuit substrate according to the present invention.
Figure 53A:
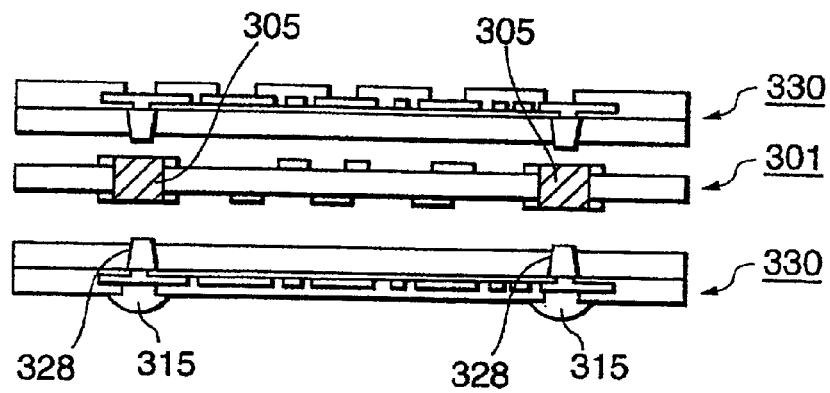
FIGS. 53A to 53C are cross-sectional views showing an embodiment of production steps of a wiring circuit substrate according to the present invention.
Figure 53B:
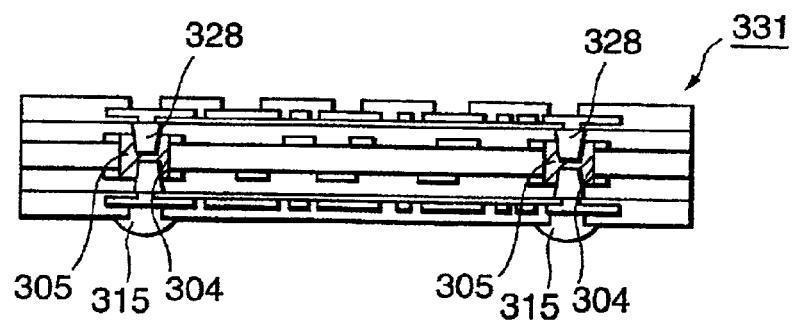
Figure 53C:
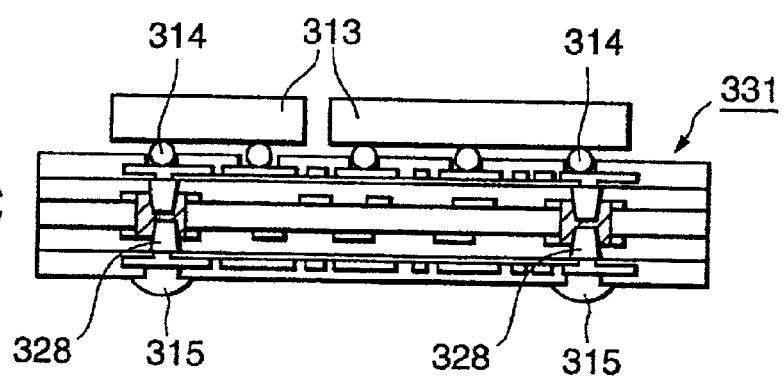
Figure 54A:
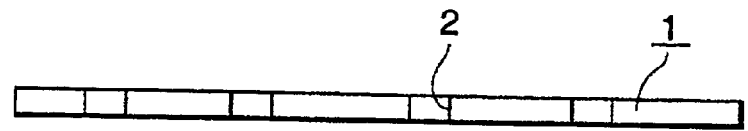
FIGS. 54A to 54F are cross-sectional views used to explain a conventional example of a high-density-mounting wiring circuit substrate, and shows a manufacturing method of the wiring circuit substrate in the order of steps (A) to (F)
Figure 54B:
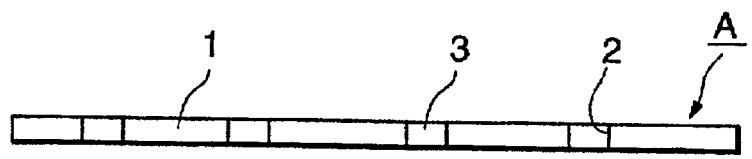
Figure 54C:
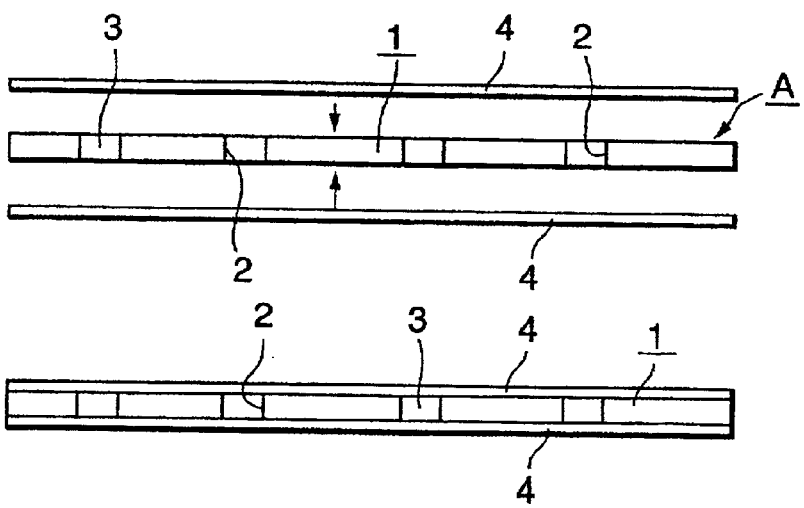
Figure 54D:
Figure 54E:
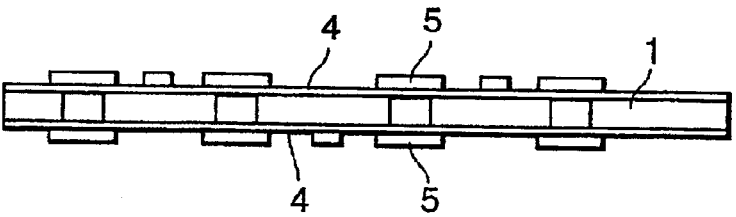
Figure 54F:
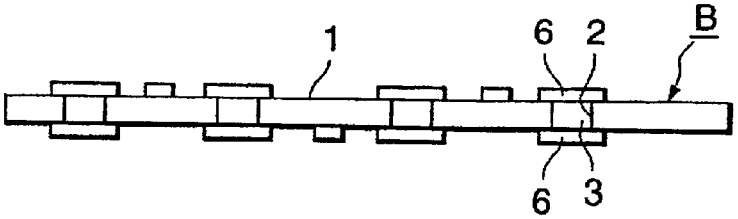
Figure 55A:
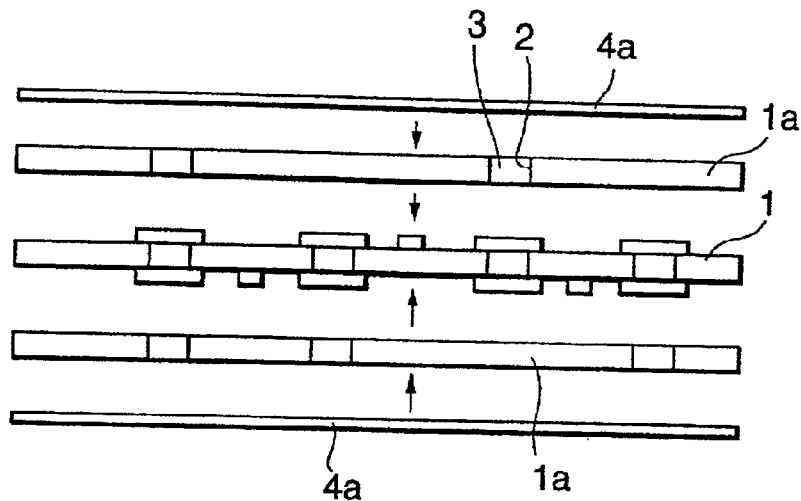
FIGS. 55A to 55C are cross-sectional views sequentially showing manufacturing steps (G) to (I) for the aforementioned conventional example of the wiring circuit substrate.
Figure 55B:
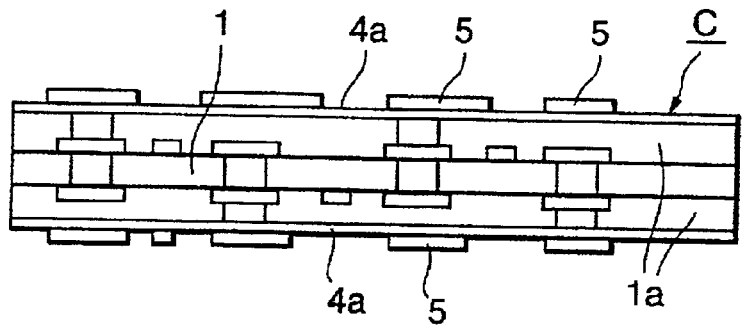
Figure 55C:
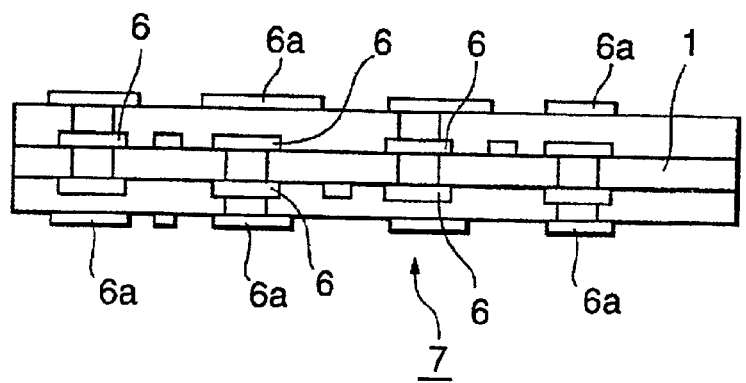
Figure 56A:
FIGS. 56A to 56G are cross-sectional views used to explain another conventional example of a high-density-mounting wiring circuit substrate, and shows a manufacturing method in the order of steps (A) to (G).
Figure 56B:
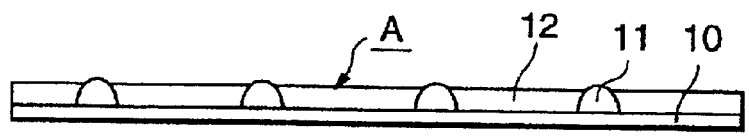
Figure 56C:
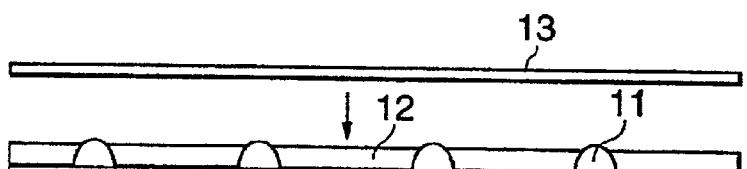
Figure 56D:
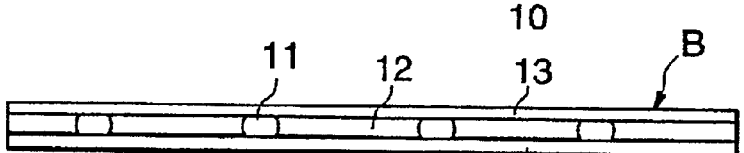
Figure 56E:
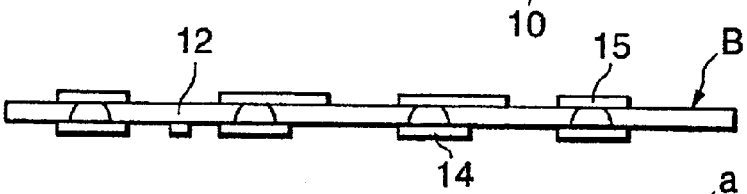
Figure 56F:
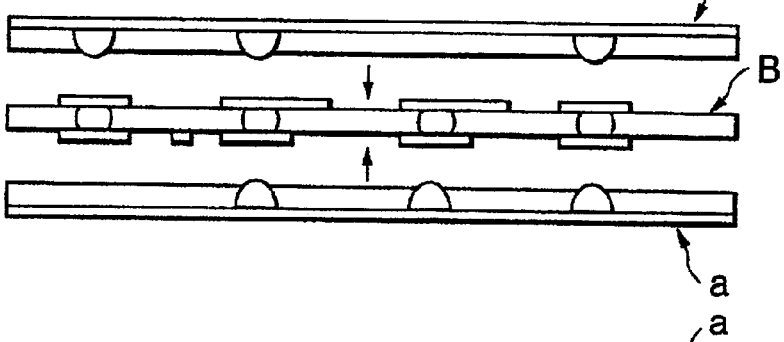
Figure 56G:
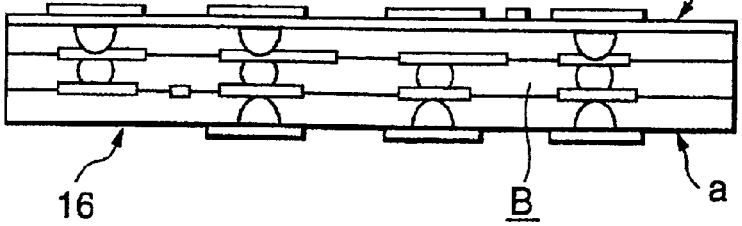
Figure 57A:
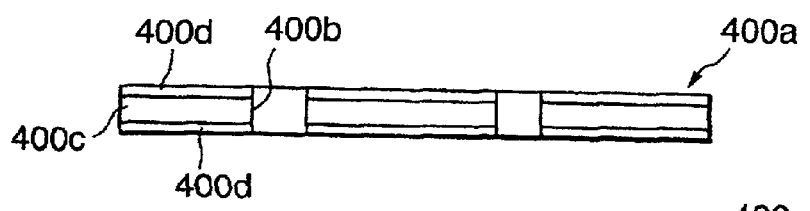
FIGS. 57A to 57E are cross-sectional views showing a conventional production steps of a wiring circuit substrate.
Figure 57B:
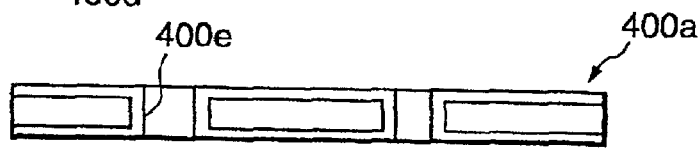
Figure 57C:
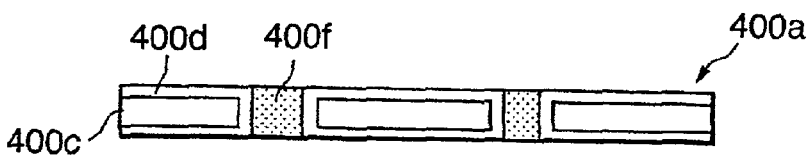
Figure 57D:
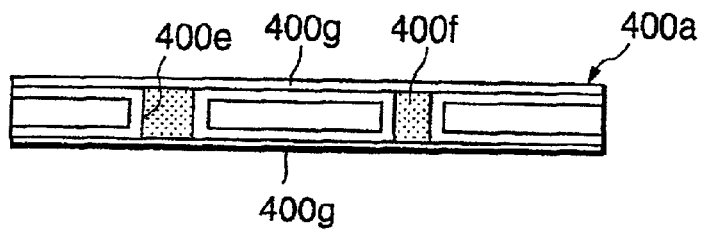
Figure 57E:
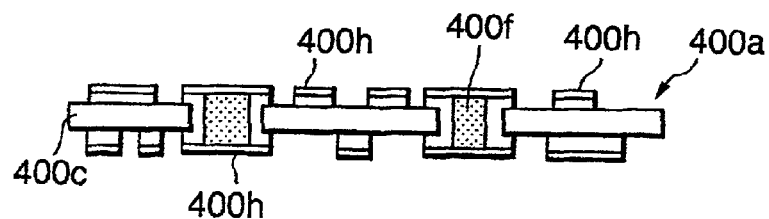
Figure 58A:
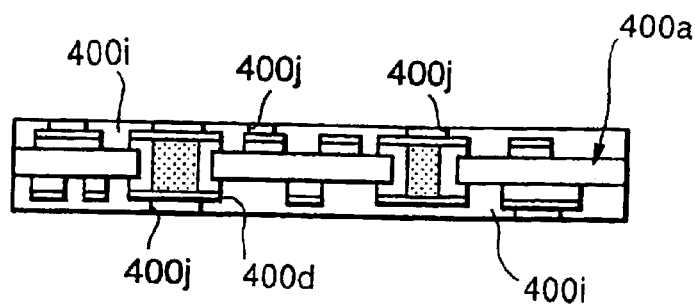
FIGS. 58A to 58D are cross-sectional views showing a conventional production steps of a wiring circuit substrate.
Figure 58B:
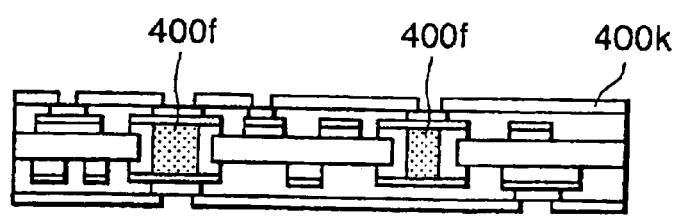
Figure 58C:
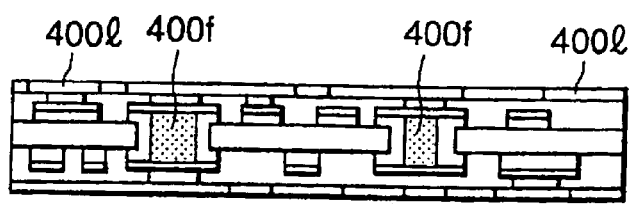
Figure 58D:
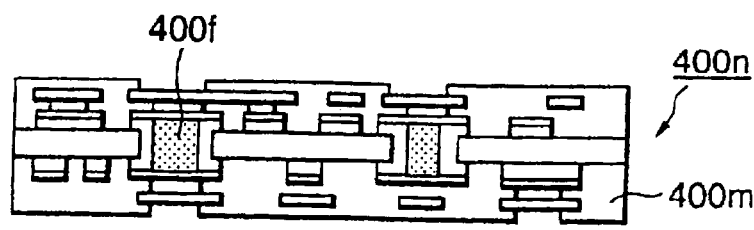

First of all, as shown in FIG. 52A, a metal plate 321 made from a copper of, for example, about 100 µm thickness is prepared.

Step (B)

Figure 52B:
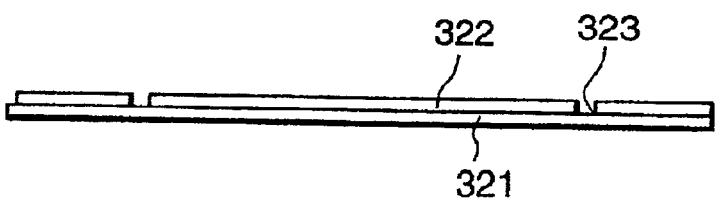

Subsequently, as shown in FIG. 52B, a photosensitive insulating resin layer 322 is applied. The photosensitive insulating resin layer 22 is patterned by exposure and development. The numeral 323 denotes a hole formed by the patterning. The hole 323 is formed, corresponding to the area with the protrusion parts 28 described later formed.

Step (C)

Subsequently, an electroless copper plating process is applied on the entire surface of the photosensitive resin layer 322. The process is executed preferably with, for example, a 0.5 µm copper plating thickness.

Thereafter, a resist pattern by plating is formed selectively. A wiring film 324 comprising a copper film is formed by electrolytic copper plating with the resist pattern used as the mask. The wiring film 324 is formed preferably with, for example, a 20 µm thickness.

Figure 52C:
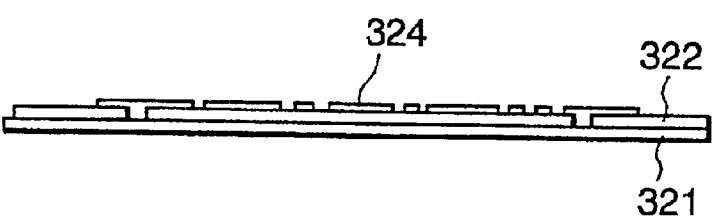

Then, the resist pattern is eliminated. Furthermore, the copper film (0.5 µm thickness) by the electroless copper plating is etched with the wiring film 324 used as the mask. Accordingly, the wiring films 324 are separated independent with each other. FIG. 52C shows the state after the etching. For the etching, for example, a release agent is used preferably.

Step (D)

Figure 52D:
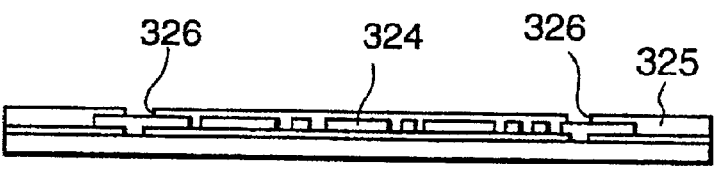
Figure 52E:
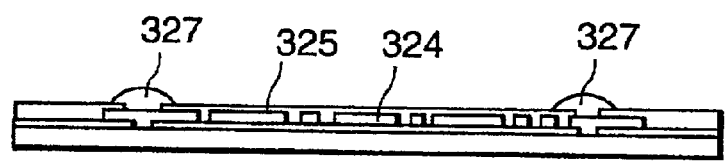

Subsequently, as shown in FIG. 52D, an insulating layer 325 is formed so as to cover the wiring film 324 selectively for forming an opening 326 in a part to be provided with a connection terminal.

Step (E)

Subsequently, by an electrolytic plating, a protrusion-like micro ball 327 with a multi-layer structure made of nickel/gold is formed. The electrolytic plating is executed preferably to form a nickel by, for example, 50 µm, and then a gold by, for example, 0.3 µm.

Step (F)

Figure 52F:
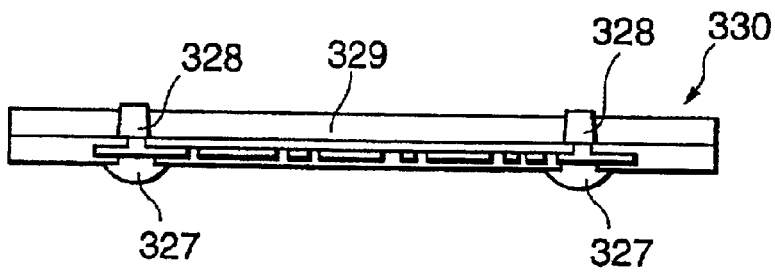

Subsequently, as shown in FIG. 52F, by selective etching of the metal plate 321, a protrusion part 328 is formed. Thereafter, a bonding layer 329 is formed by bonding on the surface provided with the protrusion part 328. Accordingly, a laminating sheet 330 is formed.

Next, steps for forming a wiring circuit substrate by laminating the two laminating sheets 330 each on both surfaces of the base sheet 301 disclosed in FIGS. 46A to 46D will be explained.

Step (A)

As shown in FIG. 53A, the base sheet 310, and the two laminating sheets 330 to be laminated on both surfaces of the base sheet are prepared.

The laminating sheets 330 are disposed with respect to the base sheet 301 such that the position of each protrusion part 328 and the position of the conductive materials 305 filling the through holes 304 of the base sheet 310 face with each other.

Step (B)

Subsequently, as shown in FIG. 53B, the laminating sheets 330 are laminated on both surfaces of the base sheet 301 so as to be integrated by pressuring. At the time, the protrusion parts 328 enter into the conductive material 305 filling the through holes 304 so as to be bonded firmly. Therefore, electric connection between the conductive material 305 and the protrusion parts 308 can be provided substantially completely. Accordingly, a wiring circuit substrate 331 of this embodiment is formed.

Step (C)

Moreover, as shown in FIG. 53C, an LSI chip 313 is mounted on the wiring circuit substrate 331, and a solder ball 315 is placed thereon. The numeral 314 denotes a solder bump, and 315 a solder ball for connecting the wiring circuit substrate 331 of this embodiment with an unillustrated mother board.

Although an example of the wiring circuit substrate 331 as a multi-layer wiring substrate for the semiconductor package is described, it can also be used as a mother board.

Although a multi-layer structure with the laminating sheets 330 or the laminating sheets 306 laminated on both surfaces of the base sheet 301 has been described in the above-mentioned embodiments, a multi-layer structure with the laminating sheet 330 or the laminating sheet 306 laminated on one surface of the base sheet 301 can be adopted as well.

Furthermore, a wiring circuit substrate with one or a plurality of the laminating sheets 306, 330 (second laminating sheet) further laminated on both surfaces or one surface of the wiring circuit substrate 312, 331 can be provided in the above-mentioned embodiments. Accordingly, a further multi-layer structure of the wiring circuit substrate can be achieved.

As mentioned above, the laminating sheet is laminated on one surface or both surfaces of the base sheet. At the time, the protrusion parts of the laminating sheet and the conductive material for filling the through holes of the base sheet are connected. Therefore, the wiring film of the laminating sheet cannot be deflected in the area with the through holes formed. Besides, the wiring film of the base sheet needs not be formed by an electroless plating and a subsequent electrolytic plating. Accordingly, the film thickness can be evened at a necessary thickness, and thus minute wiring can be enabled.

Moreover, the protrusion parts of the laminating sheet are connected so as to cut into the conductive material filling the through holes. Therefore, the adhesion property can be strengthened so that electric connection between the laminating sheet and the base sheet can be better and certain, and thus a wiring circuit substrate can be formed with a high reliability of the interlayer connection by a simple production.

Furthermore, since a laminating sheet can be laminated further on the outside of another laminating sheet, a multilayer structure of a wiring circuit substrate can be provided by a relatively simple process so that simplification of the production steps and reduction of the entire production time can be achieved as well.

As above, while the invention has been illustrated and described in detail with reference to the specific embodiments, it will be understood that those skilled in the art effect various modifications without departing from the spirit and scope of the invention. Furthermore, it is a matter of course that the invention includes combinations of the described embodiments, and in addition, combinations of the described embodiments and their modifications.

Furthermore, the etching-barrier layer is preferably made from, for example, a titanium(Ti), a tin(Sn), a solder, an aluminium(Al).

What is claimed is:

1. A manufacturing method for a wiring circuit substrate, comprising steps of:

forming an etching-barrier layer on a first metal layer that will be formed to be first conductor circuits, and forming a second metal layer, which is used to form protrusions, on said etching-barrier layer, said etching-barrier layer being formed of a metal differing from that of said first metal layer;

forming said protrusions by selectively performing etching for said second metal layer by using etchant that does not etch at least said etching-barrier layer;

removing said etching-barrier layer by using said protrusions as masks and by using etchant that does not etch said first metal layer;

forming an interlayer-insulating layer on a face of said first metal layer on which the protrusions are formed; and forming a third metal layer, which will be formed to be second conductor circuits, on said interlayer-insulating layer and said protrusions.

2. A manufacturing method for a wiring circuit substrate according to claim 1, wherein said step of forming said protrusions includes a step of using a fourth metal layer as an etching mask, and said manufacturing method further comprises a step of allowing said fourth metal layer to remain and covering said protrusions with said fourth metal layer after forming said protrusions.

3. A manufacturing method for a wiring circuit substrate, comprising steps of:

forming an etching-barrier layer on a first metal layer that will be formed to be first conductor circuits, and forming a second metal layer, which is used to form protrusions, on said etching-barrier layer, said etching-barrier layer being formed of a metal differing from that of said first metal layer;

forming said protrusions by selectively performing etching for said second metal layer by using etchant that does not etch at least said etching-barrier layer;

removing said etching-barrier layer by using said protrusions as masks and by using etchant that does not etch said first metal layer;

forming an interlayer-insulating layer on a face of said first metal layer on which the protrusions are formed and forming a multilayer body;

forming a third metal layer, which will be formed to be second conductor circuits, on said interlayer-insulating layer and said protrusions;

overlaying individual metal foils on said third metal layer and said first metal layer of said wiring circuit substrate and performing pressing-heating processing therefor; and selectively performing etching for said third metal layer and said metal foils and thereby forming said second conductor circuits, and also, selectively performing etching for said first metal layer and metal foils and thereby forming said first conductor circuits, thereby forming said wiring circuit substrate.

4. A manufacturing method for wiring circuit substrate according to claim 3, further comprising steps of:

stacking at least two units of said multilayer body on two faces of said wiring circuit substrate, on which said first conductor circuits and said second conductor circuits are formed, so as to be as a sandwich in a state where one face of each unit of said multilayer body faces inward, and performing pressing/heating processing therefor, thereby making an integral unit; and selectively performing etching for two conductor-forming metal layers positioned on two faces of the integral unit, thereby forming conductor circuits on the two faces.

* * * * *